(12) United States Patent
Seo et al.

(10) Patent No.: US 11,917,840 B2
(45) Date of Patent: Feb. 27, 2024

(54) LIGHT-EMITTING DEVICE WITH REFLECTIVE ELECTRODE AND LIGHT-EMITTING LAYER

(71) Applicant: SEMICONDUCTOR ENERGY LABORATORY CO., LTD., Atsugi (JP)

(72) Inventors: Satoshi Seo, Kanagawa (JP); Toshiki Sasaki, Kanagawa (JP); Ryohei Yamaoka, Kanagawa (JP); Shiho Nomura, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 307 days.

(21) Appl. No.: 17/055,933

(22) PCT Filed: May 10, 2019

(86) PCT No.: PCT/IB2019/053851
§ 371 (c)(1),
(2) Date: Nov. 16, 2020

(87) PCT Pub. No.: WO2019/220283
PCT Pub. Date: Nov. 21, 2019

(65) Prior Publication Data
US 2021/0234115 A1 Jul. 29, 2021

(30) Foreign Application Priority Data

May 18, 2018 (JP) .................................. 2018-096504

(51) Int. Cl.
*H10K 50/11* (2023.01)
*H10K 50/818* (2023.01)
*H10K 50/828* (2023.01)

(52) U.S. Cl.
CPC ........... *H10K 50/11* (2023.02); *H10K 50/818* (2023.02); *H10K 50/828* (2023.02)

(58) Field of Classification Search
None
See application file for complete search history.

(56) References Cited

U.S. PATENT DOCUMENTS 5,144,288 A 9/1992 Hamada et al.
5,554,911 A 9/1996 Nakayama et al.
(Continued)

FOREIGN PATENT DOCUMENTS

EP 2487991 A 8/2012
EP 3093897 A 11/2016
(Continued)

OTHER PUBLICATIONS

International Search Report (Application No. PCT/IB2019/053851) dated Aug. 13, 2019.
(Continued)

*Primary Examiner* — Daniel Whalen
(74) *Attorney, Agent, or Firm* — Fish & Richardson P.C.

(57) ABSTRACT

A novel light-emitting device with high emission efficiency is provided. A light-emitting device with a high blue index (BI) is provided. A light-emitting device with low power consumption is provided. A light-emitting device including a first electrode and a second electrode which are a reflective electrode and a semi-transmissive and semi-reflective electrode, and an EL layer sandwiched between the first electrode and the second electrode, where the EL layer contains an emission center substance, where when the emission center substance in the EL layer includes only one kind of substance, photon energy of a peak wavelength of light emitted from the light-emitting device is designed from an average value of photon energy of light emitted by the (Continued)

emission center substance in a solution state and emission edge energy on a short wavelength side of an emission spectrum of the emission center substance in the solution state.

21 Claims, 34 Drawing Sheets

(56) References Cited

U.S. PATENT DOCUMENTS

| | | | |
|---|---|---|---|
| 5,670,792 A | 9/1997 | Utsugi et al. |
| 5,780,174 A | 7/1998 | Tokito et al. |
| 5,837,391 A | 11/1998 | Utsugi |
| 5,989,737 A | 11/1999 | Xie et al. |
| 6,013,384 A | 1/2000 | Kido et al. |
| 6,091,195 A | 7/2000 | Forrest et al. |
| 6,111,274 A | 8/2000 | Arai |
| 6,124,024 A | 9/2000 | Hosokawa et al. |
| 6,140,764 A | 10/2000 | Xu et al. |
| 6,366,025 B1 | 4/2002 | Yamada |
| 6,384,529 B2 | 5/2002 | Tang et al. |
| 6,423,429 B2 | 7/2002 | Kido et al. |
| 6,454,966 B1 | 9/2002 | Kobayashi et al. |
| 6,486,601 B1 | 11/2002 | Sakai et al. |
| 6,505,901 B1 | 1/2003 | Fukuda |
| 6,541,130 B2 | 4/2003 | Fukuda |
| 6,573,650 B2 | 6/2003 | Aoki et al. |
| 6,589,673 B1 | 7/2003 | Kido et al. |
| 6,639,250 B1 | 10/2003 | Shimoda et al. |
| 6,650,047 B2 | 11/2003 | Aoki et al. |
| 6,680,570 B2 | 1/2004 | Roitman et al. |
| 6,831,408 B2 | 12/2004 | Hirano et al. |
| 6,847,163 B1 | 1/2005 | Tsutsui et al. |
| 6,903,506 B2 | 6/2005 | Kita et al. |
| 6,906,457 B2 | 6/2005 | Song et al. |
| 6,956,323 B2 | 10/2005 | Kawaguchi et al. |
| 6,969,948 B2 | 11/2005 | Urabe et al. |
| 6,971,938 B2 | 12/2005 | Urabe et al. |
| 7,019,331 B2 | 3/2006 | Winters et al. |
| 7,023,013 B2 | 4/2006 | Ricks et al. |
| 7,030,553 B2 | 4/2006 | Winters et al. |
| 7,057,339 B2 | 6/2006 | Boroson et al. |
| 7,102,282 B1 | 9/2006 | Yamada et al. |
| 7,122,845 B2 | 10/2006 | Uchida |
| 7,148,502 B2 | 12/2006 | Yamazaki et al. |
| 7,173,373 B2 | 2/2007 | Yamada et al. |
| 7,196,469 B2 | 3/2007 | Shore et al. |
| 7,223,641 B2 | 5/2007 | Maekawa |
| 7,271,537 B2 | 9/2007 | Matsuda et al. |
| 7,285,905 B2 | 10/2007 | Hanawa et al. |
| 7,304,428 B2 | 12/2007 | Ghosh et al. |
| 7,317,282 B2 | 1/2008 | Tsutsui et al. |
| 7,323,225 B2 | 1/2008 | Aoki et al. |
| 7,365,488 B2 | 4/2008 | Lee et al. |
| 7,400,088 B2 | 7/2008 | Ryu |
| 7,462,883 B2 | 12/2008 | Kumaki et al. |
| 7,470,933 B2 | 12/2008 | Lee et al. |
| 7,541,734 B2 | 6/2009 | Yamazaki et al. |
| 7,548,019 B2 | 6/2009 | Omura et al. |
| 7,554,265 B2 | 6/2009 | Godo et al. |
| 7,564,052 B2 | 7/2009 | Kumaki |
| 7,601,988 B2 | 10/2009 | Seo et al. |
| 7,732,808 B2 | 6/2010 | Ikeda et al. |
| 7,737,626 B2 | 6/2010 | Kumaki et al. |
| 7,753,751 B2 | 7/2010 | Yamazaki |
| 7,851,989 B2 | 12/2010 | Noda |
| 7,875,893 B2 | 1/2011 | Seo et al. |
| 7,893,427 B2 | 2/2011 | Kumaki et al. |
| 7,964,891 B2 | 6/2011 | Kumaki et al. |
| 7,973,319 B2 | 7/2011 | Kashiwabara et al. |
| 8,008,652 B2 | 8/2011 | Kumaki et al. |
| 8,080,934 B2 | 12/2011 | Kido et al. |
| 8,202,630 B2 | 6/2012 | Kumaki et al. |
| 8,350,281 B2 | 1/2013 | Fukuda |
| 8,368,059 B2 | 2/2013 | Kumaki et al. |
| 8,368,060 B2 | 2/2013 | Kumaki et al. |
| 8,455,114 B2 | 6/2013 | Kumaki et al. |
| 8,803,136 B2 | 8/2014 | Yamazaki et al. |
| 9,095,033 B2 | 7/2015 | Naraoka et al. |
| 9,887,376 B2 | 2/2018 | Park et al. |
| 2002/0024051 A1 | 2/2002 | Yamazaki et al. |
| 2003/0044639 A1 | 3/2003 | Fukuda |
| 2003/0189401 A1 | 10/2003 | Kido et al. |
| 2004/0004434 A1 | 1/2004 | Nishi et al. |
| 2004/0145303 A1 | 7/2004 | Yamada et al. |
| 2004/0217697 A1 | 11/2004 | Lee et al. |
| 2005/0012455 A1 | 1/2005 | Lee et al. |
| 2005/0023969 A1 | 2/2005 | Omata et al. |
| 2005/0037234 A1 | 2/2005 | Kim et al. |
| 2005/0040756 A1 | 2/2005 | Winters et al. |
| 2005/0040762 A1 | 2/2005 | Kurihara |
| 2005/0062057 A1 | 3/2005 | Yamazaki et al. |
| 2005/0067954 A1 | 3/2005 | Nishikawa et al. |
| 2005/0073247 A1 | 4/2005 | Yamazaki et al. |
| 2005/0077816 A1 | 4/2005 | Yamada et al. |
| 2005/0084712 A1 | 4/2005 | Kido et al. |
| 2005/0084713 A1 | 4/2005 | Kido et al. |
| 2005/0088085 A1 | 4/2005 | Nishikawa et al. |
| 2005/0098207 A1 | 5/2005 | Matsumoto et al. |
| 2005/0099113 A1 | 5/2005 | Yamada |
| 2005/0106419 A1 | 5/2005 | Endoh et al. |
| 2005/0110397 A1 | 5/2005 | Masuda |
| 2005/0140288 A1 | 6/2005 | Suzuki |
| 2005/0140291 A1 | 6/2005 | Hirakata et al. |
| 2005/0142976 A1 | 6/2005 | Suzuki |
| 2005/0170208 A1 | 8/2005 | Yatsunami et al. |
| 2005/0208330 A1 | 9/2005 | Raychaudhuri et al. |
| 2005/0212841 A1 | 9/2005 | Okano |
| 2005/0218799 A1 | 10/2005 | Hamada |
| 2005/0225232 A1 | 10/2005 | Boroson et al. |
| 2005/0231946 A1 | 10/2005 | Guthrie |
| 2005/0248267 A1 | 11/2005 | Gyoutoku et al. |
| 2005/0249972 A1 | 11/2005 | Hatwar et al. |
| 2005/0249974 A1 | 11/2005 | Mori et al. |
| 2005/0280008 A1 | 12/2005 | Ricks et al. |
| 2006/0008740 A1 | 1/2006 | Kido et al. |
| 2006/0033425 A1 | 2/2006 | Miura et al. |
| 2006/0082295 A1 | 4/2006 | Chin et al. |
| 2006/0138945 A1 | 6/2006 | Wolk et al. |
| 2006/0163597 A1 | 7/2006 | Noda et al. |
| 2006/0170339 A1 | 8/2006 | Kanno et al. |
| 2006/0183625 A1 | 8/2006 | Miyahara |
| 2006/0226767 A1 | 10/2006 | Tyan et al. |
| 2006/0267483 A1 | 11/2006 | Tsutsui et al. |
| 2006/0284204 A1 | 12/2006 | Yamazaki et al. |
| 2007/0001570 A1 | 1/2007 | Nomura et al. |
| 2007/0035243 A1 | 2/2007 | Lee |
| 2007/0058182 A1 | 3/2007 | Huibers |
| 2007/0075627 A1 | 4/2007 | Kimura et al. |
| 2007/0085075 A1 | 4/2007 | Yamazaki et al. |
| 2007/0102737 A1 | 5/2007 | Kashiwabara et al. |
| 2007/0114527 A1 | 5/2007 | Kumaki et al. |
| 2007/0131948 A1 | 6/2007 | Seo et al. |
| 2007/0176161 A1 | 8/2007 | Seo et al. |
| 2007/0182317 A1 | 8/2007 | Kido et al. |
| 2007/0200125 A1 | 8/2007 | Ikeda et al. |
| 2008/0006821 A1 | 1/2008 | Suzuki et al. |
| 2008/0241586 A1 | 10/2008 | Kumaki et al. |
| 2009/0091238 A1 | 4/2009 | Cok et al. |
| 2009/0206726 A1 | 8/2009 | Yamazaki et al. |
| 2009/0275161 A1 | 11/2009 | Kumaki et al. |
| 2010/0176720 A1 | 7/2010 | Yamazaki |
| 2010/0231484 A1 | 9/2010 | Cok et al. |
| 2010/0314638 A1 | 12/2010 | Fukuda |
| 2011/0062475 A1 | 3/2011 | Cho |
| 2011/0073885 A1 | 3/2011 | Kim et al. |
| 2011/0101345 A1 | 5/2011 | Kumaki et al. |
| 2011/0101380 A1 | 5/2011 | Kumaki et al. |
| 2011/0108864 A1 | 5/2011 | Seo et al. |
| 2011/0140101 A1 | 6/2011 | Noda |
| 2011/0156030 A1 | 6/2011 | Kumaki et al. |
| 2011/0180794 A1 | 7/2011 | Yamazaki |
| 2011/0187259 A1 | 8/2011 | Fukuda et al. |

(56) References Cited

U.S. PATENT DOCUMENTS

| | | |
|---|---|---|
| 2011/0187260 A1 | 8/2011 | Fukuda et al. |
| 2011/0241007 A1 | 10/2011 | Kumaki et al. |
| 2011/0278562 A1 | 11/2011 | Kumaki et al. |
| 2011/0291088 A1 | 12/2011 | Seo et al. |
| 2011/0309351 A1 | 12/2011 | Kumaki et al. |
| 2012/0126272 A1 | 5/2012 | Kurata et al. |
| 2012/0138918 A1 | 6/2012 | Naraoka et al. |
| 2012/0181921 A1 | 7/2012 | Ono |
| 2012/0205676 A1 | 8/2012 | Seo et al. |
| 2012/0205685 A1 | 8/2012 | Seo et al. |
| 2012/0205686 A1 | 8/2012 | Seo et al. |
| 2012/0206675 A1 | 8/2012 | Seo et al. |
| 2013/0045553 A1 | 2/2013 | Fukuda |
| 2013/0082589 A1 | 4/2013 | So et al. |
| 2013/0112955 A1 | 5/2013 | Yamazaki et al. |
| 2013/0119425 A1 | 5/2013 | Kumaki et al. |
| 2013/0264549 A1 | 10/2013 | Yamazaki et al. |
| 2013/0265320 A1 | 10/2013 | Yamazaki et al. |
| 2014/0117339 A1 | 5/2014 | Seo |
| 2014/0134771 A1 | 5/2014 | Noda et al. |
| 2014/0203244 A1 | 7/2014 | Hack et al. |
| 2014/0203266 A1 | 7/2014 | Nomura et al. |
| 2014/0225102 A1 | 8/2014 | Ikeda et al. |
| 2014/0284575 A1 | 9/2014 | Sugisawa et al. |
| 2014/0284576 A1 | 9/2014 | Sugisawa et al. |
| 2014/0291648 A1 | 10/2014 | Yamazaki et al. |
| 2014/0306201 A1 | 10/2014 | Yamazaki et al. |
| 2014/0332831 A1 | 11/2014 | Ohsawa et al. |
| 2014/0339526 A1 | 11/2014 | Inoue et al. |
| 2015/0243892 A1 | 8/2015 | Ogita et al. |
| 2015/0255520 A1 | 9/2015 | Seo et al. |
| 2015/0263076 A1 | 9/2015 | Seo et al. |
| 2015/0340410 A1 | 11/2015 | Hack et al. |
| 2017/0125736 A1* | 5/2017 | Kim .................. H01L 51/5036 |
| 2017/0141345 A1 | 5/2017 | Park |

FOREIGN PATENT DOCUMENTS

| | | |
|---|---|---|
| JP | 2010-287524 A | 12/2010 |
| JP | 2012-018939 A | 1/2012 |
| JP | 2015-173263 A | 10/2015 |
| JP | 2015-187982 A | 10/2015 |
| TW | 201539827 | 10/2015 |
| WO | WO-2011/043083 | 4/2011 |

OTHER PUBLICATIONS

Written Opinion (Application No. PCT/IB2019/053851) dated Aug. 13, 2019.

Taiwanese Office Action (Application No. 108116854) dated Feb. 13, 2023.

* cited by examiner

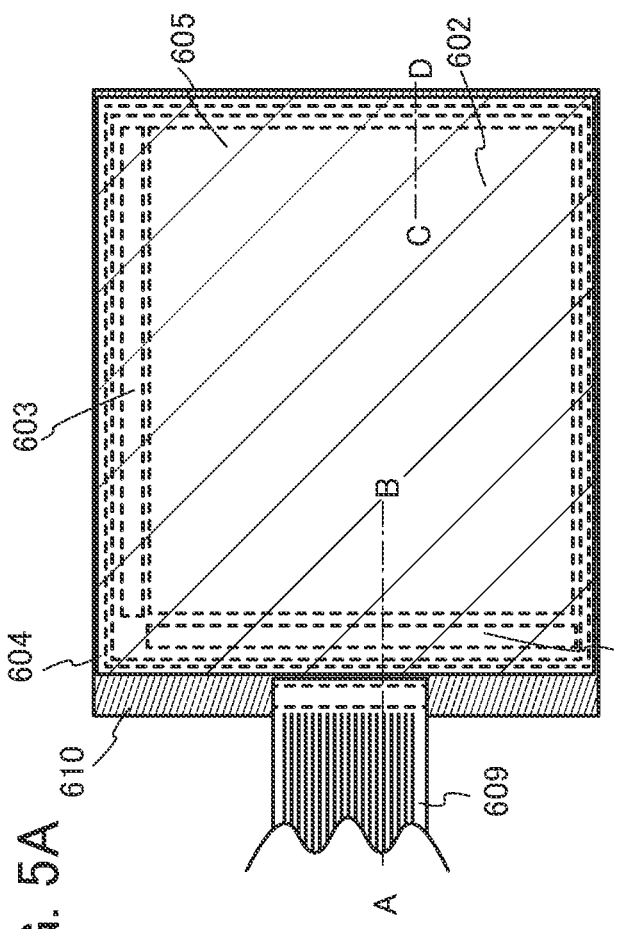
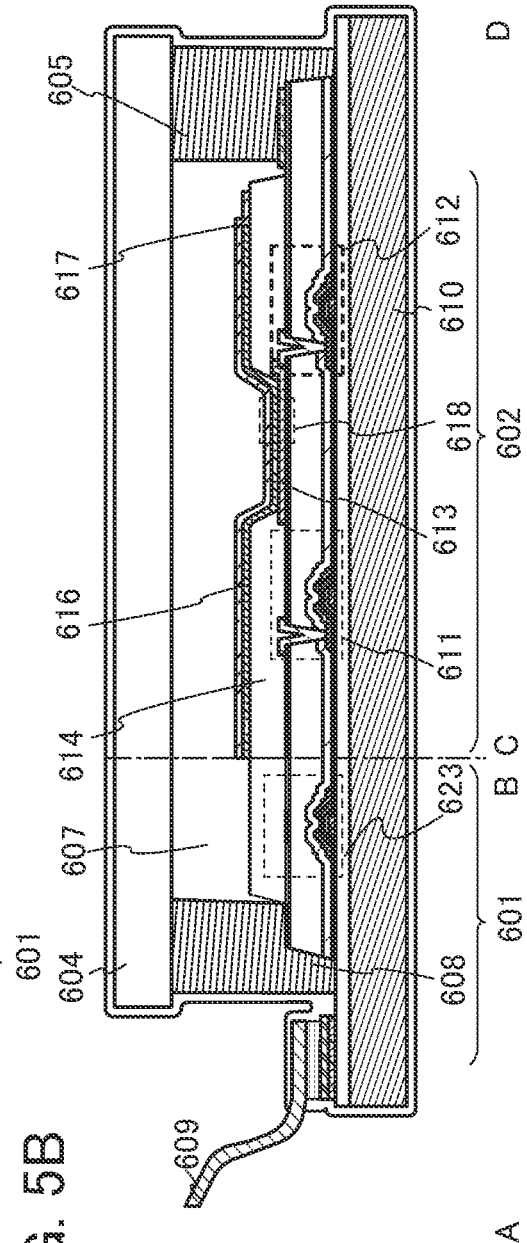

FIG. 7A
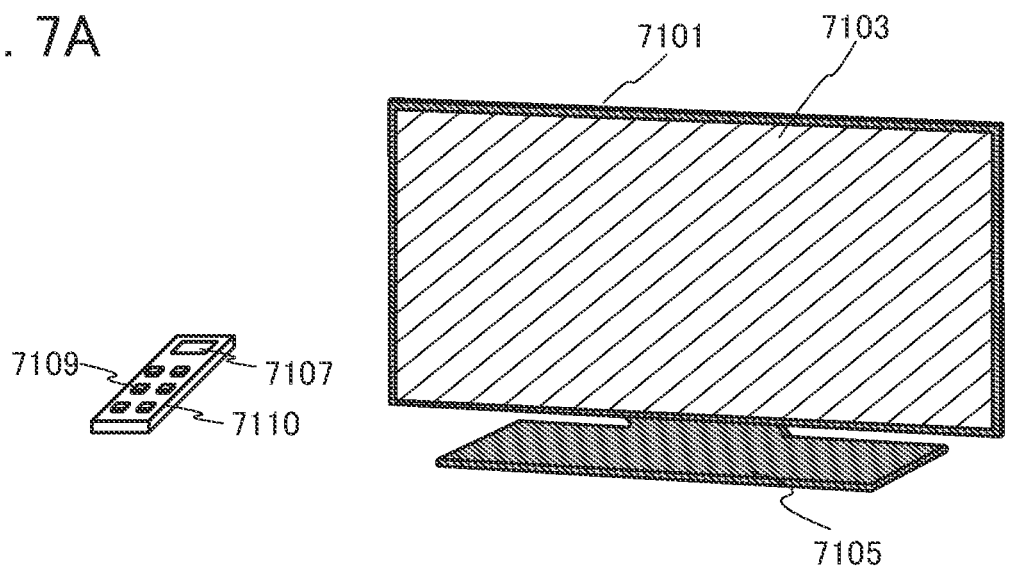
FIG. 7B1
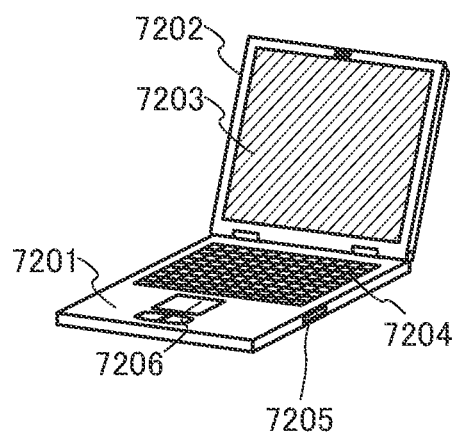
FIG. 7B2
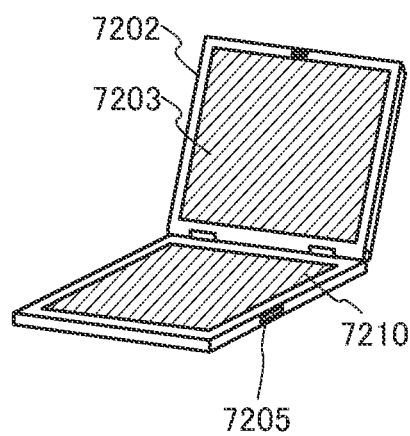
FIG. 7C
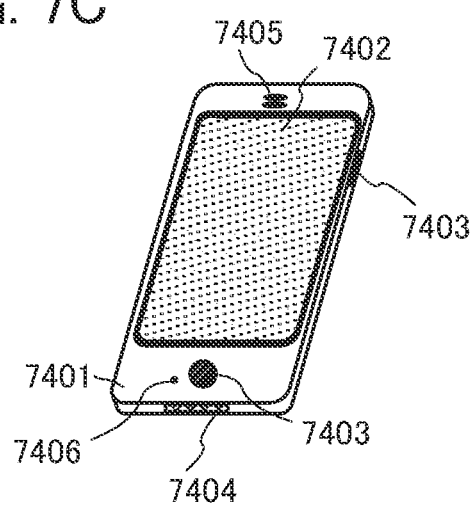

LIGHT-EMITTING DEVICE WITH REFLECTIVE ELECTRODE AND LIGHT-EMITTING LAYER

CROSS REFERENCE TO RELATED APPLICATIONS

This application is a U.S. National Phase Application under 35 U.S.C. § 371 of International Application PCT/M2019/053851, filed on May 10, 2019, which is incorporated by reference and claims the benefit of a foreign priority application filed in Japan on May 18, 2018, as Application No. 2018-096504.

TECHNICAL FIELD

One embodiment of the present invention relates to a light-emitting device, a light-emitting apparatus, an electronic device, and a lighting device. Note that one embodiment of the present invention is not limited to the above technical field. The technical field of one embodiment of the invention disclosed in this specification and the like relates to an object, a method, or a manufacturing method. One embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting apparatus, a lighting device, a power storage device, a memory device, an imaging device, a driving method thereof, and a manufacturing method thereof.

BACKGROUND ART

Light-emitting devices (organic EL element) that use organic compounds and utilize electroluminescence (EL) have been put into practical use. The basic structure of such light-emitting devices is that an organic compound layer (EL layer) containing a light-emitting material is sandwiched between a pair of electrodes. Carriers are injected by application of voltage to this device, and recombination energy of the carriers is used, whereby light emission can be obtained from the light-emitting material.

Such light-emitting devices are of self-light-emitting type, and have advantages over liquid crystal, such as high visibility and no need for backlight when used for pixels of a display; accordingly, the light-emitting devices are suitable as flat panel display elements. Displays using such light-emitting devices are also highly advantageous in that they can be fabricated thin and lightweight. Moreover, an extremely fast response speed is also a feature.

Since light-emitting layers of such light-emitting devices can be successively formed two-dimensionally, planar light emission can be obtained. This feature is difficult to obtain with point light sources typified by incandescent lamps and LEDs or linear light sources typified by fluorescent lamps. Thus, light-emitting devices are also of great utility value as planar light sources, which can be applied to lighting and the like.

Displays or lighting devices including light-emitting devices can be suitably used for a variety of electronic devices as described above, and research and development of light-emitting devices have progressed for better characteristics.

One of the important characteristics of light-emitting devices is emission efficiency typified by external quantum efficiency. The light-emitting device with favorable emission efficiency enables power consumption to be reduced. Thus, in view of world's energy situation becoming severer year by year, the higher the efficiency, the better.

REFERENCE

Patent Document

[Patent Document 1] Japanese Published Patent Application No. 2015-187982

SUMMARY OF THE INVENTION

Problems to be Solved by the Invention

An object of one embodiment of the present invention is to provide a novel light-emitting device. Alternatively, an object of another embodiment of the present invention is to provide a light-emitting device with high emission efficiency. Alternatively, an object of another embodiment of the present invention is to provide a light-emitting device with a high blue index (BI). An object of another embodiment of the present invention is to provide a light-emitting device with low power consumption.

Alternatively, an object of another embodiment of the present invention is to provide a light-emitting device, a light-emitting apparatus, an electronic device, a lighting device, and an electronic apparatus, each of which has low power consumption.

Note that the description of these objects does not preclude the existence of other objects. One embodiment of the present invention does not need to achieve all the objects. Other objects can be derived from the descriptions of the specification, the drawings, and the claims.

Means for Solving the Problems

One embodiment of the present invention is a light-emitting device including a first electrode, a second electrode, and an EL layer sandwiched between the first electrode and the second electrode, where one of the first electrode and the second electrode is a reflective electrode, and the other is a semi-transmissive and semi-reflective electrode, where the EL layer includes an emission center substance, where when an average value of photon energy of light emitted by the emission center substance in a solution state is denoted by $E_{ave}$ [eV] and emission edge energy on a short wavelength side of an emission spectrum of the emission center substance in the solution state is denoted by $E_{edge}$ [eV], photon energy $E_{em}$ [eV] of a peak wavelength of light emitted from the light-emitting device is expressed by the following formula (1).

$$E_{ave} \leq E_{em} \leq 0.95 E_{edge} \qquad (1)$$

Alternatively, another embodiment of the present invention is a light-emitting device with the above structure, where the emission center substance exhibits blue light.

Alternatively, another embodiment of the present invention is a light-emitting device including a first electrode, a second electrode, an EL layer sandwiched between the first electrode and the second electrode, where one of the first electrode and the second electrode is a reflective electrode, and the other is a semi-transmissive and semi-reflective electrode, where the EL layer includes an emission center substance exhibiting blue emission, where when an average value of photon energy of light emitted by the emission center substance in a solution state is denoted by $E_{ave}$ [eV] and emission edge energy on a short wavelength side of an emission spectrum of the emission center substance in the solution state is denoted by $E_{edge}$ [eV], photon energy $E_{em}$ [eV] of a peak wavelength of light emitted from the light-emitting device is expressed by the following formula (2).

$$E_{ave}+0.02 \leq E_{em} \leq 0.95 E_{edge} \qquad (2)$$

Alternatively, another embodiment of the present invention is the light-emitting device with any of the above structures, where the $E_{em}$ is greater than or equal to 2.6 eV and less than or equal to 2.9 eV.

Alternatively, another embodiment of the present invention is the light-emitting device with any of the above structures, where an organic compound layer with a molecular weight greater than or equal to 300 and less than or equal to 1200 is formed on a surface of the semi-transmissive and semi-reflective electrode, which is an opposite surface facing the reflective electrode.

Alternatively, another embodiment of the present invention is the light-emitting device with any of the above structures, where a solvent in the solution state has a dielectric constant greater than or equal to 1 and less than or equal to 10, at room temperature.

Alternatively, another embodiment of the present invention is the light-emitting device with any of the above structures, where a solvent in the solution state is toluene or chloroform.

Alternatively, another embodiment of the present invention is the light-emitting device with any of the above structures, where the emission center substance in the EL layer includes only one kind of substance.

Alternatively, another embodiment of the present invention is a light-emitting apparatus including the light-emitting device described in any of the above and a transistor or a substrate.

Alternatively, another embodiment of the present invention is an electronic device including the above light-emitting apparatus, and a sensor, an operation button, a speaker, or a microphone.

Alternatively, another embodiment of the present invention is a lighting device including the light-emitting apparatus and a housing.

Alternatively, another embodiment of the present invention is an electronic device including an organic compound described in any of the above.

Note that the light-emitting apparatus in this specification includes an image display device using a light-emitting device. A module in which a connector such as an anisotropic conductive film or a TCP (Tape Carrier Package) is connected to a light-emitting device, a module in which a printed wiring board is provided on the tip of a TCP, and a module in which an IC (integrated circuit) is directly mounted on a light-emitting device by a COG (Chip On Glass) method include a light-emitting apparatus in some cases. Furthermore, in some cases, a lighting device or the like includes the light-emitting device.

Effect of the Invention

According to one embodiment of the present invention, a novel light-emitting device can be provided. According to another embodiment of the present invention, a light-emitting device having high emission efficiency can be provided. According to another embodiment of the present invention, a light-emitting device with high external quantum efficiency can be provided. According to another embodiment of the present invention, a light-emitting device with a high blue index can be provided. According to another embodiment of the present invention, a light-emitting device with low power consumption can be provided.

According to another embodiment of the present invention, a light-emitting device, a light-emitting apparatus, an electronic device, a lighting device, and an electronic apparatus each having low power consumption can be provided.

BRIEF DESCRIPTION OF THE DRAWINGS

FIGS. 5(A) and 5(B) are conceptual diagrams of an active matrix light-emitting apparatus.

FIGS. 7(A), 7(B1), 7(B2), and 7(C) are diagrams each illustrating an electronic device.

MODE FOR CARRYING OUT THE INVENTION

Figure 1A:
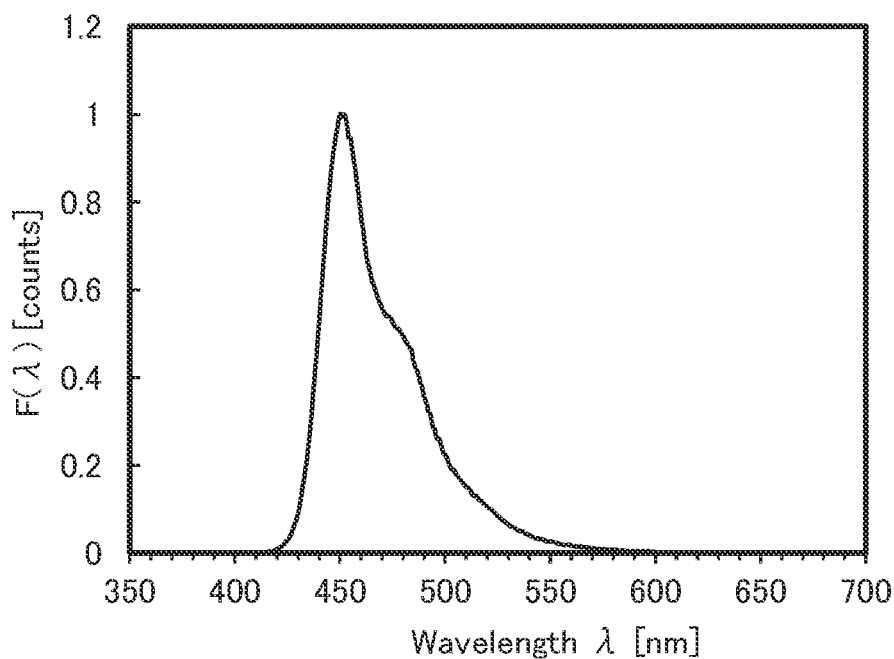
FIGS. 1(A) and 1(B) are diagrams showing a calculation method of an average value of photon energy ($E_{ave}$) of light emitted by an emission center substance in a solution state.

Embodiments of the present invention are described in detail below with reference to drawings. Note that the present invention is not limited to the following description, and it will be readily appreciated by those skilled in the art that modes and details of the present invention can be modified in various ways without departing from the spirit and scope of the present invention. Thus, the present invention should not be construed as being limited to the descriptions in the following embodiments.

Embodiment 1

A variety of light-emitting devices exists as devices emitting light. Whereas an LED uses an inorganic compound as an emission center, an OLED, what is called organic EL element, is a light-emitting device using an organic compound as an emission center substance. The organic compound is known to exhibit an emission spectrum with a broader shape, due to influence of a vibration level or the like, than the case of the inorganic compound.

To display images with high color reproducibility with a display element such as a display, it is necessary to use a display element emitting light with favorable color purity. Thus, in the case where an organic EL element with a broad emission spectrum as described above and relatively low color purity is used for a display element for displaying images, a color filter, a microcavity structure, or the like is used, in some cases, to improve the color purity.

As compared with using a color filter simply blocking light emission, using the microcavity structure that enables amplification of light with an aimed wavelength less loses emission and is advantageous in efficiency. Furthermore, in combination of the light-emitting device having a microcavity structure with an appropriate optical path length and the color filter, the amount of light whose wavelength is blocked can be reduced, so that a light-emitting device having high efficiency and emitting light with high color purity can be obtained. As described above, employing the microcavity structure is suitable for an improvement in color purity and maintaining emission efficiency.

The organic EL element is a light-emitting device using an organic compound as an emission center substance as mentioned above. A spectrum of light emitted by the organic compound has a wavelength and shape derived from a structure of the organic compound, and is specific to the substance. Thus, the wavelength range where light emission can be efficiently obtained differs depending on an emission center substance used in the light-emitting device.

The present inventors found that in light-emitting devices with a microcavity structure, a light-emitting device satisfying the following formula (1) is a light-emitting device with favorable emission efficiency (quantum efficiency calculated from front luminance).

$$E_{ave} \leq E_{em} \leq 0.95 E_{edge} \quad (1)$$

Note that in the above formula, $E_{ave}$ is an average value of photon energy of light emitted by an emission center substance, which is used in the light-emitting device, in a solution state; $E_{em}$ is photon energy of a peak wavelength of light emitted from the light-emitting device; and $E_{edge}$ is emission edge energy on a short wavelength side of an emission spectrum of the emission center substance in the solution state. The unit of all of them is [eV].

<Method for Calculating Average Value of Photon Energy ($E_{ave}$) of Light Emitted by Emission Center Substance in Solution State>

A method for calculating $E_{ave}$ is described with reference to FIG. 1(A). FIG. 1(A) shows a normalized emission spectrum of an organic compound emitting blue light in a toluene solution. The vertical axis is proportional to a photon count. When the emission spectrum is represented as a function of $F(\lambda)$ ($\lambda$ is wavelength), the number of photons $N_p(\lambda)$ per unit time of each wavelength is $N_p(\lambda) = F_0 F$ ($F_0$ is a proportionality constant). Thus, a total number of photons per unit time of the organic compound in the toluene solution can be expressed by the following formula (I). Note that $\int F(\lambda) d\lambda$ in the following formula (I) corresponds to an integral value of the emission spectrum of FIG. 1(A).

$$N_p = \int N_p(\lambda) d\lambda = F_0 \int F(\lambda) d\lambda \quad (I)$$

Meanwhile an energy $\phi_p(\lambda)$ per unit time of photons in a certain wavelength can be expressed by the following formula (II). Note that in the following formula (II), c denotes light speed and h denotes the Planck constant.

$$\phi_p(\lambda)=N_p(\lambda)\cdot ch/\lambda=F_0F(\lambda)\cdot ch/\lambda \quad \text{(II)}$$

Therefore, the total energy in all wavelength regions per unit time for light emission of the organic compound in the toluene solution can be expressed by the following formula (III).

$$\phi_p=\int\phi_p(\lambda)d\lambda=F_0ch\int F(\lambda)/\lambda d\lambda \quad \text{(III)}$$

The average photon energy ($E_{ave}$) of light emission is a value obtained by dividing the total energy expressed by the above formula (III) by the total number of photons expressed by the above formula (I), and thus can be expressed by the following formula (IV).

[Equation 1]

$$E_{ave} = \frac{\phi_p}{N_p} = ch \cdot \frac{\int F(\lambda)/\lambda d\lambda}{\int F(\lambda)d\lambda} \quad \text{(IV)}$$

Figure 1B:
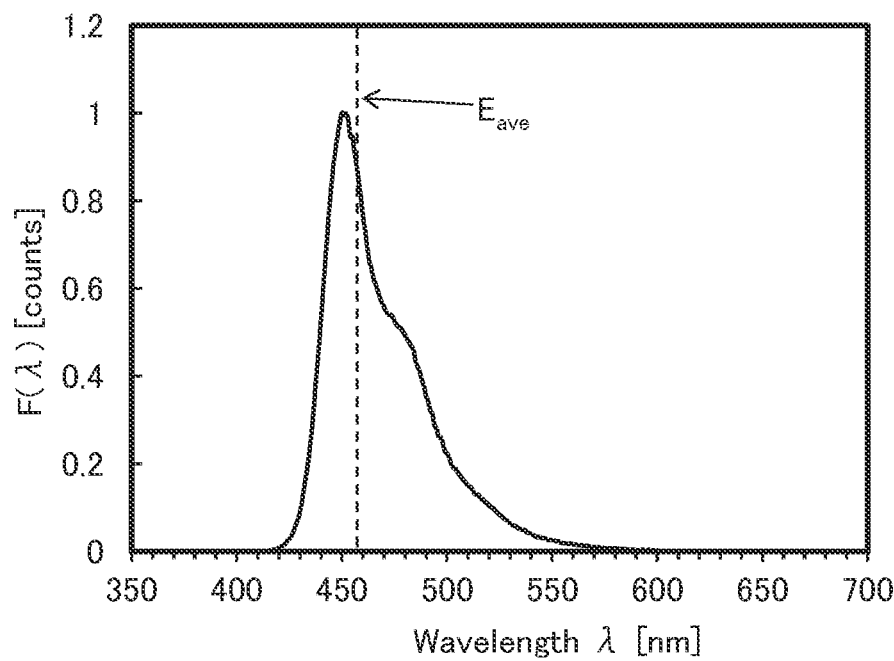

The average photon energy ($E_{ave}$) of light emission of the organic compound in the toluene solution, whose emission spectrum is shown in FIG. 1(A), can be calculated from the above formula (IV) to be 2.65 eV, i.e., 468 nm (FIG. 1(B)). Note that the significant digit is three.

Here, depending on used calculation tools, in some cases, the vertical axis of the PL spectrum is not photon number $N_p(\lambda)$ but energy $\phi_p(\lambda)$ itself (in the case of a spectra radiance meter, for example) or normalized spectrum $I(\lambda)$ that is proportional to the energy $\phi_p(\lambda)$. In such a case, the average photon energy $E_{ave}$ of light emission can be calculated as described below.

First, based on the above formulae (I) and (II), the total numbers of photons $N_p$ per unit time can be expressed by the following formula (V).

$$N_p=\int N_p(\lambda)d\lambda=(1/ch)\int\phi p(\lambda)\lambda d\lambda \quad \text{(V)}$$

Thus, in the case where the vertical axis of the PL spectrum is energy $\phi_p(\lambda)$ itself, the average photon energy ($E_{ave}$) of light emission can be calculated from the following formula (VI) based on the formulae (III) to (V).

[Equation 2]

$$E_{ave} = \frac{\phi_p}{N_p} = ch \cdot \frac{\int \phi_p(\lambda)d\lambda}{\int \phi_p(\lambda)\lambda d\lambda} \quad \text{(VI)}$$

Alternatively, in the case where the normalized spectrum $I(\lambda)$ that is proportional to the energy is used, calculation can be made as the following formula (VII).

[Equation 3]

$$E_{ave} = \frac{\phi_p}{N_p} = ch \cdot \frac{\int I(\lambda)d\lambda}{\int I(\lambda)\lambda d\lambda} \quad \text{(VII)}$$

As described above, the average photon energy ($E_{ave}$) of light emission can be calculated from any one of the above formulae (IV), (VI), and (VII), depending on a toll for measuring an emission spectrum of an organic compound in a toluene solution.

<Method for Calculating Emission Edge Energy ($E_{edge}$) on Short Wavelength Side of Emission Spectrum>

Figure 2:
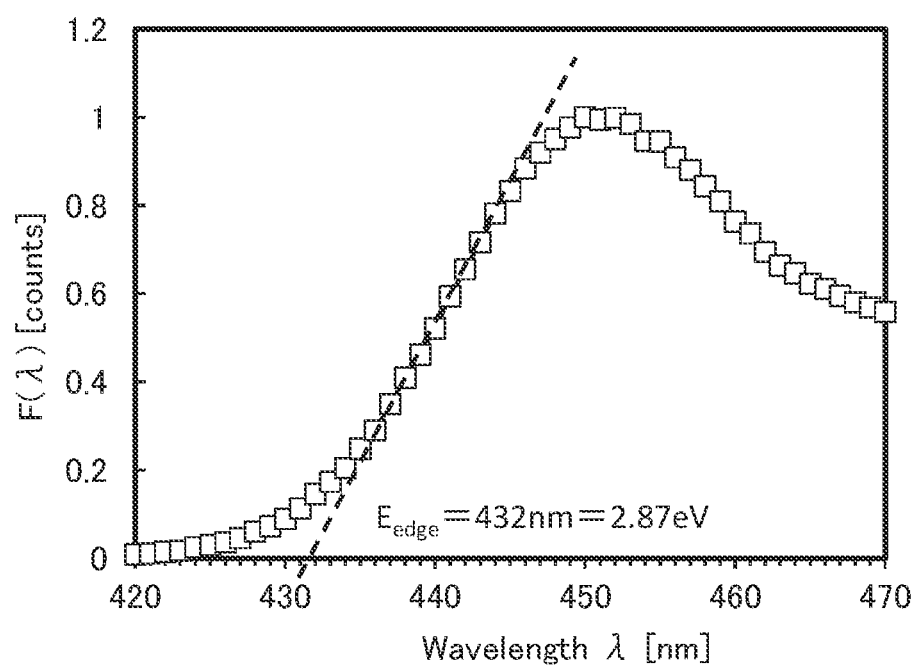
FIG. 2 is a diagram showing a calculation method of an emission edge energy ($E_{edge}$) on a short wavelength side of an emission spectrum.

A method for calculating $E_{edge}$ is described. FIG. 2 shows an enlarged graph in the vicinity of emission edge on the short wavelength side of the emission center substance in FIG. 1. As shown in FIG. 2, $E_{edge}$ can be determined by drawing a tangent to at around a half of the peak toward a tail on the short wavelength side of emission spectrum $F(\lambda)$ and calculating an intersection of the tangent and the x axis.

Since the intersection of the x axis and the tangent drawn to at around the half of the peak toward the tail on the short wavelength side of the emission spectrum shown in FIG. 2 is determined and found to be 432 nm, the emission edge energy ($E_{edge}$) on the short wavelength side of the emission spectrum can be figured out as 2.87 eV.

Note that the PL spectrum of the emission center substance used for calculation of $E_{ave}$ and $E_{edge}$ is the spectrum of the emission center substance in a solution state. Each energy level is affected by the dielectric constant or the like. The dielectric constant of an organic compound included in the EL layer of the light-emitting device is approximately 3; therefore, measurement is conducted, at room temperature, in a solution where the dielectric constant is greater than or equal to 1 and less than or equal to 10, preferably greater than to equal to 2 and less than or equal to 5, whereby a fairly accurate value can be obtained. Specific examples of a solvent include hexane, benzene, toluene, diethyl ether, ethyl acetate, chloroform, chlorobenzene, and dichloromethane. In particular, toluene and chloroform each have a dielectric constant greater than or equal to 2 and less than or equal to 5, at room temperature, have high solubility and be used as a versatile solvent. Thus, when measurement is conducted in a solvent of toluene or chloroform, a difference between a value measured in the light-emitting device and a value measured in the solvent is within an experimental error range in many cases.

<Relation Between EL Emission Peak Energy ($E_{em}$), External Quantum Efficiency (EQE), and Blue Index (BI) of Light-Emitting Device>

Figure 3:
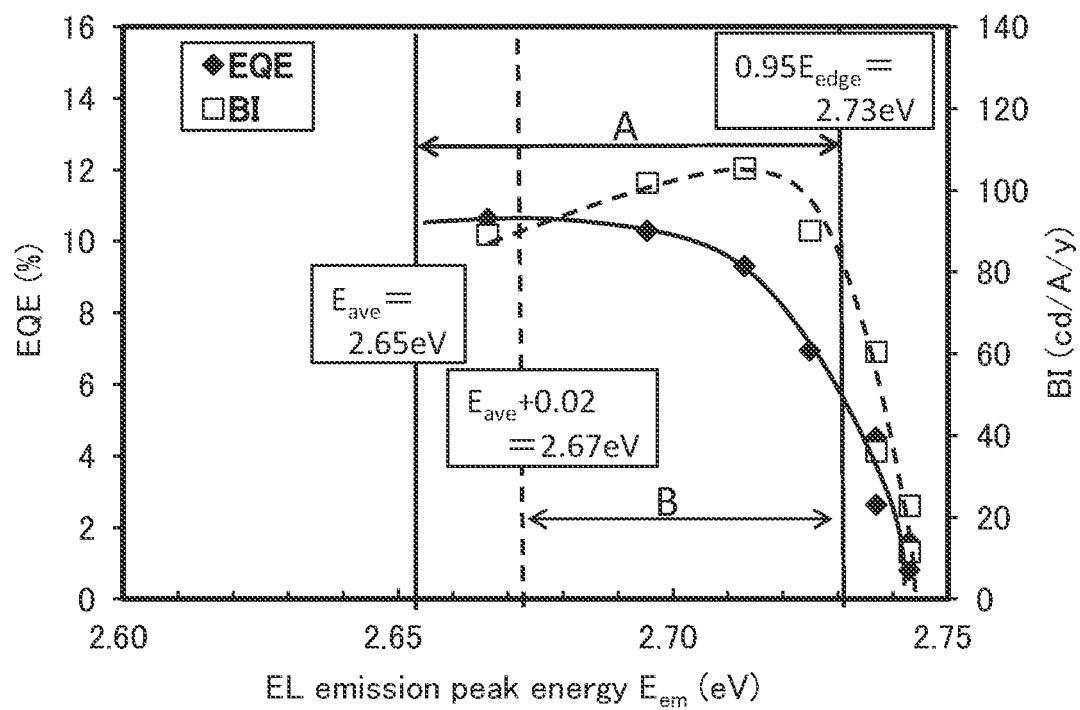
FIG. 3 is a diagram showing a relation of energy at an EL emission peak ($E_{em}$), external quantum efficiency (EQE), and a blue index (BI).

FIG. 3 shows an examined relation between $E_{em}$ and EQE and an examined relation between $E_{em}$ and BI of an organic EL element (top emission) with a microcavity structure using an emission substance used in FIG. 1 and FIG. 2 as an emission center. Note that EQE shown here is an uncorrected EQE calculated from front luminance on the assumption of Lambertian distribution. In addition, the EQE is one when the luminance is around 1000 cd/m².

Note that the blue index (BI) is a value obtained by further dividing current efficiency (cd/A) by chromaticity y, and is one of the indicators representing characteristics of blue light emission. As the chromaticity y is smaller, the color purity of blue light emission tends to be higher. With high color purity for blue light emission, a wide range of blue can be expressed even with a small number of luminance components; thus, using blue light emission with high color purity reduces the luminance needed for expressing blue, leading to lower power consumption. Thus, BI that is based on chromaticity y, which is one of the indicators of color purity of blue, is suitably used as a mean for showing efficiency of blue light emission. The light-emitting device with higher BI can be regarded as a blue light-emitting device having more favorable efficiency for a display.

The EL emission peak energy ($E_{em}$) shown in the horizontal axis of FIG. 3 can be controlled by changing an optical path length of the organic EL element and changing a wavelength amplified with the microcavity effect. As a result of plotting EQE with respect to the $E_{em}$, favorable efficiency is shown in a range from 2.65 eV to 2.73 eV (range of A in the drawing), and EQE of the light-emitting device exhibiting $E_{em}$ beyond the range greatly decreases. In addition, BI also exhibits favorable values in a similar range. As calculated in the above, 2.65 eV corresponds to the average photon energy ($E_{ave}$) of light emission of the emission center substance which is in the toluene solution and used in the light-emitting device.

The upper limit of the range A in the drawing, 2.73 eV, corresponds to 0.95 times the value of 2.87 eV calculated above, the emission edge energy ($E_{edge}$) on the short wavelength side of a PL emission spectrum of the emission center substance which is in the toluene solution and used for the above organic EL element.

In the above manner, in the organic EL element with a microcavity structure, the cavity length (optical path length) in the microcavity structure is controlled to satisfy a relation shown in the following formula (1), whereby a light-emitting device with favorable EQE can be obtained. Note that, in this range, BI also exhibits favorable values.

$$E_{ave} \leq E_{em} \leq 0.95 E_{edge} \qquad (1)$$

(Note that $E_{ave}$ represents the average photon energy (unit [eV]) of light emitted by an emission center substance in a toluene solution, which is used for a light-emitting device, $E_{edge}$ represents the emission edge energy (unit [eV]) on a short wavelength side of a PL emission spectrum of the emission center substance in the toluene solution, and $E_{em}$ represents the EL emission peak energy (unit [eV]).)

In the case of an organic EL element emitting blue light, it is appropriate to focus on BI. The present inventors found that BI and EQE have different peak values of $E_{em}$. As shown in FIG. 3, BI has a maximum value when $E_{em}$ is positioned at a relatively higher region than the case of EQE; thus, the cavity length (optical length) of the microcavity structure is preferably controlled to satisfy the following formula (2).

$$E_{ave} + 0.02 \leq E_{em} \leq 0.95 E_{edge} \qquad (2)$$

Note that the organic EL element of one embodiment of the present invention preferably has $E_{em}$ greater than or equal to 2.6 eV and less than or equal to 2.9 eV.

Furthermore, an organic EL element of one embodiment of the present invention is a light-emitting device with a microcavity structure. The organic EL element emits light by making current flow to a structure where an EL layer containing an organic compound is sandwiched between a pair of electrodes. Meanwhile, the microcavity structure is such a structure that one of a pair of electrodes is a reflective electrode and the other is a semi-transmissive and semi-reflective electrode, which enables repetition of reflection and amplification of light with a wavelength corresponding to a distance between the electrodes (also referred to as cavity length or optical path length). The cavity length can be changed by adjusting the thickness of an EL layer or the electrode. In the case where the cavity length is adjusted with the electrode, a transparent electrode such as ITO can be used. In the case where the EL layer is adjusted, the thickness of a carrier transport layer or a carrier injection layer is adjusted, so that the optical path length can be controlled.

As the light emission direction of the organic EL element, either a top-emission structure or a bottom-emission structure may be employed. In the top-emission light-emitting device, an organic compound layer with a molecular weight greater than or equal to 300 and less than or equal to 1200 is preferably formed on a surface of a semi-transmissive and semi-reflective electrode, which is an opposite surface facing the reflective electrode, so as to conduct light extraction more efficiently.

Note that in the light-emitting device of one embodiment of the present invention, one kind of emission center substance is preferable for an emission center substance in one light-emitting device.

A light-emitting device of one embodiment of the present invention with the above structure can be a light-emitting device with favorable emission efficiency.

Figure 4A:
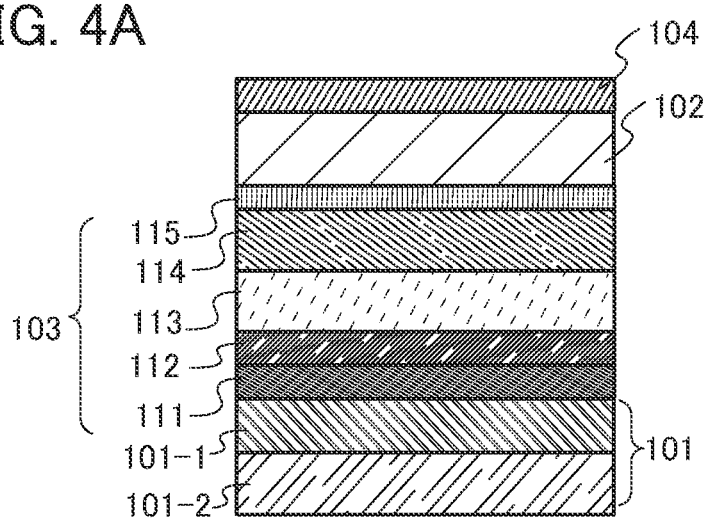
FIGS. 4(A) and 4(B) are each a conceptual diagram of a light-emitting device.

Next, an example of a light-emitting device which is one embodiment of the present invention will be described in detail below with reference to FIG. 4(A).

The light-emitting device in this embodiment includes a pair of electrodes of a first electrode 101 and a second electrode 102 and an EL layer 103 provided between the first electrode 101 and the second electrode 102. In FIG. 4(A), the electrode provided on the formation substrate side is referred to as the first electrode 101.

The light-emitting device of one embodiment of the present invention is a light-emitting device having a microcavity structure. The light-emitting device with a microcavity structure can be obtained with use of a reflective electrode and a semi-transmissive and semi-reflective electrode as a pair of electrodes. The reflective electrode and the semi-transmissive and semi-reflective electrode correspond to the first electrode 101 and the second electrode 102 described above. The light-emitting device includes at least an EL layer between the reflective electrode and the semi-transmissive and semi-reflective electrode, which includes at least a light-emitting layer serving as a light-emitting region.

In the light-emitting device with a microcavity structure, light emitted in all directions from the light-emitting layer included in the EL layer is reflected and resonated by the reflective electrode and the semi-transmissive and semi-reflective electrode.

Note that the reflective electrode has a visible light reflectivity of 40% to 100%, preferably 70% to 100%, and a resistivity of $1 \times 10^{-2}$ Ωcm or lower. Examples of a material forming the reflective electrode include aluminum (Al) or an alloy containing Al. Examples of the alloy containing Al include an alloy containing Al and L (L represents one or more of titanium (Ti), neodymium (Nd), nickel (Ni), and lanthanum (La)), such as an alloy containing Al and Ti and an alloy containing Al, Ni, and La. Aluminum has low resistance and high light reflectivity. Aluminum is included in earth's crust in large amount and is inexpensive; therefore, it is possible to reduce costs for manufacturing a light-emitting device with aluminum. Furthermore, silver (Ag), an alloy containing Ag and N (N represents one or more of yttrium (Y), Nd, magnesium (Mg), ytterbium (Yb), Al, Ti, gallium (Ga), zinc (Zn), indium (In), tungsten (W), manganese (Mn), tin (Sn), iron (Fe), Ni, copper (Cu), palladium (Pd), iridium (Ir), and gold (Au)), or the like may be used. Examples of the alloy containing silver include an alloy containing silver, palladium, and copper, an alloy containing silver and copper, an alloy containing silver and magnesium, an alloy containing silver and nickel, an alloy containing silver and gold, and an alloy containing silver and ytterbium. Besides, a transition metal such as tungsten, chromium (Cr), molybdenum (Mo), copper, or titanium can be used. Note that a transparent electrode layer is formed using a light-transmitting conductive material between the reflective electrode so that the first electrode 101 can have a two-layer structure of the reflective electrode and the transparent electrode. By this, an optical length of the microcavity structure (microcavity length) can be adjusted. Examples of the light-transmitting conductive material include a metal oxide such as indium tin oxide (hereinafter, referred to as ITO), indium tin oxide containing silicon or silicon oxide (abbreviation: ITSO), indium oxide-zinc oxide (Indium Zinc Oxide), indium oxide-tin oxide containing titanium, indium titanium oxide, or indium oxide containing tungsten oxide and zinc oxide can be used. In FIG. 4(A), first electrode 101 is formed with a reflective electrode 101-1 and a transparent electrode 101-2.

In addition, the semi-transmissive and semi-reflective electrode has a visible light reflectivity of 20% to 80%, preferably 40% to 70%, and a resistivity of $1 \times 10^{-2}$ Ωcm or lower. For example, one or more kinds of conductive metals and alloys, conductive compounds, and the like can be used as the semi-transmissive and semi-reflective electrode. Specifically, a metal oxide such as indium tin oxide (hereinafter, referred to as ITO), indium tin oxide containing silicon or silicon oxide (abbreviation: ITSO), indium oxide-zinc oxide (Indium Zinc Oxide), indium oxide-tin oxide containing titanium, indium titanium oxide, or indium oxide containing tungsten oxide and zinc oxide can be used. A metal thin film having a thickness that allows transmission of light (preferably, a thickness greater than or equal to 1 nm and less than or equal to 30 nm) can also be used. As the metal, Ag, an alloy of Ag and Al, an alloy of Ag and Mg, an alloy of Ag and Au, an alloy of Ag and Yb, or the like can be used.

The reflective electrode can be either one of the first electrode 101 and the second electrode 102 and the semi-transmissive and semi-reflective electrode can be the other. FIG. 4(A) shows a case where the first electrode 101 is on the formation substrate side as described above; thus, the light-emitting device has a top emission structure when the reflective electrode is the first electrode, and the light-emitting device is a bottom emission device when the reflective electrode is the second electrode 102. Note that although the first electrode 101 and the second electrode 102 may serve as either an anode or a cathode, FIG. 4(A) shows a case where the first electrode 101 is an anode.

Note that when the light-emitting device has a top-emission structure, the light extraction efficiency can be improved by providing an organic cap layer 104 on a surface of the second electrode 102 which is opposite to a surface in contact with the EL layer 103. When the organic cap layer 104 is provided in contact with the electrode 102 in the light-emitting device, the difference in refractive index at the interface between the electrode 102 and the air can be reduced, resulting in improvement in light extraction efficiency. The thickness is preferably greater than or equal to 5 nm and less than or equal to 120 nm. Further preferably, the thickness is greater than or equal to 30 nm and less than or equal to 90 nm. An organic compound layer including a substance with a molecular weight greater than or equal to 300 and less than or equal to 1200 is preferably used as the organic cap layer 104. Furthermore, the organic cap layer is preferably formed using a conductive organic material. In the structure, the second electrode 102 is the semi-transmissive and semi-reflective electrode, which needs a thin thickness so as to ensure a certain light-transmitting property, and conductivity might be decreased in some cases. With use of a conductive material for the organic cap layer 104, while the light extraction efficiency is improved, the conductivity can be ensured and the manufacturing yield of the light-emitting device can be improved. Note that an organic compound that is less likely to absorb light in a visible light region can be favorably used. For the organic cap layer, the organic compound used for the EL layer 103 can also be used for the organic cap layer 104. In that case, the organic cap layer 104 can be formed with a deposition apparatus or a deposition chamber for forming the EL layer 103, so that the organic cap layer 104 can be easily formed.

Figure 4B:
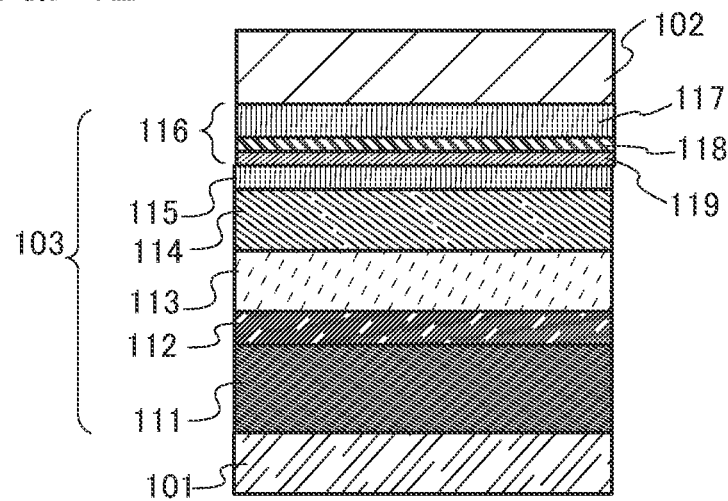

In the light-emitting device, by changing the thickness of the transparent electrode provided in contact with the above-described reflective electrode and the thicknesses of carrier-transport layers, such as a hole-injection layer and a hole-transport layer, the optical path length (cavity length) between the reflective electrode and the semi-transmissive and semi-reflective electrode can be changed. Thus, light with a wavelength that is resonated between the reflective electrode and the semi-transmissive and semi-reflective electrode can be intensified while light with a wavelength that is not resonated therebetween can be attenuated. FIG. 4(A) illustrates an example in which the optical path length is adjusted by the transparent electrode 101-2, which is a part of the first electrode 101; however, the optical path length may be adjusted by a hole-injection layer 111 as shown in FIG. 4(B) or by a hole-transport layer 112, or a combination of two or more of them may be used.

Note that in light emission, light that is reflected back by the reflective electrode (first reflected light) considerably interferes with light that directly enters the semi-transmissive and semi-reflective electrode from the light-emitting layer (first incident light); therefore, the optical path length between the reflective electrode and the light-emitting layer is preferably adjusted to $(2n-1)\lambda/4$ (n is a natural number of 1 or larger and $\lambda$ is a wavelength of light emission to be amplified). By adjusting the optical path length, the phases of the first reflected light and the first incident light can be aligned with each other and the light emitted from the light-emitting layer can be further amplified.

With the microcavity structure, emission intensity with a specific wavelength in the front direction can be increased, whereby power consumption can be reduced.

Although the EL layer 103 preferably has a stacked structure, there is no particular limitation on the stacked structure, and various layer structures such as a hole-injection layer, a hole-transport layer, an electron-transport layer, an electron-injection layer, a carrier-blocking layer, an exciton-blocking layer, and a charge-generation layer can be employed. In this embodiment, two kinds of stacked-layer structures are described: the structure including the electron-transport layer 114 and the electron-injection layer 115 in addition to the hole-injection layer 111, the hole-transport layer 112, and the light-emitting layer 113 as illustrated in FIG. 4(A); and the structure including the electron-transport layer 114, the electron-injection layer 115, and a charge-generation layer 116 in addition to the hole-injection layer 111, the hole-transport layer 112, and the light-emitting layer 113 as illustrated in FIG. 4(B). Materials forming the layers are specifically described below.

The hole-injection layer 111 is a layer containing a substance having an acceptor property. Either an organic compound or an inorganic compound can be used as the substance having an acceptor property.

As the substance having an acceptor property, a compound including an electron-withdrawing group (a halogen group or a cyano group) can be used; for example, 7,7,8,8-tetracyano-2,3,5,6-tetrafluoroquinodimethane (abbreviation: F4-TCNQ), 3,6-difluoro-2,5,7,7,8,8-hexacyanoquinodimethane, chloranil, 2,3,6,7,10,11-hexacyano-1,4,5,8,9,12-hexaazatriphenylene (abbreviation: HAT-CN), or 1,3,4,5,7,8-hexafluorotetracyano-naphthoquinodimethane (abbreviation: F6-TCNNQ) can be used. The organic compound having an acceptor property is preferably a compound in which electron-withdrawing groups are bonded to a condensed aromatic ring having a plurality of heteroatoms, like HAT-CN, because it is thermally stable. A [3]radialene derivative including an electron-withdrawing group (in particular, a cyano group or a halogen group such as a fluoro group) has a very high electron-accepting property and thus is preferable; specific examples include α,α',α''-1,2,3-cyclopropanetriylidenetris[4-cyano-2,3,5,6-tetrafluorobenzeneacetonitrile], α,α',α''-1,2,3-cyclopropanetriylidenetris[2,6-dichloro-3,5-difluoro-4-(trifluoromethyl)benzeneacetonitrile], and α,α',α''-1,2,3-cyclopropanetriylidenetris[2,3,4,5,6-pentafluorobenzeneacetonitrile]. As the substance having an acceptor property, molybdenum oxide, vanadium oxide, ruthenium oxide, tungsten oxide, manganese oxide, or the like can be used, other than the above-described organic compounds. Alternatively, the hole-injection layer 111 can be formed using a phthalocyanine-based complex compound such as phthalocyanine (abbreviation: $H_2Pc$) or copper phthalocyanine (CuPC), an aromatic amine compound such as 4,4'-bis[N-(4-diphenylaminophenyl)-N-phenylamino]biphenyl (abbreviation: DPAB) or N,N'-bis{4-[bis(3-methylphenyl)amino]phenyl}-N,N'-diphenyl-(1,1'-biphenyl)-4,4'-diamine (abbreviation: DNTPD), or a high molecular compound such as poly(3,4-ethylenedioxythiophene)/poly(styrenesulfonic acid) (PEDOT/PSS). The substance having an acceptor property can extract electrons from an adjacent hole-transport layer (or hole-transport material) when an electric field is applied.

Alternatively, a composite material in which a substance having a hole-transport property contains an acceptor substance can be used for the hole-injection layer 111. By using a composite material in which a substance having a hole-transport property contains an acceptor substance, a material used to form an electrode can be selected regardless of its work function. In other words, besides a material having a high work function, a material having a low work function can also be used for the first electrode 101. Examples of the acceptor substance include an organic compound having an acceptor property, such as 7,7,8,8-tetracyano-2,3,5,6-tetrafluoroquinodimethane (abbreviation: F4-TCNQ), chloranil, or 1,3,4,5,7,8-hexafluorotetracyano-naphthoquinodimethane (abbreviation: F6-TCNNQ), and a transition metal oxide. In addition, oxides of metals belonging to Group 4 to Group 8 of the periodic table can be used. As the oxide of a metal belonging to Group 4 to Group 8 in the periodic table, vanadium oxide, niobium oxide, tantalum oxide, chromium oxide, molybdenum oxide, tungsten oxide, manganese oxide, rhenium oxide, or the like is preferably used because their electron-accepting property is high. Among these oxides, molybdenum oxide is particularly preferable because it is stable in the air, has a low hygroscopic property, and is easy to handle.

As the substance having a hole-transport property which is used for the composite material, a variety of organic compounds such as an aromatic amine compound, a carbazole derivative, an aromatic hydrocarbon, and a high molecular compound (an oligomer, a dendrimer, a polymer, or the like) can be used. Note that a substance having a hole mobility of $1 \times 10^{-6}$ $cm^2/Vs$ or higher is preferably used as the substance having a hole-transport property which is used for the composite material. Organic compounds that can be used as the substance having a hole-transport property in the composite material are specifically given below.

Examples of the aromatic amine compounds that can be used for the composite material include N,N'-di(p-tolyl)-N,N'-diphenyl-p-phenylenediamine (abbreviation: DTDPPA), 4,4'-bis[N-(4-diphenylaminophenyl)-N-phenylamino]biphenyl (abbreviation: DPAB), N,N'-bis{4-[bis(3-methylphenyl)amino]phenyl}-N,N'-diphenyl-(1,1'-biphenyl)-4,4'-diamine (abbreviation: DNTPD), 1,3,5-tris[N-(4-diphenylaminophenyl)-N-phenylamino]benzene (abbreviation: DPA3B), and 1,1-bis-(4-bis(4-methyl-phenyl)-amino-phenyl)-cyclohexane (abbreviation: TAPC). Specific examples of the carbazole derivatives include 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphthyl)-N-(9-phenylcarbazol-3-yl)amino]-9-phenylcarbazole (abbreviation: PCzPCN1), 4,4'-di(N-carbazolyl)biphenyl (abbreviation: CBP), 1,3,5-tris[4-(N-carbazolyl)phenyl]benzene (abbreviation: TCPB), 9-[4-(10-phenylanthracene-9-yl)phenyl]-9H-carbazole (abbreviation: CzPA), and 1,4-bis[4-(N-carbazolyl)phenyl]-2,3,5,6-tetraphenylbenzene. Examples of the aromatic hydrocarbon include 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 2-tert-butyl-9,10-bis[2-(1-naphthyl)phenyl]anthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, and 2,5,8,11-tetra(tert-butyl)perylene. Besides, pentacene, coronene, and the like can be used. A vinyl skeleton may be included. Examples of the aromatic hydrocarbon having a vinyl group include 4,4'-bis(2,2-diphenylvinyl)biphenyl (abbreviation: DPVBi) and 9,10-bis[4-(2,2-diphenylvinyl)phenyl]anthracene (abbreviation: DPVPA). Note that the organic compound of one embodiment of the present invention can also be used. In this case, F6-TCNNQ is preferably used as the acceptor substance.

It is also possible to use high molecular compounds such as poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl)methacrylamide] (abbreviation: PTPDMA), and poly[N,N'-bis(4-butylphenyl)-N,N'-bis(phenyl)benzidine] (abbreviation: Poly-TPD).

The formation of the hole-injection layer 111 can improve the hole-injection property, whereby a light-emitting device having a low driving voltage can be obtained. The organic compound having an acceptor property is an easy-to-use material because evaporation is easy and its film can be easily formed.

Note that in the case where the hole-injection layer is formed using the above composite material, the layer containing the composite material is extremely appropriate for a layer adjusting the cavity length in the microcavity structure because the composite material has favorable conductivity and is less likely to cause a degradation of driving voltage even if the layer thickness is increased.

The hole-transport layer 112 contains a hole-transport material. The hole-transport material preferably has a hole mobility of $1\times10^{-6}$ cm$^2$/Vs or more. The hole-transport layer 112 preferably includes the organic compound of one embodiment of the present invention. The hole-transport layer 112 including the organic compound described in Embodiment 1 can be a layer with a low refractive index in the EL layer 103, leading to higher external quantum efficiency of the light-emitting device.

As a material having a hole-transport property, a compound having an aromatic amine skeleton, such as 4,4'-bis[N-(1-naphthyl)-N-phenylamino]biphenyl (abbreviation: NPB), N,N'-bis(3-methylphenyl)-N,N'-diphenyl-[1,1'-biphenyl]-4,4'-diamine (abbreviation: TPD), 4,4'-bis[N-(spiro-9,9'-bifluoren-2-yl)-N-phenylamino]biphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), 4-phenyl-4'-(9-phenyl-9H-carbazol-3-yl)triphenylamine (abbreviation: PCBA1BP), 4,4'-diphenyl-4''-(9-phenyl-9H-carbazol-3-yl)triphenylamine (abbreviation: PCBBi1BP), 4-(1-naphthyl)-4'-(9-phenyl-9H-carbazol-3-yl)-triphenylamine (abbreviation: PCBANB), 4,4'-di(1-naphthyl)-4''-(9-phenyl-9H-carbazol-3-yl)triphenylamine (abbreviation: PCBNBB), 9,9-dimethyl-N-phenyl-N-[4-(9-phenyl-9H-carbazol-3-yl)phenyl]-fluoren-2-amine (abbreviation: PCBAF), or N-phenyl-N-[4-(9-phenyl-9H-carbazol-3-yl)phenyl]-spiro-9,9'-bifluoren-2-amine (abbreviation: PCBASF), a compound having a carbazole skeleton, such as 1,3-bis(N-carbazolyl)benzene (abbreviation: mCP), 4,4'-di(N-carbazolyl)biphenyl (abbreviation: CBP), 3,6-bis(3,5-diphenylphenyl)-9-phenylcarbazole (abbreviation: CzTP), or 3,3'-bis(9-phenyl-9H-carbazole) (abbreviation: PCCP), a compound having a thiophene skeleton, such as 4,4',4''-(benzene-1,3,5-triyl)tri(dibenzothiophene) (abbreviation: DBT3P-II), 2,8-diphenyl-4-[4-(9-phenyl-9H-fluoren-9-yl)phenyl]dibenzothiophene (abbreviation: DBTFLP-III), or 4-[4-(9-phenyl-9H-fluoren-9-yl)phenyl]-6-phenyldibenzothiophene (abbreviation: DBTFLP-IV), and a compound having a furan skeleton, such as 4,4',4''-(benzene-1,3,5-triyl)tri(dibenzofuran) (abbreviation: DBF3P-II) or 4-{3-[3-(9-phenyl-9H-fluoren-9-yl)phenyl]phenyl}dibenzofuran (abbreviation: mmDBFFLBi-II) can be given. Among the above, the compound having an aromatic amine skeleton and the compound having a carbazole skeleton are preferable because these have favorable reliability, have high hole-transport properties, and contribute to a reduction in driving voltage. Note that any of the substances given as examples of the material having a hole-transport property that is used in the composite material for the hole-injection layer 111 can also be suitably used as the material included in the hole-transport layer 112.

The light-emitting layer 113 is a layer containing the host material and the light-emitting material. The light-emitting material may be fluorescent substances, phosphorescent substances, substances exhibiting thermally activated delayed fluorescence (TADF), or other light-emitting materials. Furthermore, it may be a single layer or be formed of a plurality of layers including different light-emitting materials.

Examples of a material that can be used as a fluorescent substance in the light-emitting layer 113 are as follows. Fluorescent substances other than those given below can also be used.

For example, 5,6-bis[4-(10-phenyl-9-anthryl)phenyl]-2,2'-bipyridine (abbreviation: PAP2BPy), 5,6-bis[4'-(10-phenyl-9-anthryl)biphenyl-4-yl]-2,2'-bipyridine (abbreviation: PAPP2BPy), N,N'-diphenyl-N,N'-bis[4-(9-phenyl-9H-fluoren-9-yl)phenyl]pyrene-1,6-diamine (abbreviation: 1,6FLPAPrn), N,N'-bis(3-methylphenyl)-N,N'-bis[3-(9-phenyl-9H-fluoren-9-yl)phenyl]-pyrene-1,6-diamine (abbreviation: 1,6mMemFLPAPrn), N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3-amine (abbreviation: PCAPA), perylene, 2,5,8,11-tetra-tert-butylperylene (abbreviation: TBP), 4-(10-phenyl-9-anthryl)-4'-(9-phenyl-9H-carbazol-3-yl)triphenylamine (abbreviation: PCBAPA), N,N'-(2-tert-butylanthracene-9,10-diyldi-4,1-phenylene)bis[N,N,N'-triphenyl-1,4-phenylenediamine] (abbreviation: DPABPA), N,9-diphenyl-N-[4-(9,10-diphenyl-2-anthryl)phenyl]-9H-carbazol-3-amine (abbreviation: 2PCAPPA), N-[4-(9,10-diphenyl-2-anthryl)phenyl]-N,N',N'-triphenyl-1,4-phenylenediamine (abbreviation: 2DPAPPA), N,N,N',N'',N',N''',N'',N''-octaphenyldibenzo[g,p]chrysene-2,7,10,15-tetraamine (abbreviation: DBC1), coumarin 30, N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), 9,10-bis(1,1'-biphenyl-2-yl)-N-[4-(9H-carbazol-9-yl)phenyl]-N-phenylanthracen-2-amine (abbreviation: 2YGABPhA), N,N,9-triphenylanthracen-9-amine (abbreviation: DPhAPhA) coumarin 545T, N,N'-diphenylquinacridone (abbreviation: DPQd), rubrene, 5,12-bis(1,1'-biphenyl-4-yl)-6,11-diphenyltetracene (abbreviation: BPT), 2-(2-{2-[4-(dimethylamino)phenyl]ethenyl}-6-methyl-4H-pyran-4-ylidene)propanedinitrile (abbreviation: DCM1), 2-{2-methyl-6-[2-(2,3,6,7-tetrahydro-1H,5H-benzo quinolizin-9-yl)ethenyl]-4H-pyran-4-ylidene}propanedinitrile (abbreviation: DCM2), N,N,N',N'-tetrakis(4-methylphenyl)tetracene-5,11-diamine (abbreviation: p-mPhTD), 7,14-diphenyl-N,N,N',N'-tetrakis(4-methylphenyl)acenaphtho[1,2-a]fluoranthene-3,10-diamine (abbreviation: p-mPhAFD), 2-{2-isopropyl-6-[2-(1,1,7,7-tetramethyl-2,3,6,7-tetrahydro-1H,5H-benzo quinolizin-9-yl)ethenyl]-4H-pyran-4-ylidene}propanedinitrile (abbreviation: DCJTI), 2-{2-tert-butyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTB), 2-(2,6-bis{2-[4-(dimethylamino)phenyl]ethenyl}-4H-pyran-4-ylidene)propanedinitrile (abbreviation: BisDCM), 2-{2,6-bis[2-(8-methoxy-1,1,7,7-tetramethyl-2,3,6,7-tetrahydro-1H,5H-benzo[ij]quinolizin-9-yl)ethenyl]-4H-pyran-4-ylidene}propanedinitrile (abbreviation: BisDCJTM), and N,N'-diphenyl-N,N'-(1,6-pyrene-diyl)bis[(6-phenylbenzo[b]naphtho[1,2-d]furan)-8-amine] (abbreviation: 1,6BnfAPrn-03) can be given. In particular, a condensed aromatic diamine compound typified by a pyrenediamine compound such as 1,6FLPAPm, 1,6mMemFLPAPrn, and 1,6BnfAPrn-03 is preferable because of its high hole-trapping property, high emission efficiency, and high reliability.

Examples of a material that can be used as a phosphorescent substance in the light-emitting layer 113 are as follows.

An organometallic iridium complex having a 4H-triazole skeleton, such as tris{2-[5-(2-methylphenyl)-4-(2,6-dimethylphenyl)-4H-1,2,4-triazol-3-yl-κN2]phenyl-κC}iridium(III) (abbreviation: [Ir(mpptz-dmp)₃]), tris(5-methyl-3,4-diphenyl-4H-1,2,4-triazolato)iridium(III) (abbreviation: [Ir(Mptz)₃]), or tris[4-(3-biphenyl)-5-isopropyl-3-phenyl-4H-1,2,4-triazolato]iridium(III) (abbreviation: [Ir(iPrptz-3b)₃]), an organometallic iridium complex having a 1H-triazole skeleton, such as tris[3-methyl-1-(2-methylphenyl)-5-phenyl-1H-1,2,4-triazolato]iridium(III) (abbreviation: [Ir(Mptz1-mp)₃]) or tris(1-methyl-5-phenyl-3-propyl-1H-1,2,4-triazolato)iridium(III) (abbreviation: [Ir(Prptz1-Me)₃]), an organometallic iridium complex having an imidazole skeleton, such as fac-tris[1-(2,6-diisopropylphenyl)-2-phenyl-1H-imidazole]iridium(III) (abbreviation: [Ir(iPrpmi)₃]) or tris[3-(2,6-dimethylphenyl)-7-methylimidazo[1,2-f]phenanthridinato]iridium(III) (abbreviation: [Ir(dmpimpt-Me)₃]), and an organometallic iridium complex in which a phenylpyridine derivative having an electron-withdrawing group is a ligand, such as bis[2-(4',6-difluorophenyl)pyridinato-N,C2']iridium(III) tetrakis(1-pyrazolyl)borate (abbreviation: FIr6), bis[2-(4',6'-difluorophenyl)pyridinato-N, C2'] iridium(III) picolinate (abbreviation: FIrpic), bis{2-[3',5'-bis(trifluoromethyl)phenyl]pyridinato-N,C2'}iridium(III) picolinate (abbreviation: [Ir(CF3ppy)₂(pic)]), or bis[2-(4',6'-difluorophenyl)pyridinato-N,C2']iridium(III) acetylacetonate (abbreviation: FIracac) can be given. These are compounds exhibiting blue phosphorescence, and are compounds having an emission peak at 440 nm to 520 nm.

Furthermore, an organometallic iridium complex having a pyrimidine skeleton, such as tris(4-methyl-6-phenylpyrimidinato)iridium(III) (abbreviation: [Ir(mppm)₃]), tris(4-t-butyl-6-phenylpyrimidinato)iridium(III) (abbreviation: [Ir(t-Buppm)₃]), (acetylacetonato)bis(6-methyl-4-phenylpyrimidinato)iridium(III) (abbreviation: [Ir(mppm)₂(acac)]), (acetylacetonato)bis(6-tert-butyl-4-phenylpyrimidinato)iridium(III) (abbreviation: [Ir(tBuppm)₂ (acac)]), (acetylacetonato)bis[6-(2-norbornyl)-4-phenylpyrimidinato]iridium(III) (abbreviation: [Ir(nbppm)₂(acac)]), (acetylacetonato)bis[5-methyl-6-(2-methylphenyl)-4-phenylpyrimidinato]iridium(III) (abbreviation: [Ir(mpmppm)₂(acac)]), or (acetylacetonato)bis(4,6-diphenylpyrimidinato)iridium(III) (abbreviation: [Ir(dppm)₂(acac)]), an organometallic iridium complex having a pyrazine skeleton, such as (acetylacetonato)bis(3,5-dimethyl-2-phenylpyrazinato)iridium(III) (abbreviation: [Ir(mppr-Me)₂(acac)]) or (acetylacetonato)bis(5-isopropyl-3-methyl-2-phenylpyrazinato)iridium(III) (abbreviation: [Ir(mppr-iPr)₂(acac)]), an organometallic iridium complex having a pyridine skeleton, such as tris(2-phenylpyridinato-N,C2')iridium(III) (abbreviation: [Ir(ppy)₃]), bis(2-phenylpyridinato-N,C2')iridium(III) acetylacetonate (abbreviation: [Ir(ppy)₂(acac)]), bis(benzo[h]quinolinato)iridium(III) acetylacetonate (abbreviation: [Ir(bzq)₂(acac)]), tris(benzo[h]quinolinato)iridium(III) (abbreviation: [Ir(bzq)₃]), tris(2-phenylquinolinato-N,C2')iridium(III) (abbreviation: [Ir(pq)₃]), or bis(2-phenylquinolinato-N,C2')iridium(III) acetylacetonate (abbreviation: [Ir(pq)₂(acac)]), and a rare earth metal complex such as tris(acetylacetonato)(monophenanthroline)terbium(III) (abbreviation: [Tb(acac)₃(Phen)]) can be given. These are mainly compounds exhibiting green phosphorescence, and have an emission peak at 500 nm to 600 nm. Note that an organometallic iridium complex having a pyrimidine skeleton is particularly preferable because of its distinctively high reliability and emission efficiency.

Furthermore, an organometallic iridium complex having a pyrimidine skeleton, such as (diisobutyrylmethanato)bis[4,6-bis(3-methylphenyl)pyrimidinato]iridium(III) (abbreviation: [Ir(5mdppm)₂(dibm)]), bis[4,6-bis(3-methylphenyl)pyrimidinato](dipivaloylmethanato)iridium(III) (abbreviation: [Ir(5mdppm)₂(dpm)]), or bis[4,6-di(naphthalen-1-yl)pyrimidinato] (dipivaloylmethanato)iridium(III) (abbreviation: [Ir(dlnpm)₂(dpm)]), an organometallic iridium complex having a pyrazine skeleton, such as (acetylacetonato)bis(2,3,5-triphenylpyrazinato)iridium(III) (abbreviation: [Ir(tppr)₂(acac)]), bis(2,3,5-triphenylpyrazinato)(dipivaloylmethanato)iridium(III) (abbreviation: [Ir(tppr)₂(dpm)]), or (acetylacetonato)bis[2,3-bis(4-fluorophenyl)quinoxalinato]iridium(III) (abbreviation: [Ir(Fdpq)₂(acac)]), an organometallic iridium complex having a pyridine skeleton, such as tris(1-phenylisoquinolinato-N,C2')iridium(III) (abbreviation: [Ir(piq)₃]) or bis(1-phenylisoquinolinato-N,C2')iridium(III) acetylacetonate (abbreviation: [Ir(piq)₂(acac)]), a platinum complex such as 2,3,7,8,12,13,17,18-octaethyl-21H,23H-porphyrin platinum(II) (abbreviation: PtOEP), and a rare earth metal complex such as tris(1,3-diphenyl-1,3-propanedionato) (monophenanthroline)europium(III) (abbreviation: [Eu(DBM)₃(Phen)]) or tris[1-(2-thenoyl)-3,3,3-trifluoroacetonato] (monophenanthroline)europium(III) (abbreviation: [Eu(TTA)₃(Phen)]) can be given. These are compounds exhibiting red phosphorescence, and have an emission peak at 600 nm to 700 nm. Furthermore, the organometallic iridium complexes including a pyrazine skeleton can emit red light with favorable chromaticity.

Besides the above-described phosphorescent compounds, other known phosphorescent materials may be selected and used.

As the TADF material, a fullerene, a derivative thereof, an acridine, a derivative thereof, an eosin derivative, or the like can be used. Other examples include a metal-containing porphyrin containing magnesium (Mg), zinc (Zn), cadmium (Cd), tin (Sn), platinum (Pt), indium (In), palladium (Pd), or the like. Examples of the metal-containing porphyrin include a protoporphyrin-tin fluoride complex (SnF₂(Proto IX)), a mesoporphyrin-tin fluoride complex (SnF₂(Meso IX)), a hematoporphyrin-tin fluoride complex (SnF₂(Hemato IX)), a coproporphyrin tetramethyl ester-tin fluoride complex (SnF₂(Copro III-4Me)), an octaethylporphyrin-tin fluoride complex (SnF₂(OEP)), an etioporphyrin-tin fluoride complex (SnF₂(Etio I)), and an octaethylporphyrin-platinum chloride complex (PtCl₂(OEP)), which are expressed by the following structural formulae.

[Chemical Formula 1]

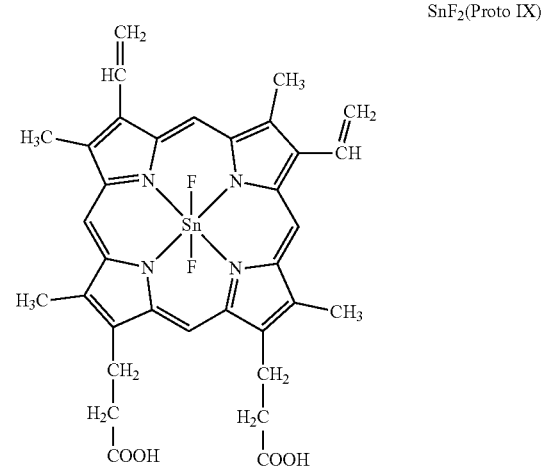

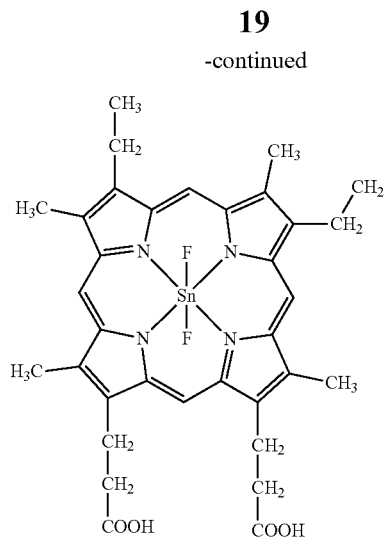
SnF₂(Meso IX)

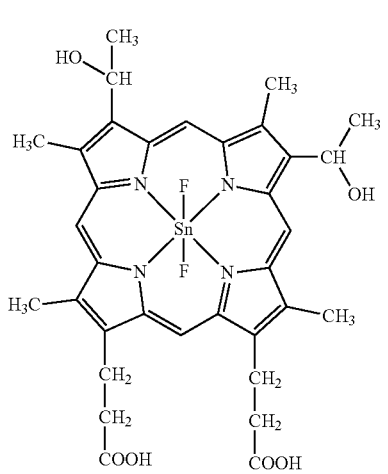
SnF₂(Hemato IX)

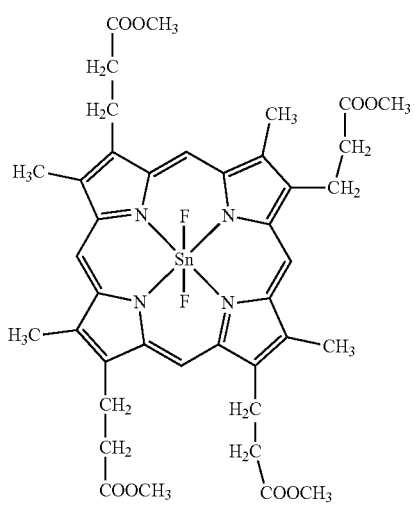
SnF₂(Copro III-4Me)

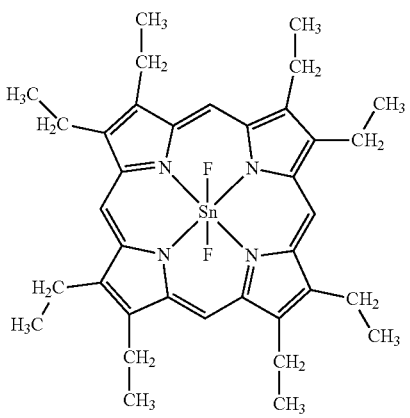
SnF₂(OEP)

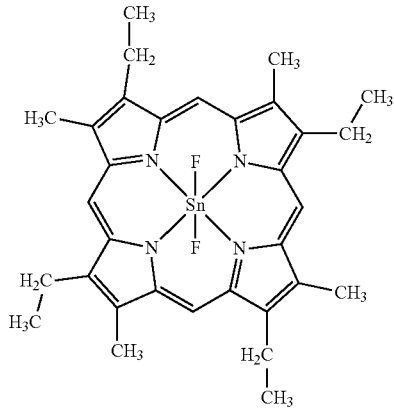
SnF₂(Etio 1)

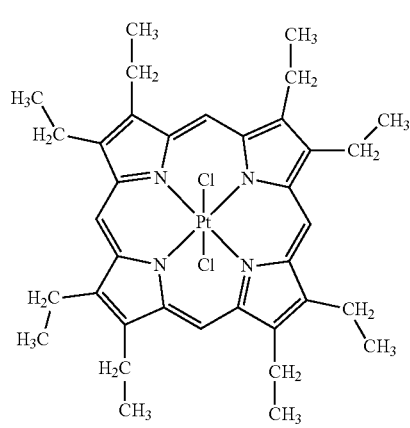
PtCl₂OEP

Alternatively, a heterocyclic compound having both of a π-electron rich heteroaromatic ring and a π-electron deficient heteroaromatic ring that is expressed by the following structural formulae, such as 2-(biphenyl-4-yl)-4,6-bis(12-phenylindolo[2,3-a]carbazol-11-yl)-1,3,5-triazine (abbreviation: PIC-TRZ), 9-(4,6-diphenyl-1,3,5-triazin-2-yl)-9'-phenyl-9H,9'H-3,3'-bicarbazole (abbreviation: PCCzTzn), 9-[4-(4,6-diphenyl-1,3,5-triazin-2-yl)phenyl]-9'-phenyl-9H, 9'H-3,3'-bicarbazole (abbreviation: PCCzPTzn), 2-[4-(10H-phenoxazine-10-yl)phenyl]-4,6-diphenyl-1,3,5-triazine (abbreviation: PXZ-TRZ), 3-[4-(5-phenyl-5,10-dihydrophenazin-10-yl)phenyl]-4,5-diphenyl-1,2,4-triazole (abbreviation: PPZ-3TPT), 3-(9,9-dimethyl-9H-acridin-10-yl)-9H-xanthen-9-one (abbreviation: ACRXTN), bis[4-(9,9-dimethyl-9,10-dihydroacridine)phenyl]sulfone (abbreviation: DMAC-DPS), or 10-phenyl-10H,10'H-spiro[acridin-9,9'-anthracen]-10'-one (abbreviation: ACRSA) can be used. The heterocyclic compound is preferable because of having both a high electron-transport property and a high hole-transport property owing to a π-electron rich heteroaromatic ring and a π-electron deficient heteroaromatic ring. Note that a substance in which the π-electron rich heteroaromatic ring and the π-electron deficient heteroaromatic ring are directly bonded to each other is particularly preferable because the donor property of the π-electron rich heteroaromatic ring and the acceptor property of the π-electron deficient heteroaromatic ring are both increased and the energy difference between the S1 level and the T1 level becomes small, so that thermally activated delayed fluorescence can be obtained with high efficiency. Note that an aromatic ring to which an electron-withdrawing group such as a cyano group is bonded may be used instead of the π-electron deficient heteroaromatic ring.

[Chemical Formula 2]

PIC-TRZ

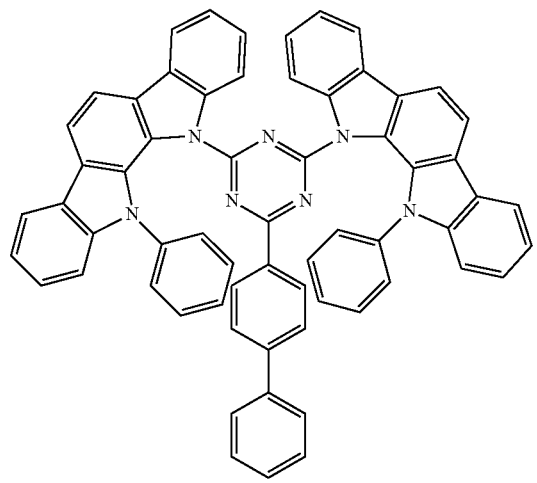

PCCzPTzn

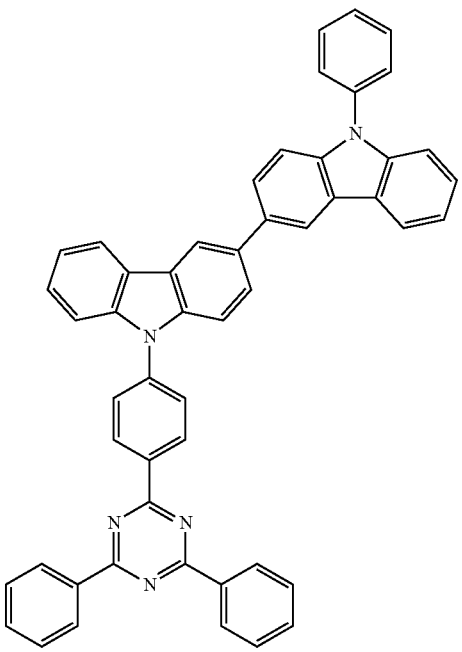

PCCzTzn

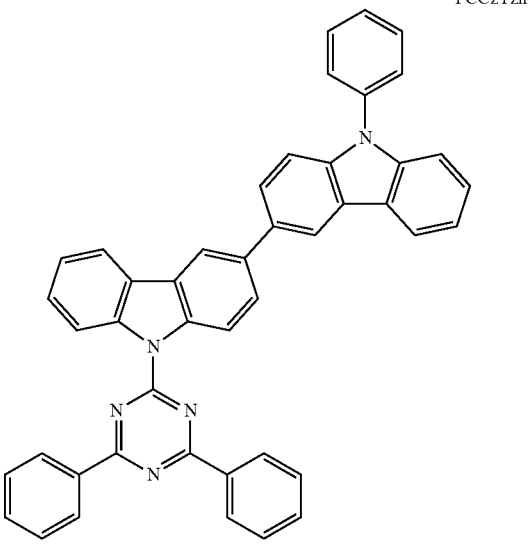

PXZ-TRZ

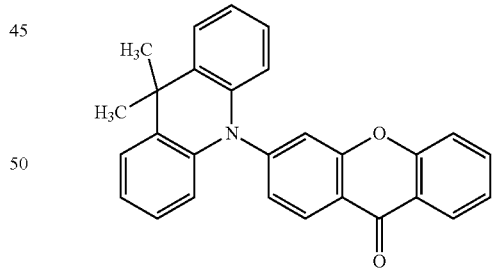

ACRXTN

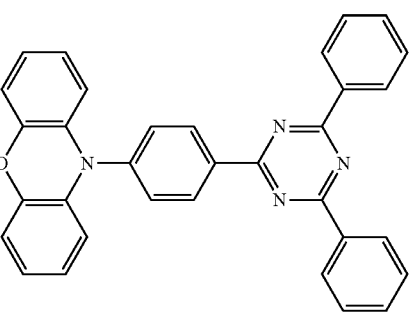

PPZ-3TPT

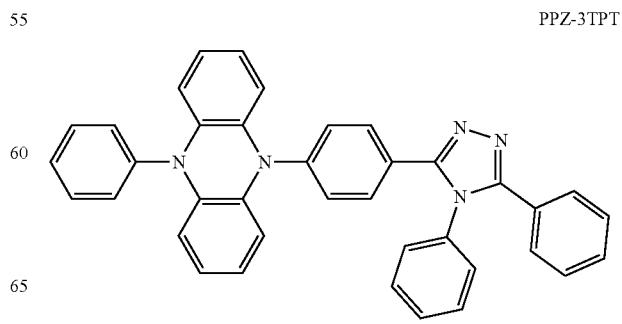

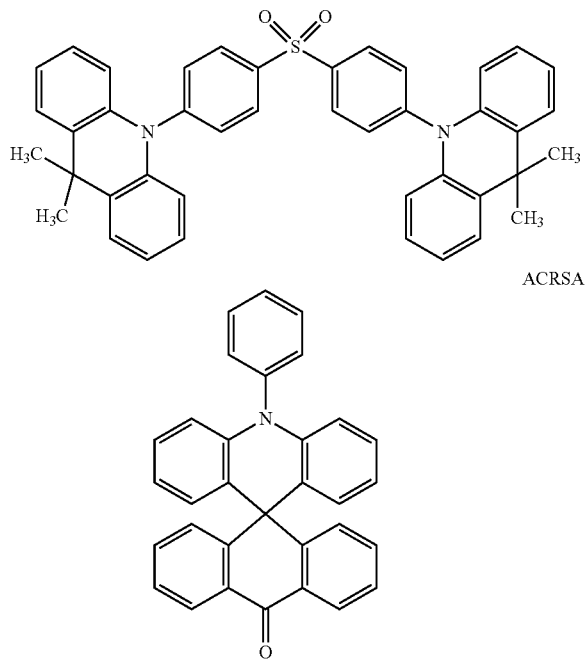

DMAC-DPS

ACRSA

As the host material in the light-emitting layer, a variety of carrier-transport materials such as a material having an electron-transport property and a material having a hole-transport property can be used.

As the material having a hole-transport property, the substance given as the material having a hole-transport property which is contained in the hole-transport layer 112 can be favorably used.

As the material having an electron-transport property, for example, a metal complex such as bis(10-hydroxybenzo[h]quinolinato)beryllium(II) (abbreviation: BeBq$_2$), bis(2-methyl-8-quinolinolato)(4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), or bis[2-(2-benzothiazolyl)phenolato]zinc(II) (abbreviation: ZnBTZ), a heterocyclic compound having a polyazole skeleton, such as 2-(4-biphenylyl)-5-(4-tert-butylphenyl)-1,3,4-oxadiazole (abbreviation: PBD), 3-(4-biphenylyl)-4-phenyl-5-(4-tert-butylphenyl)-1,2,4-triazole (abbreviation: TAZ), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]-9H-carbazole (abbreviation: CO11), 2,2',2"-(1,3,5-benzenetriyl)tris(1-phenyl-1H-benzimidazole) (abbreviation: TPBI), or 2-[3-(dibenzothiophen-4-yl)phenyl]-1-phenyl-1H-benzimidazole (abbreviation: mDBTBIm-II), a heterocyclic compound having a diazine skeleton, such as 2-[3-(dibenzothiophen-4-yl)phenyl]dibenzo[f,h]quinoxaline (abbreviation: 2mDBTPDBq-II), 2-[3'-(dibenzothiophen-4-yl)biphenyl-3-yl]dibenzo[f,h]quinoxaline (abbreviation: 2mDBTBPDBq-II), 2-[3'-(9H-carbazol-9-yl)biphenyl-3-yl]dibenzo[f,h]quinoxaline (abbreviation: 2mCzBPDBq), 4,6-bis[3-(phenanthren-9-yl)phenyl]pyrimidine (abbreviation: 4,6mPnP2Pm), or 4,6-bis[3-(4-dibenzothienyl)phenyl]pyrimidine (abbreviation: 4,6mDBTP2Pm-II), and a heterocyclic compound having a pyridine skeleton, such as 3,5-bis[3-(9H-carbazol-9-yl)phenyl]pyridine (abbreviation: 35DCzPPy) or 1,3,5-tri[3-(3-pyridyl)-phenyl]benzene (abbreviation: TmPyPB) can be given. Among the above, the heterocyclic compound having a diazine skeleton and the heterocyclic compound having a pyridine skeleton have favorable reliability and thus are preferable. In particular, the heterocyclic compound having a diazine (pyrimidine or pyrazine) skeleton has a high electron-transport property and contributes to a reduction in driving voltage.

In the case where a fluorescent substance is used as the light-emitting material, a material having an anthracene skeleton is suitable for the host material. The use of a substance having an anthracene skeleton as a host material for a fluorescent substance makes it possible to achieve a light-emitting layer with favorable emission efficiency and durability. Most of materials having an anthracene skeleton have a deep HOMO level; therefore, such a material can be preferably used in one embodiment of the present invention. As the substance having an anthracene skeleton that is used as the host material, a substance having a diphenylanthracene skeleton, in particular, a substance having a 9,10-diphenylanthracene skeleton, is preferable because of its chemical stability. The host material preferably has a carbazole skeleton because the hole-injection and hole-transport properties are improved; further preferably, the host material has a benzocarbazole skeleton in which a benzene ring is further condensed to carbazole because the HOMO level thereof is shallower than that of carbazole by approximately 0.1 eV and thus holes enter the host material easily. In particular, the host material having a dibenzocarbazole skeleton is preferable because its HOMO level is shallower than that of carbazole by approximately 0.1 eV so that holes enter the host material easily, the hole-transport property is improved, and the heat resistance is increased. Accordingly, a substance that has both a 9,10-diphenylanthracene skeleton and a carbazole skeleton (or a benzocarbazole skeleton or a dibenzocarbazole skeleton) is further preferable as the host material. Note that in terms of the hole-injection and hole-transport properties described above, instead of a carbazole skeleton, a benzofluorene skeleton or a dibenzofluorene skeleton may be used. Examples of such a substance include 9-phenyl-3-[4-(10-phenyl-9-anthryl)phenyl]-9H-carbazole (abbreviation: PCzPA), 3-[4-(1-naphthyl)-phenyl]-9-phenyl-9H-carbazole (abbreviation: PCPN), 9-[4-(10-phenyl-9-anthracenyl)phenyl]-9H-carbazole (abbreviation: CzPA), 7-[4-(10-phenyl-9-anthryl)phenyl]-7H-dibenzo[c,g]carbazole (abbreviation: cgDBCzPA), 6-[3-(9,10-diphenyl-2-anthryl)phenyl]-benzo[b]naphtho[1,2-d]furan (abbreviation: 2mBnfPPA), and 9-phenyl-10-{4-(9-phenyl-9H-fluoren-9-yl)biphenyl-4'-yl}anthracene (abbreviation: FLPPA). In particular, CzPA, cgDBCzPA, 2mBnfPPA, and PCzPA are preferably selected because they exhibit favorable characteristics.

Note that a host material may be a material of a mixture of a plurality of kinds of substances; in the case of using a mixed host material, it is preferable to mix a material having an electron-transport property with a material having a hole-transport property. When the material having an electron-transport property is mixed with the material having a hole-transport property, the transport property of the light-emitting layer 113 can be easily adjusted and a recombination region can be easily controlled. The ratio of the content of the material having a hole-transport property to the content of the material having an electron-transport property may be the material having a hole-transport property: the material having an electron-transport property=1:9 to 9:1.

An exciplex may be formed by these mixed materials. A combination is preferably selected so as to form an exciplex that exhibits light emission overlapping with the wavelength of a lowest-energy-side absorption band of a light-emitting material, because energy can be transferred smoothly and light emission can be efficiently obtained. The use of the structure is preferable because the driving voltage is also be reduced.

It is particularly suitable for a blue light emitting device in one embodiment of the present invention.

The electron-transport layer 114 is a layer containing a substance having an electron-transport property. As the substance having an electron-transport property, it is possible to use any of the above-listed substances having electron-transport properties that can be used as the host material.

As the electron-injection layer 115, a layer containing an alkali metal, an alkaline earth metal, or a compound thereof, such as lithium fluoride (LiF), cesium fluoride (CsF), or calcium fluoride ($CaF_2$), may be provided between the electron-transport layer 114 and the second electrode 102. For example, an electride or a layer that is formed using a substance having an electron-transport property and that includes an alkali metal, an alkaline earth metal, or a compound thereof can be used as the electron-injection layer 115. Examples of the electride include a substance in which electrons are added at high concentration to a mixed oxide of calcium and aluminum.

Note that as the electron-injection layer 115, it is possible to use a layer that contains a substance having an electron-transport property (preferably an organic compound having a bipyridine skeleton) and contains a fluoride of the alkali metal or the alkaline earth metal at a concentration higher than that at which the electron-injection layer 115 becomes in a microcrystalline state (50 wt % or higher). Since the layer has a low refractive index, a light-emitting device including the layer can have high external quantum efficiency.

Instead of the electron-injection layer 115, a charge-generation layer 116 may be provided (FIG. 4(B)). The charge-generation layer 116 refers to a layer capable of injecting holes into a layer in contact therewith on the cathode side and injecting electrons into a layer in contact therewith on the anode side when supplied with a potential. The charge-generation layer 116 includes at least a P-type layer 117. The P-type layer 117 is preferably formed using the composite materials given above as the material that can form the hole-injection layer 111. The P-type layer 117 may be formed by stacking a film containing the above acceptor material as a material included in the composite material and a film containing the above hole-transport material. When a potential is applied to the P-type layer 117, electrons are injected into the electron-transport layer 114 and holes are injected into the second electrode 102 that is a cathode; thus, the light-emitting device operates. Since the organic compound of one embodiment of the present invention has a low refractive index, using the organic compound for the P-type layer 117 enables the light-emitting device to have high external quantum efficiency.

Note that one or both of an electron-relay layer 118 and an electron-injection buffer layer 119 are preferably provided in the charge-generation layer 116 in addition to the P-type layer 117.

The electron-relay layer 118 contains at least a substance having an electron-transport property and has a function of preventing an interaction between the electron-injection buffer layer 119 and the P-type layer 117 to transfer electrons smoothly. The LUMO level of the substance having an electron-transport property contained in the electron-relay layer 118 is preferably between the LUMO level of an acceptor substance in the P-type layer 117 and the LUMO level of a substance contained in a layer of the electron-transport layer 114 in contact with the charge-generation layer 116. A specific energy level of the LUMO level of the substance having an electron-transport property used for the electron-relay layer 118 may be higher than or equal to −5.0 eV, preferably higher than or equal to −5.0 eV and lower than or equal to −3.0 eV. Note that as the substance having an electron-transport property used for the electron-relay layer 118, a phthalocyanine-based material or a metal complex having a metal-oxygen bond and an aromatic ligand is preferably used.

For the electron-injection buffer layer 119, a substance having a high electron-injection property, such as an alkali metal, an alkaline earth metal, a rare earth metal, or a compound thereof (an alkali metal compound (including an oxide such as lithium oxide, a halide, and a carbonate such as lithium carbonate or cesium carbonate), an alkaline earth metal compound (including an oxide, a halide, and a carbonate), or a rare earth metal compound (including an oxide, a halide, and a carbonate)), can be used.

In the case where the electron-injection buffer layer 119 is formed so as to contain the substance having an electron-transport property and a donor substance, an organic compound such as tetrathianaphthacene (abbreviation: TTN), nickelocene, or decamethylnickelocene can be used as the donor substance, as well as an alkali metal, an alkaline earth metal, a rare earth metal, a compound thereof (an alkali metal compound (including an oxide such as lithium oxide, a halide, and a carbonate such as lithium carbonate or cesium carbonate), an alkaline earth metal compound (including an oxide, a halide, and a carbonate), or a rare earth metal compound (including an oxide, a halide, and a carbonate)). Note that as the substance having an electron-transport property, a material similar to the above-described material forming the electron-transport layer 114 can be used for the formation.

As a substance forming the second electrode 102, a metal, an alloy, an electrically conductive compound, or a mixture thereof having a low work function (specifically, 3.8 eV or less) or the like can be used. As specific examples of such a cathode material, elements belonging to Group 1 or Group 2 of the periodic table, such as alkali metals, e.g., lithium (Li) and cesium (Cs), magnesium (Mg), calcium (Ca), and strontium (Sr), alloys containing these (MgAg and AlLi), rare earth metals such as europium (Eu) and ytterbium (Yb), alloys containing these rare earth metals, and the like can be given. However, when the electron-injection layer is provided between the second electrode 102 and the electron-transport layer, as the second electrode 102, a variety of conductive materials such as Al, Ag, ITO, or indium oxide-tin oxide containing silicon or silicon oxide can be used regardless of their work functions. Films of these conductive materials can be formed by a dry process such as a vacuum evaporation method or a sputtering method, an inkjet method, a spin coating method, or the like. Alternatively, the films may be formed by a wet process using a sol-gel method or a wet process using a paste of a metal material.

Various methods can be used as a method for forming the EL layer 103 regardless of whether it is a dry process or a wet process. For example, a vacuum evaporation method, a gravure printing method, an offset printing method, a screen printing method, an ink-jet method, a spin coating method, or the like may be used.

Different deposition methods may be used to form the electrodes or the layers described above.

The structure of the layers provided between the first electrode 101 and the second electrode 102 is not limited to the above-described structure. However, a structure is preferable in which a light-emitting region where holes and electrons recombine is provided at a position away from the first electrode 101 and the second electrode 102 so as to prevent quenching caused by the proximity of the light-emitting region and a metal used for electrodes and carrier-injection layers.

Furthermore, in order to inhibit energy transfer from an exciton generated in the light-emitting layer, it is preferable to form the hole-transport layer and the electron-transport layer that are in contact with the light-emitting layer 113, particularly a carrier-transport layer closer to the recombination region in the light-emitting layer 113, using the light-emitting material of the light-emitting layer or a substance having a wider band gap than the light-emitting material included in the light-emitting layer.

Embodiment 2

In this embodiment, a light-emitting apparatus using the light-emitting device described in Embodiment 1 will be described.

In this embodiment, a light-emitting apparatus fabricated using the light-emitting device described in Embodiment 1 will be described with reference to FIG. 5. Note that FIG. 5(A) is a top view illustrating the light-emitting apparatus and FIG. 5(B) is a cross-sectional view taken along A-B and C-D in FIG. 5(A). This light-emitting apparatus includes a driver circuit portion (source line driver circuit) 601, a pixel portion 602, and a driver circuit portion (gate line driver circuit) 603, which are for controlling light emission of a light-emitting device and are illustrated with dotted lines. Furthermore, 604 denotes a sealing substrate, 605 denotes a sealant, and the inside surrounded by the sealant 605 is a space 607.

Note that a lead wiring 608 is a wiring for transmitting signals to be input to the source line driver circuit portion 601 and the gate line driver circuit 603 and receiving a video signal, a clock signal, a start signal, a reset signal, and the like from an FPC (flexible printed circuit) 609 serving as an external input terminal. Although only the FPC is illustrated here, a printed wiring board (PWB) may be attached to this FPC. The light-emitting apparatus in this specification includes not only the light-emitting apparatus itself but also the apparatus provided with the FPC or the PWB.

Next, a cross-sectional structure is described with reference to FIG. 5(B). The driver circuit portion and the pixel portion are formed over an element substrate 610. Here, the source line driver circuit portion 601, which is the driver circuit portion, and one pixel of the pixel portion 602 are illustrated.

The element substrate 610 may be fabricated using a substrate containing glass, quartz, an organic resin, a metal, an alloy, a semiconductor, or the like, or a plastic substrate formed of FRP (Fiber Reinforced Plastic), PVF (polyvinyl fluoride), polyester, an acrylic resin, or the like.

The structure of transistors used in pixels and driver circuits is not particularly limited. For example, an inverted staggered transistor or a staggered transistor may be used. Furthermore, top-gate transistors or bottom-gate transistors may be used. A semiconductor material used for the transistors is not particularly limited, and for example, silicon, germanium, silicon carbide, gallium nitride, or the like can be used. Alternatively, an oxide semiconductor containing at least one of indium, gallium, and zinc, such as In—Ga—Zn-based metal oxide, may be used.

There is no particular limitation on the crystallinity of a semiconductor material used for the transistor, and an amorphous semiconductor or a semiconductor having crystallinity (a microcrystalline semiconductor, a polycrystalline semiconductor, a single crystal semiconductor, or a semiconductor partly including crystal regions) can be used. A semiconductor having crystallinity is preferably used, in which case deterioration of the transistor characteristics can be suppressed.

Here, an oxide semiconductor is preferably used for semiconductor devices such as the transistors provided in the pixels and driver circuits and transistors used for touch sensors described later, and the like. In particular, an oxide semiconductor having a wider band gap than silicon is preferably used. The use of an oxide semiconductor material having a wider band gap than silicon can reduce the off-state current of the transistors.

The oxide semiconductor preferably contains at least indium (In) or zinc (Zn). Further preferably, the oxide semiconductor contains an oxide represented by an In-M-Zn-based oxide (M represents a metal such as Al, Ti, Ga, Ge, Y, Zr, Sn, La, Ce, or Hf).

As a semiconductor layer, it is particularly preferable to use an oxide semiconductor film including a plurality of crystal parts whose c-axes are aligned perpendicular to a surface on which the semiconductor layer is formed or the top surface of the semiconductor layer and in which the adjacent crystal parts have no grain boundary.

The use of such a material as the semiconductor layer makes it possible to achieve a highly reliable transistor in which a change in the electrical characteristics is reduced.

Charge accumulated in a capacitor through a transistor including the above-described semiconductor layer can be retained for a long time because of the low off-state current of the transistor. The use of such a transistor in pixels allows a driver circuit to stop while the gray level of an image displayed on each display region is maintained. As a result, an electronic device with significantly reduced power consumption can be achieved.

For stable characteristics of the transistor or the like, a base film is preferably provided. The base film can be formed to be a single-layer or a stacked-layer using an inorganic insulating film such as a silicon oxide film, a silicon nitride film, a silicon oxynitride film, or a silicon nitride oxide film. The base film can be formed by a sputtering method, a CVD (Chemical Vapor Deposition) method (e.g., a plasma CVD method, a thermal CVD method, or an MOCVD (Metal Organic CVD) method), an ALD (Atomic Layer Deposition) method, a coating method, a printing method, or the like. Note that the base film is not necessarily provided when not needed.

Note that an FET 623 is illustrated as a transistor formed in the driver circuit portion 601. The driver circuit can be formed using various circuits such as a CMOS circuit, a PMOS circuit, and an NMOS circuit. Although a driver-integrated type in which the driver circuit is formed over the substrate is described in this embodiment, the driver circuit is not necessarily formed over the substrate and can be formed outside.

The pixel portion 602 is formed with a plurality of pixels including a switching FET 611, a current control FET 612, and a first electrode 613 electrically connected to a drain of the current control FET 612; however, without being limited thereto, a pixel portion in which three or more FETs and a capacitor are combined may be employed.

Note that an insulator 614 is formed to cover an end portion of the first electrode 613. The insulator 614 can be formed using a positive photosensitive acrylic resin film here.

In order to improve the coverage with an EL layer or the like to be formed later, the insulator 614 is formed so as to have a curved surface with curvature at its upper end portion or lower end portion. For example, in the case where a positive photosensitive acrylic resin is used as a material for the insulator 614, only the upper end portion of the insulator 614 preferably has a curved surface with a curvature radius (0.2 μm to 3 μm). As the insulator 614, either a negative photosensitive resin or a positive photosensitive resin can be used.

An EL layer 616 and a second electrode 617 are formed over the first electrode 613. Here, as a material used for the first electrode 613 functioning as an anode, a material with a high work function is desirably used. For example, a single-layer film of an ITO film, an indium tin oxide film containing silicon, an indium oxide film containing zinc oxide at 2 wt % to 20 wt %, a titanium nitride film, a chromium film, a tungsten film, a Zn film, a Pt film, or the like, a stacked layer of titanium nitride film and a film containing aluminum as its main component, a three-layer structure of a titanium nitride film, a film containing aluminum as its main component, and a titanium nitride film, or the like can be used. Note that the stacked-layer structure achieves low wiring resistance, a favorable ohmic contact, and a function as an anode.

The EL layer 616 is formed by any of a variety of methods such as an evaporation method using an evaporation mask, an inkjet method, and a spin coating method. The EL layer 616 has the structure described in Embodiment 1. Alternatively, a material included in the EL layer 616 may be a low molecular compound or a high molecular compound (including an oligomer or a dendrimer).

As a material used for the second electrode 617, which is formed over the EL layer 616 and functions as a cathode, a material with a low work function (e.g., Al, Mg, Li, Ca, or an alloy or a compound thereof (e.g., MgAg, MgIn, or AlLi)) is preferably used. Note that in the case where light generated in the EL layer 616 passes through the second electrode 617, it is preferable to use, for the second electrode 617, a stacked layer of a thin metal film and a transparent conductive film (e.g., ITO, indium oxide containing zinc oxide at 2 wt % to 20 wt %, indium tin oxide containing silicon, or zinc oxide (ZnO)).

Note that a light-emitting device is formed with the first electrode 613, the EL layer 616, and the second electrode 617. The light-emitting device is the light-emitting device described in Embodiment 1. A plurality of light-emitting devices are formed in the pixel portion, and the light-emitting apparatus of this embodiment may include both the light-emitting device described in Embodiment 1 and a light-emitting device having a different structure.

The sealing substrate 604 and the element substrate 610 are attached to each other using the sealant 605, so that a structure in which the light-emitting device 618 is provided in the space 607 surrounded by the element substrate 610, the sealing substrate 604, and the sealant 605 is employed. The space 607 is filled with a filler; it is filled with an inert gas (e.g., nitrogen or argon) in some cases, and filled with the sealant in some cases. The structure of the sealing substrate in which a recessed portion is formed and a desiccant is provided is preferable because deterioration due to the influence of moisture can be inhibited.

Note that an epoxy-based resin or glass frit is preferably used for the sealant 605. Furthermore, these materials are preferably materials that transmit as little moisture or oxygen as possible. As a material used for the sealing substrate 604, in addition to a glass substrate and a quartz substrate, a plastic substrate formed of FRP (Fiber Reinforced Plastics), PVF (polyvinyl fluoride), polyester, an acrylic resin, or the like can be used.

Although not illustrated in FIG. 5, a protective film may be provided over the second electrode. The protective film may be formed using an organic resin film or an inorganic insulating film. The protective film may be formed so as to cover an exposed portion of the sealant 605. The protective film may be provided so as to cover surfaces and side surfaces of the pair of substrates and exposed side surfaces of a sealing layer, an insulating layer, and the like.

For the protective film, a material that is less likely to transmit an impurity such as water. Thus, diffusion of an impurity such as water from the outside into the inside can be effectively inhibited.

As a material included in the protective film, an oxide, a nitride, a fluoride, a sulfide, a ternary compound, a metal, a polymer, or the like can be used; for example, it is possible to use a material containing aluminum oxide, hafnium oxide, hafnium silicate, lanthanum oxide, silicon oxide, strontium titanate, tantalum oxide, titanium oxide, zinc oxide, niobium oxide, zirconium oxide, tin oxide, yttrium oxide, cerium oxide, scandium oxide, erbium oxide, vanadium oxide, indium oxide; a material containing aluminum nitride, hafnium nitride, silicon nitride, tantalum nitride, titanium nitride, niobium nitride, molybdenum nitride, zirconium nitride, gallium nitride; a material containing a nitride containing titanium and aluminum, an oxide containing titanium and aluminum, an oxide containing aluminum and zinc, a sulfide containing manganese and zinc, a sulfide containing cerium and strontium, an oxide containing erbium and aluminum, an oxide containing yttrium and zirconium, or the like.

The protective film is preferably formed using a deposition method that enables favorable step coverage. One such method is an atomic layer deposition (ALD) method. A material that can be formed by an ALD method is preferably used for the protective film. With use of an ALD method, a dense protective film with reduced defects such as cracks and pinholes or with a uniform thickness can be formed. Furthermore, damage caused to a process member in forming the protective film can be reduced.

By an ALD method, a uniform protective film with few defects can be formed even on a surface with a complex uneven shape or upper, side, and lower surfaces of a touch panel.

As described above, the light-emitting apparatus fabricated using the light-emitting device described in Embodiment 1 can be obtained.

For the light-emitting apparatus in this embodiment, the light-emitting device described in Embodiment 1 is used and thus a light-emitting apparatus having favorable characteristics can be obtained. Specifically, since the light-emitting device described in Embodiment 1 has high emission efficiency, the light-emitting apparatus can achieve low power consumption.

This embodiment can be freely combined with any of the other embodiments.

Embodiment 3

Figure 6A:
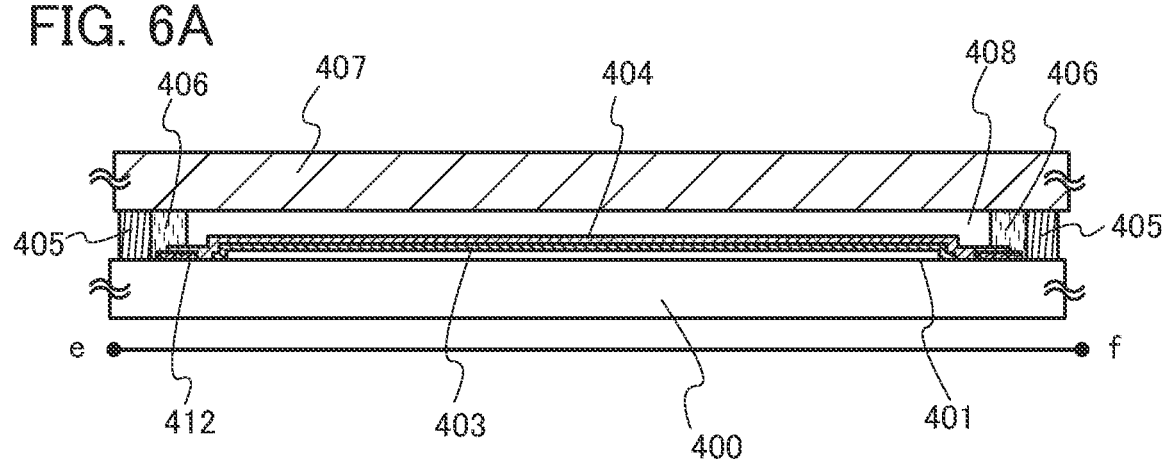
FIGS. 6(A) and 6(B) are diagrams illustrating a lighting device.
Figure 6B:
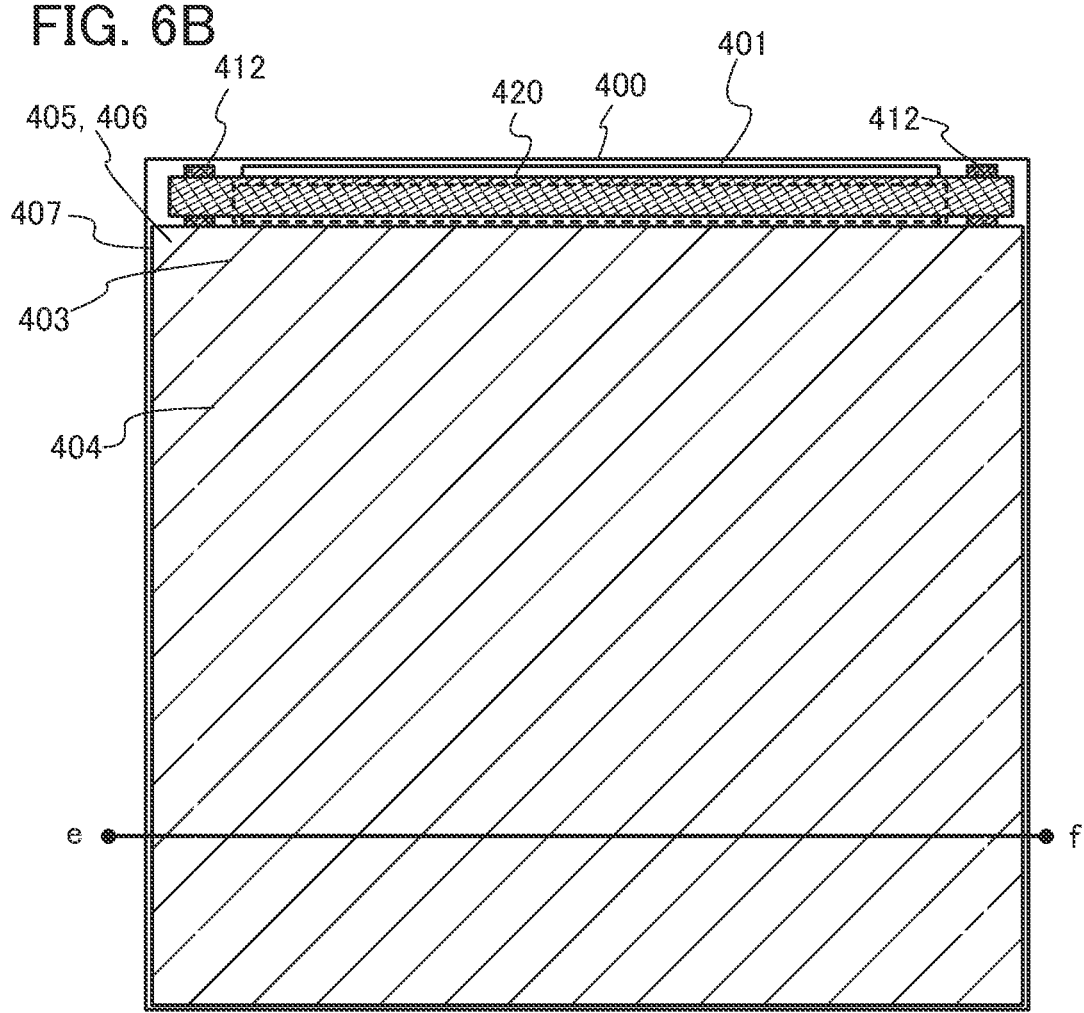

In this embodiment, an example in which the light-emitting device described in Embodiment 1 is used for a lighting device will be described with reference to FIG. 6. FIG. 6(B) is a top view of the lighting device, and FIG. 6(A) is a cross-sectional view taken along e-f in FIG. 6(B).

In the lighting device in this embodiment, a first electrode 401 is formed over a substrate 400 which is a support and has a light-transmitting property. The first electrode 401 corresponds to the first electrode 101 in Embodiment 1. In the case where light emission is extracted from the first electrode 401 side, the first electrode 401 is formed with a material having a light-transmitting property.

A pad 412 for supplying a voltage to a second electrode 404 is formed over the substrate 400.

An EL layer 403 is formed over the first electrode 401. The structure of the EL layer 403 corresponds to, for example, the structure of the EL layer 103 in Embodiment 1. Note that for these structures, the corresponding description can be referred to.

The second electrode 404 is formed to cover the EL layer 403. The second electrode 404 corresponds to the second electrode 102 in Embodiment 1. In the case where light-emission is extracted from the first electrode 401 side, the second electrode 404 is formed with a material having high reflectivity. The second electrode 404 is supplied with a voltage when connected to the pad 412.

As described above, the lighting device described in this embodiment includes a light-emitting device including the first electrode 401, the EL layer 403, and the second electrode 404. Since the light-emitting device is a light-emitting device with high emission efficiency, the lighting device in this embodiment can be a lighting device with low power consumption.

The substrate 400 over which the light-emitting device having the above structure is formed is fixed to a sealing substrate 407 with sealants 405 and 406 and sealing is performed, whereby the lighting device is completed. It is possible to use only either the sealant 405 or 406. In addition, the inner sealant 406 (not illustrated in FIG. 6(B)) can be mixed with a desiccant, which enables moisture to be adsorbed, resulting in improved reliability.

When parts of the pad 412 and the first electrode 401 are provided to extend to the outside of the sealants 405 and 406, those can serve as external input terminals. An IC chip 420 mounted with a converter or the like may be provided over the external input terminals.

As described above, the lighting device described in this embodiment uses the light-emitting device described in Embodiment 1 as an EL element, and thus can be a light-emitting apparatus with low power consumption.

Embodiment 4

In this embodiment, examples of electronic devices each partly including the light-emitting device described in Embodiment 1 are described. The light-emitting device described in Embodiment 1 has high emission efficiency and low power consumption. Thus, the electronic devices described in this embodiment can be electronic devices including light-emitting portions with reduced power consumption.

Examples of electronic devices to which the light-emitting device is applied include a television devices (also referred to as TV or television receivers), monitors for computers and the like, cameras such as digital cameras and digital video cameras, digital photo frames, mobile phones (also referred to as portable telephones or portable telephone devices), portable game machines, portable information terminals, audio playback devices, and large game machines such as pin-ball machines. Specific examples of these electronic devices are shown below.

FIG. 7(A) illustrates an example of a television device. In the television device, a display portion 7103 is incorporated in a housing 7101. Here, a structure in which the housing 7101 is supported by a stand 7105 is shown. Images can be displayed on the display portion 7103, and the light-emitting devices described in Embodiment 1 are arranged in a matrix in the display portion 7103.

The television device can be operated with an operation switch of the housing 7101 or a separate remote controller 7110. With operation keys 7109 of the remote controller 7110, channels and volume can be operated and images displayed on the display portion 7103 can be operated. Furthermore, a structure may be employed in which the remote controller 7110 is provided with a display portion 7107 for displaying data output from the remote controller 7110.

Note that the television device has a structure of including a receiver, a modem, and the like. With use of the receiver, a general television broadcast can be received, and moreover, when the television device is connected to a communication network with or without a wire via the modem, one-way (from a sender to a receiver) or two-way (between a sender and a receiver or between receivers) data communication can be performed.

FIG. 7(B1) is a computer which includes a main body 7201, a housing 7202, a display portion 7203, a keyboard 7204, an external connection port 7205, a pointing device 7206, and the like. Note that this computer is fabricated using the light-emitting devices described in Embodiment 1 arranged in a matrix in the display portion 7203. The computer in FIG. 7(B2) is provided with a second display portion 7210 instead of the keyboard 7204 and the pointing device 7206. The second display portion 7210 is of a touch-panel type, and input can be performed by operating display for input displayed on the second display portion 7210 with a finger or a dedicated pen. The second display portion 7210 can also display images other than the display for input. The display portion 7203 may also be a touch panel. Connecting the two screens with a hinge can prevent troubles such as a crack in or damage to the screens caused when the computer is stored or carried.

FIG. 7(C) illustrates an example of a portable terminal. A mobile phone includes operation buttons 7403, an external connection port 7404, a speaker 7405, a microphone 7406, and the like in addition to a display portion 7402 incorporated in a housing 7401. Note that a mobile phone 7400 includes the display portion 7402 which is fabricated by arranging the light-emitting devices described in Embodiment 1 in a matrix.

The portable terminal illustrated in FIG. 7(C) may have a structure in which information can be input by touching the display portion 7402 with a finger or the like. In this case, operations such as making a call and creating an e-mail can be performed by touching the display portion 7402 with a finger or the like.

The display portion 7402 has mainly three screen modes. The first one is a display mode mainly for displaying images, and the second one is an input mode mainly for inputting data such as text. The third one is a display+input mode in which two modes of the display mode and the input mode are combined.

For example, in the case of making a call or creating an e-mail, a text input mode mainly for inputting text is selected for the display portion 7402 so that an operation of inputting text displayed on the screen may be performed. In this case, it is preferable to display a keyboard or number buttons on almost the entire screen of the display portion 7402.

When a sensing device including a sensor for sensing inclination, such as a gyroscope sensor or an acceleration sensor, is provided inside the portable terminal, screen display of the display portion 7402 can be automatically changed by determining the orientation of the portable terminal (vertically or horizontally).

The screen modes are changed by touching the display portion 7402 or operating the operation buttons 7403 of the housing 7401. Alternatively, the screen modes can be changed depending on the kind of image displayed on the display portion 7402. For example, when a signal of an image displayed on the display portion is moving image data, the screen mode is changed to the display mode, and when the signal is text data, the screen mode is changed to the input mode.

Moreover, in the input mode, when input by the touch operation of the display portion 7402 is not performed for a certain period while a signal sensed by an optical sensor in the display portion 7402 is sensed, the screen mode may be controlled so as to be changed from the input mode to the display mode.

The display portion 7402 can also function as an image sensor. For example, an image of a palm print, a fingerprint, or the like is taken when the display portion 7402 is touched with the palm or the finger, whereby personal authentication can be performed. Furthermore, by using a backlight which emits near-infrared light or a sensing light source which emits near-infrared light in the display portion, an image of a finger vein, a palm vein, or the like can be taken.

Note that the structures described in this embodiment can be combined with the structures described in any of Embodiment 1 to Embodiment 3 as appropriate.

As described above, the application range of the light-emitting apparatus including the light-emitting device described in Embodiment 1 is wide so that this light-emitting apparatus can be applied to electronic devices in a variety of fields. By using the light-emitting device described in Embodiment 1, an electronic device having low power consumption can be obtained.

Figure 8A:
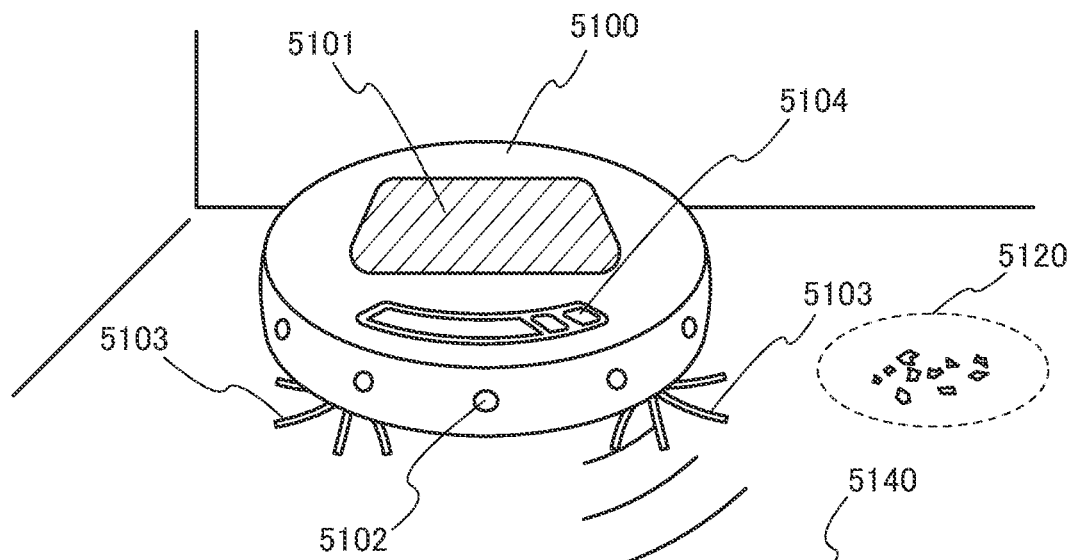
FIGS. 8(A) to 8(C) are diagrams each illustrating a light source device.

FIG. 8(A) is a schematic view illustrating an example of a cleaning robot.

A cleaning robot 5100 includes a display 5101 placed on its top surface, a plurality of cameras 5102 placed on its side surface, a brush 5103, and operation buttons 5104. Although not illustrated, the bottom surface of the cleaning robot 5100 is provided with a tire, an inlet, and the like. Furthermore, the cleaning robot 5100 includes various sensors such as an infrared sensor, an ultrasonic sensor, an acceleration sensor, a piezoelectric sensor, an optical sensor, and a gyroscope sensor. In addition, the cleaning robot 5100 has a wireless communication means.

The cleaning robot 5100 is self-propelled, detects dust 5120, and sucks up the dust through the inlet provided on the bottom surface.

The cleaning robot 5100 can judge whether there is an obstacle such as a wall, furniture, or a step by analyzing images taken by the cameras 5102. When an object that is likely to be caught in the brush 5103, such as a wire, is detected by image analysis, the rotation of the brush 5103 can be stopped.

The display 5101 can display the remaining capacity of a battery, the amount of vacuumed dust, and the like. The display 5101 may display a path on which the cleaning robot 5100 has run. The display 5101 may be a touch panel, and the operation buttons 5104 may be provided on the display 5101.

The cleaning robot 5100 can communicate with a portable electronic device 5140 such as a smartphone. The portable electronic device 5140 can display images taken by the cameras 5102. Accordingly, an owner of the cleaning robot 5100 can monitor the room even from the outside. The display on the display 5101 can be checked by the portable electronic device 5140 such as a smartphone.

The light-emitting apparatus of one embodiment of the present invention can be used for the display 5101.

Figure 8B:
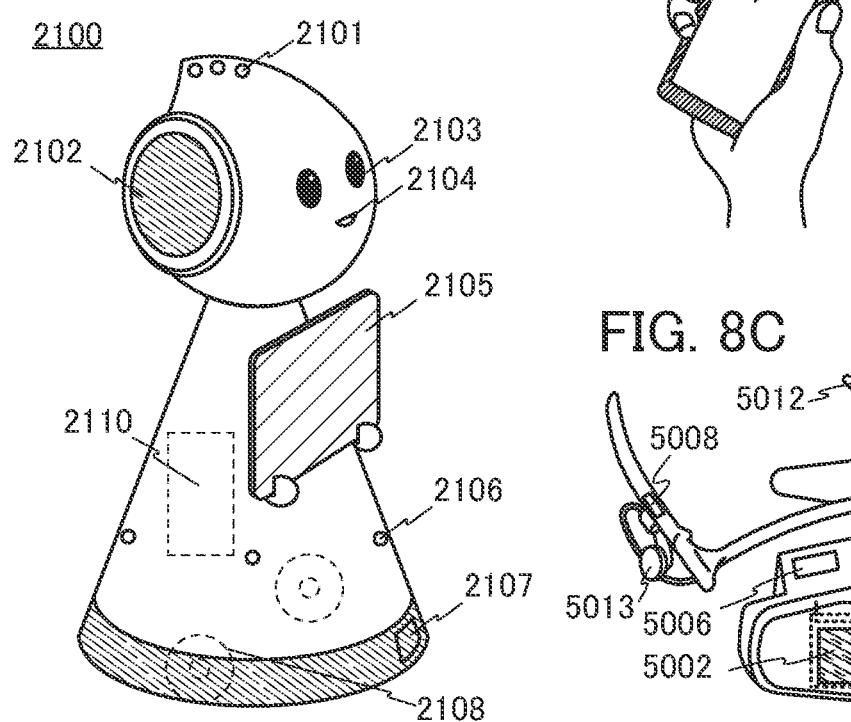

A robot 2100 illustrated in FIG. 8(B) includes an arithmetic device 2110, an illuminance sensor 2101, a microphone 2102, an upper camera 2103, a speaker 2104, a display 2105, a lower camera 2106, an obstacle sensor 2107, and a moving mechanism 2108.

The microphone 2102 has a function of detecting a speaking voice of a user, an environmental sound, and the like. The speaker 2104 also has a function of outputting sound. The robot 2100 can communicate with a user using the microphone 2102 and the speaker 2104.

The display 2105 has a function of displaying various kinds of information. The robot 2100 can display information desired by a user on the display 2105. The display 2105 may be provided with a touch panel. Moreover, the display 2105 may be a detachable information terminal, in which case charging and data communication can be performed when the display 2105 is set at the home position of the robot 2100.

The upper camera 2103 and the lower camera 2106 each have a function of taking an image of the surroundings of the robot 2100. The obstacle sensor 2107 can detect the presence of an obstacle in the direction where the robot 2100 advances with the moving mechanism 2108. The robot 2100 can move safely by recognizing the surroundings with the upper camera 2103, the lower camera 2106, and the obstacle sensor 2107. The light-emitting apparatus of one embodiment of the present invention can be used for the display 2105.

Figure 8C:
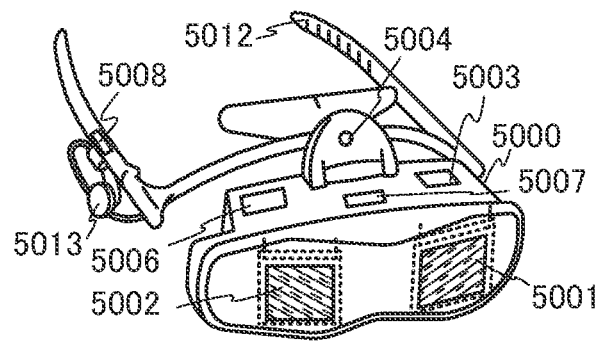

FIG. 8(C) shows an example of a goggle-type display. The goggle-type display includes, for example, a housing 5000, a display portion 5001, a speaker 5003, an LED lamp 5004, an operation keys 5005 (including a power switch or an operation switch), a connection terminal 5006, a sensor 5007 (a sensor having a function of measuring force, displacement, position, speed, acceleration, angular velocity, rotational frequency, distance, light, liquid, magnetism, temperature, chemical substance, sound, time, hardness, electric field, current, voltage, power, radiation, flow rate, humidity, gradient, oscillation, odor, or infrared ray), a microphone 5008, a second display portion 5002, a support 5012, an earphone 5013, and the like.

The light-emitting apparatus of one embodiment of the present invention can be used for the display portion 5001 and the second display portion 5002.

Figure 9:
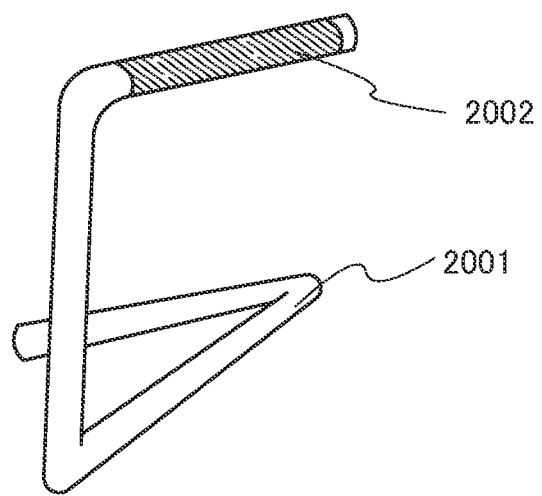
FIG. 9 is a diagram illustrating a lighting device.

FIG. 9 illustrates an example in which the light-emitting device described in Embodiment 1 is used for a table lamp which serves as a lighting device. The table lamp illustrated in FIG. 9 includes a housing 2001 and a light source 2002, and the lighting device described in Embodiment 2 may be used for the light source 2002.

Figure 10:
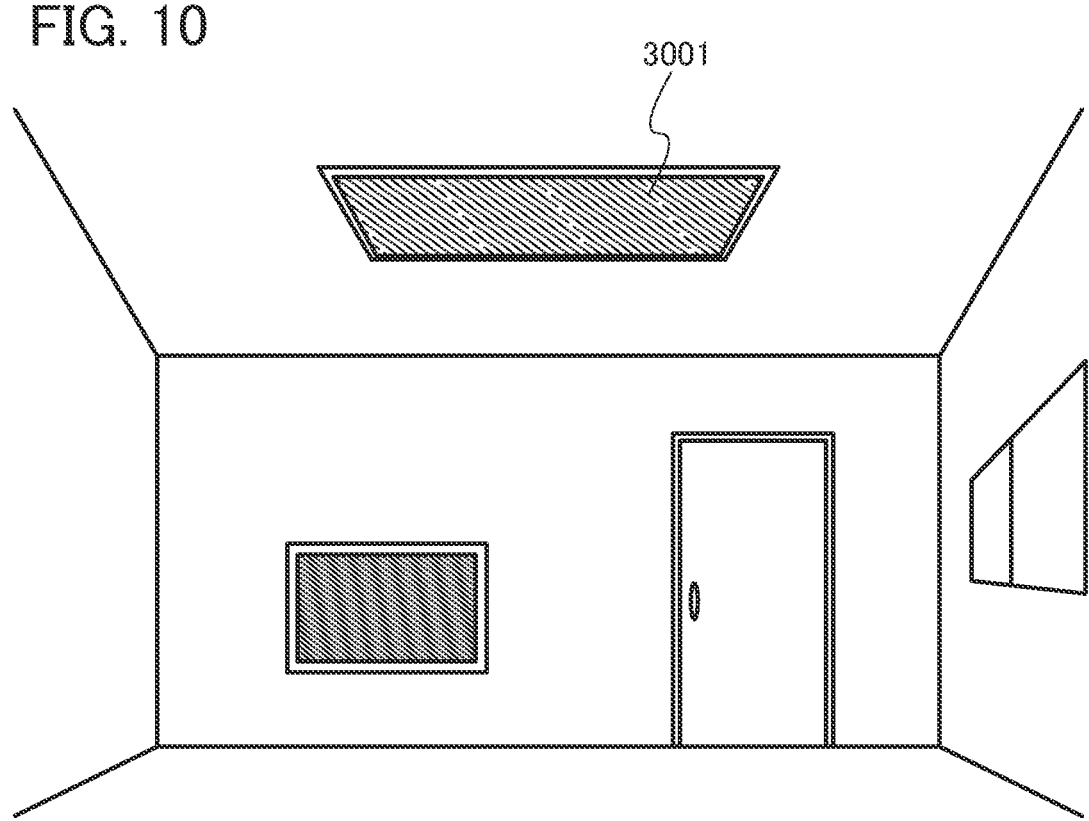
FIG. 10 is a diagram illustrating a lighting device.

FIG. 10 illustrates an example in which the light-emitting device described in Embodiment 1 is used for an indoor lighting device 3001. Since the light-emitting device described in Embodiment 1 has high emission efficiency, a lighting device having low power consumption can be obtained. Furthermore, the light-emitting device described in Embodiment 1 can have a larger area, and thus can be used for a large-area lighting device. Furthermore, the light-emitting device described in Embodiment 1 is thin, and thus can be used for a lighting device having a reduced thickness.

Figure 11:
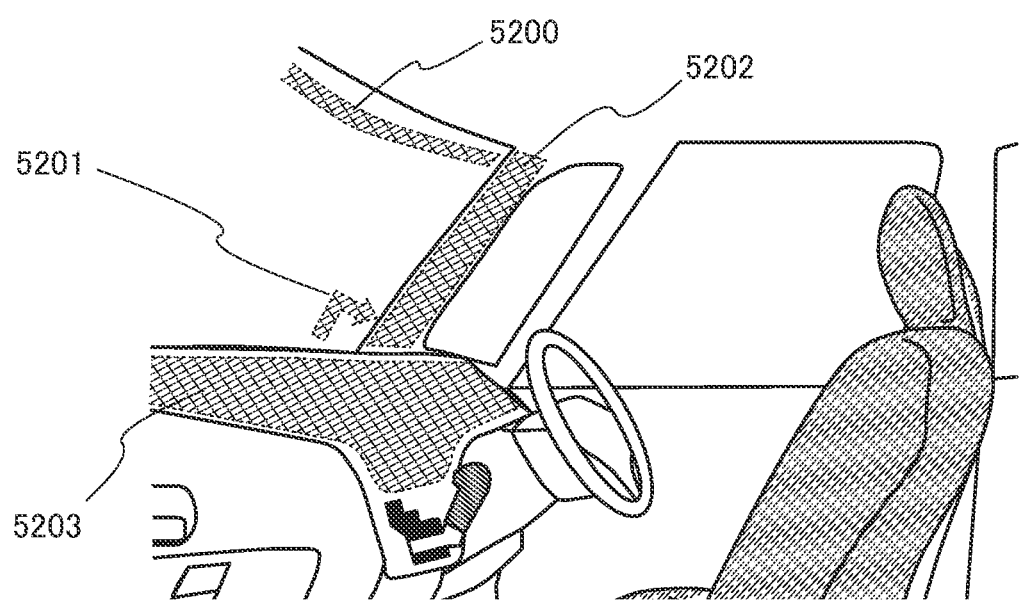
FIG. 11 is a diagram illustrating an in-vehicle display device and a lighting device.

The light-emitting device described in Embodiment 1 can also be used for a windshield or a dashboard of an automobile. FIG. 11 illustrates one mode in which the light-emitting device described in Embodiment 1 is used for an automobile windshield and an automobile dashboard. A display region 5200 to a display region 5203 are each a display region provided using the light-emitting device described in Embodiment 1.

The display region 5200 and the display region 5201 are display devices into which the light-emitting devices described in Embodiment 1 are incorporated. When the light-emitting devices described in Embodiment 1 are fabricated using electrodes having light-transmitting properties as a first electrode and a second electrode, what is called see-through display devices, through which the opposite side can be seen, can be obtained. See-through display devices can be provided without hindering the vision even when being provided in the automobile windshield. Note that in the case where a driving transistor or the like is provided, a transistor having a light-transmitting property, such as an organic transistor using an organic semiconductor material or a transistor using an oxide semiconductor, is preferably used.

A display region 5202 is a display device provided in a pillar portion into which the light-emitting device described in Embodiment 1 is incorporated. The display region 5202 can compensate for the view hindered by the pillar by displaying an image taken by an imaging means provided on the car body. Similarly, the display region 5203 provided in the dashboard portion can compensate for the view hindered by the car body by displaying an image taken by an imaging means provided on the outside of the automobile. Thus, blind areas can be compensated for and the safety can be enhanced. Showing an image so as to compensate for the area that cannot be seen makes it possible to confirm safety more naturally and comfortably.

The display region 5203 can provide a variety of kinds of information by displaying navigation data, a speedometer, a tachometer, a mileage, a fuel meter, a gearshift state, air-condition setting, and the like. The content or layout of the display can be changed as appropriate in accordance with the preference of a user. Note that such information can also be provided on the display region 5200 to the display region 5202. The display region 5200 to the display region 5203 can also be used as lighting devices.

Figure 12A:
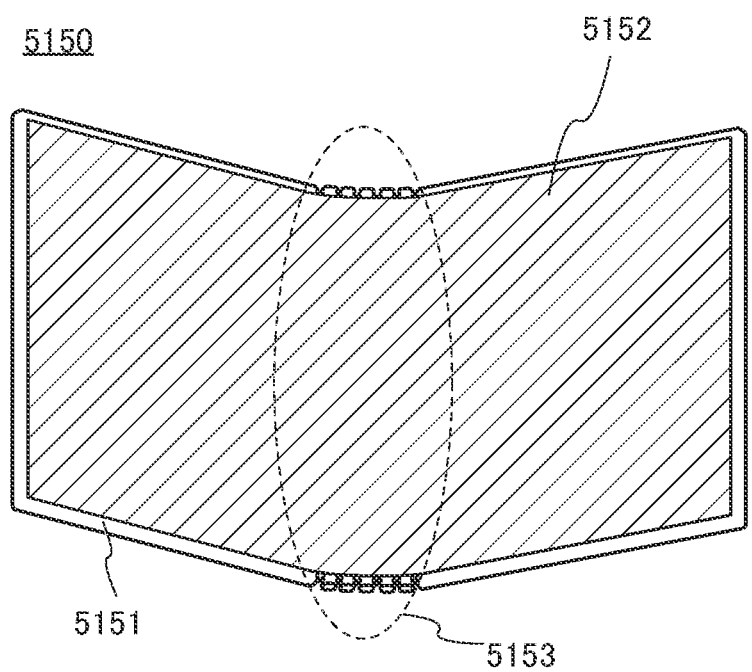
FIGS. 12(A) and 12(B) are diagrams illustrating an electronic device.
Figure 12B:
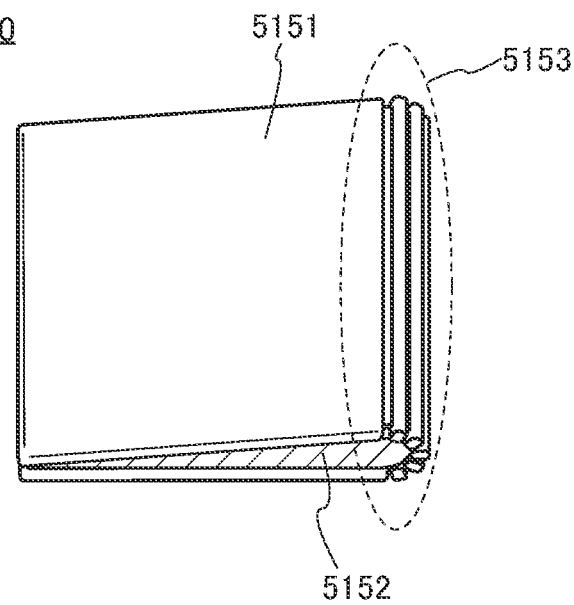

FIGS. 12(A) and 12(B) illustrate a foldable portable information terminal 5150. The foldable portable information terminal 5150 includes a housing 5151, a display region 5152, and a bend portion 5153. FIG. 12(A) illustrates the portable information terminal 5150 that is opened. FIG. 12(B) illustrates the portable information terminal 5150 that is folded. The portable information terminal 5150 is compact in size and has excellent portability when folded, despite its large display region 5152.

The display region 5152 can be folded in half with the bend portion 5153. The bend portion 5153 includes a flexible member and a plurality of supporting members, and when the display region is folded, the flexible member expands and the bend portion 5153 has a radius of curvature of 2 mm or more, preferably 3 mm or more.

Note that the display region 5152 may be a touch panel (an input/output device) including a touch sensor (an input device). The light-emitting apparatus of one embodiment of the present invention can be used for the display region 5152.

Figure 13A:
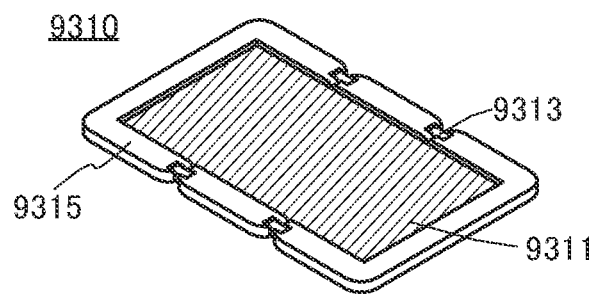
FIGS. 13(A) to 13(C) are diagrams illustrating an electronic device.
Figure 13B:
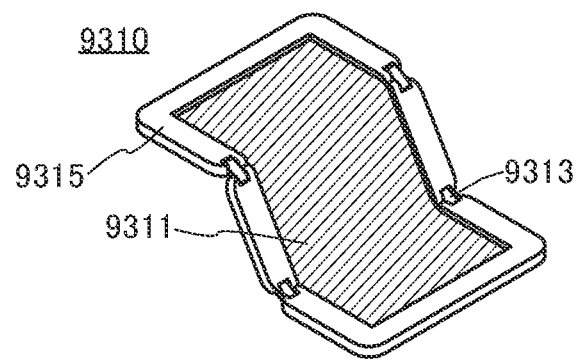
Figure 13C:
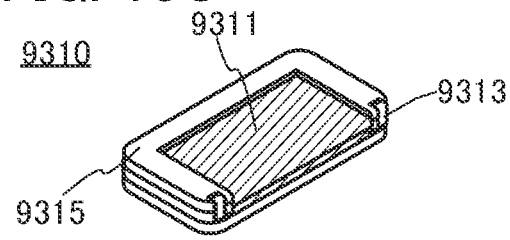

FIGS. 13(A) to 13(C) illustrate a foldable portable information terminal 9310. FIG. 13(A) illustrates the portable information terminal 9310 that is opened. FIG. 13(B) illustrates the portable information terminal 9310 which is in the state of being changed from one of an opened state and a folded state to the other. FIG. 13(C) illustrates the portable information terminal 9310 that is folded. The portable information terminal 9310 is excellent in portability when folded, and is excellent in display browsability when opened because of a seamless large display region.

A display panel 9311 is supported by three housings 9315 joined together by hinges 9313. Note that the display panel 9311 may be a touch panel (an input/output device) including a touch sensor (an input device). By folding the display panel 9311 at the hinges 9313 between two housings 9315, the portable information terminal 9310 can be reversibly changed in shape from the opened state to the folded state. A light-emitting apparatus of one embodiment of the present invention can be used for the display panel 9311. A display region 9312 in the display panel 9311 is a display region that is positioned at a side surface of the portable information terminal 9310 which is folded.

Example 1

In this example, the behavior of external quantum efficiency and a blue index (BI) in light-emitting devices having microcavity structures with varied optical path lengths will be described in detail. Structures of organic compounds used in a light-emitting device 1-1 to a light-emitting device 1-8 fabricated in this example are shown below.

[Chemical Formula 3]

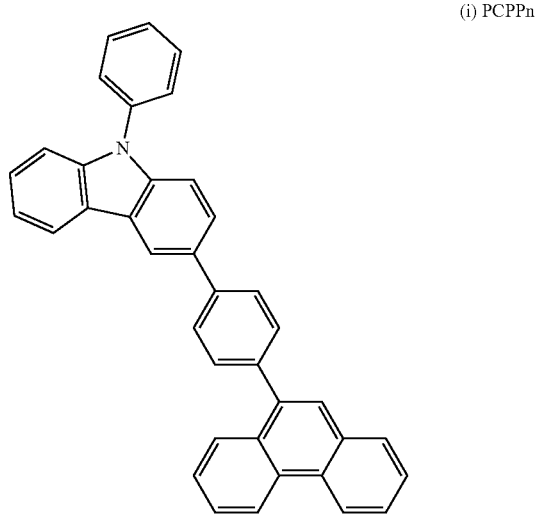

(i) PCPPn (ii) cgDBCzPA

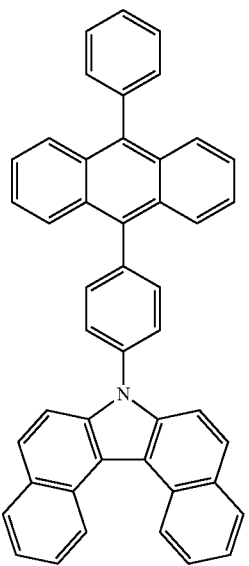

(iii) 1,6mFLPAPrn

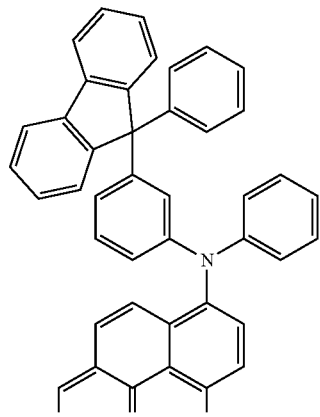

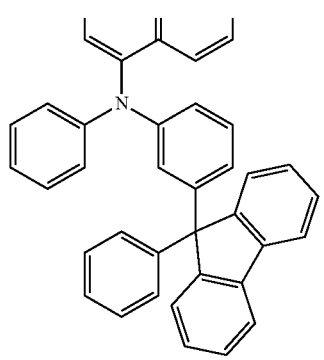

(iv) NBPhen (v) DBT3P-II

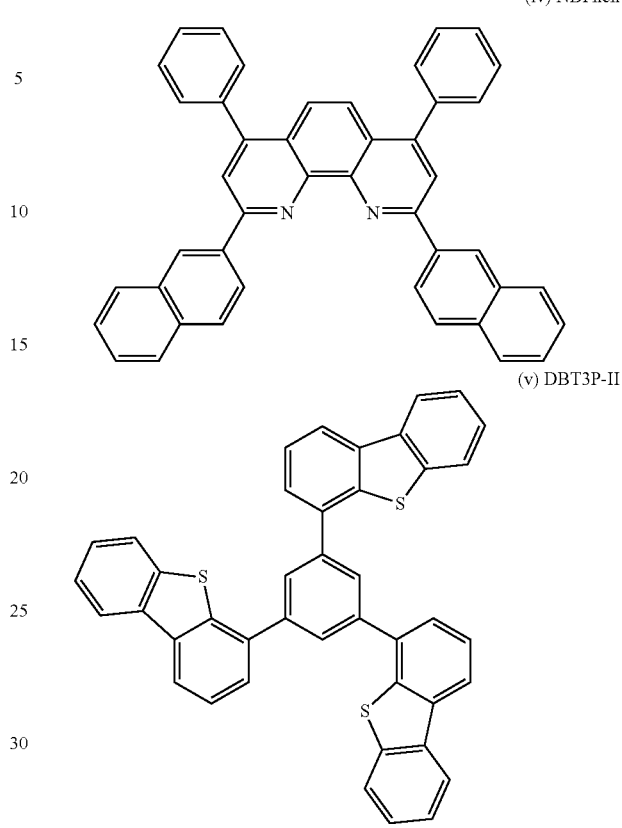

<Method for Fabricating Light-Emitting Device 1-1 to Light-Emitting Device 1-8>

First, over a glass substrate, an alloy film of silver (Ag), palladium (Pd), and copper (Cu) (an Ag—Pd—Cu (APC) film) was formed as a reflective electrode to a thickness of 100 nm by a sputtering method, and a film of indium tin oxide containing silicon oxide (ITSO) was formed as a transparent electrode to a thickness of 85 nm by a sputtering method, so that the first electrode 101 was formed. Note that the area of the electrode was 4 mm² (2 mm×2 mm).

Next, in pretreatment for forming the light-emitting device over the substrate, the surface of the substrate was washed with water and baked at 200° C. for one hour, and then UV ozone treatment was performed for 370 seconds.

After that, the substrate was transferred into a vacuum evaporation apparatus in which the pressure was reduced to about $10^{-4}$ Pa, vacuum baking at 170° C. for 30 minutes was performed in a heating chamber in the vacuum evaporation apparatus, and then the substrate was naturally cooled down for about 30 minutes.

Next, the substrate on which the first electrode 101 was formed was fixed to a substrate holder provided in the vacuum evaporation apparatus such that the side on which the first electrode 101 was formed faced downward, and 3-[4-(9-phenanthryl)-phenyl]-9-phenyl-9H-carbazole (abbreviation: PCPPn) represented as the above structural formula (i) and molybdenum(VI) oxide were deposited by co-evaporation on the first electrode 101 to have a weight ratio of 1:0.5 (=PCPPn:molybdenum oxide) by an evaporation method, whereby the hole-injection layer 111 was formed.

Variation of the optical path length in the light-emitting devices was achieved by changing the thickness of the hole-injection layer 111. In the light-emitting device 1-1, the thickness of the hole-injection layer 111 was 10 nm; in the light-emitting device 1-2, that was 15 nm; in the light-emitting device 1-3, that was 20 nm; in the light-emitting device 1-4, that was 25 nm; in the light-emitting device 1-5, that was 30 nm; in the light-emitting device 1-6, that was 35 nm; in the light-emitting device 1-7, that was 40 nm; and in the light-emitting device 1-8, that was 45 nm.

Next, on the hole-injection layer 111, PCPPn was deposited by evaporation to a thickness of 15 nm to form the hole-transport layer 112.

Subsequently, 7-[4-(10-phenyl-9-anthryl)phenyl]-7H-dibenzo[c,g]carbazole (abbreviation: cgDBCzPA) expressed by the above structural formula (ii) and N,N'-diphenyl-N,N'-bis(3-methylphenyl)-N,N'-bis[3-(9-phenyl-9H-fluoren-9-yl)phenyl]-pyrene-1,6-diamine (abbreviation: 1,6mMemFLPAPrn) expressed by the above structural formula (iii) were deposited by co-evaporation to a thickness of 25 nm at a weight ratio of 1:0.03 (=cgDBCzPA: 1,6mMemFLPAPrn), so that the light-emitting layer 113 was formed.

After that, on the light-emitting layer 113, cgDBCzPA was deposited by evaporation to a thickness of 5 nm, and 2,9-bis(naphthalen-2-yl)-4,7-diphenyl-1,10-phenanthroline (abbreviation: NBPhen) expressed by the above structural formula (iv) was deposited by evaporation to a thickness of 15 nm, whereby the electron-transport layer 114 was formed.

After the formation of the electron-transport layer 114, lithium fluoride (LiF) was deposited by evaporation to a thickness of 1 nm to form the electron-injection layer 115, and silver (Ag) and magnesium (Mg) in a volume ratio of 1:0.1 were deposited by evaporation to a thickness of 10 nm to form the second electrode 102, whereby the light-emitting device 1-1 to the light-emitting device 1-8 were fabricated. Note that the second electrode 102 is a semi-transmissive and semi-reflective electrode having a function of reflecting light and a function of transmitting light, and the light-emitting devices of this example are top-emission devices from which light is extracted through the second electrode 102. In addition, 1,3,5-tri(dibenzothiophen-4-yl)-benzene (abbreviation: DBT3P-II) expressed by the above structural formula (v) was deposited by evaporation to a thickness of 70 nm on the second electrode 102, whereby the extraction efficiency was improved.

The device structures of the light-emitting device 1-1 to the light-emitting device 1-8 are listed in the following Table 1 and Table 2. Table 2 shows the thickness of the hole-injection layer in each light-emitting device.

TABLE 1

| Organic cap layer | DBT3P-II | 70 nm |
| Semi-transmissive and semi-reflective electrode | Ag:Mg (1:0.1) | 10 nm |
| Electron-injection layer | LiF | 1 nm |
| Electron-transport layer | NBPhen | 15 nm |
| | cgDBCzPA | 5 nm |
| Light-emitting layer | cgDBCzPA:1,6mFLPAPrn (1:0.03) | 25 nm |
| Hole-transport layer | PCPPn | 15 nm |
| Hole-injection layer | PCPPn:MoOx (1:0.5) | x nm |
| Transparent electrode | ITSO | 85 nm |
| Reflective electrode | APC | 100 nm |

TABLE 2

| | Thickness (nm) |
| --- | --- |
| Light-emitting device 1-1 | 10 |
| Light-emitting device 1-2 | 15 |
| Light-emitting device 1-3 | 20 |
| Light-emitting device 1-4 | 25 |
| Light-emitting device 1-5 | 30 |
| Light-emitting device 1-6 | 35 |
| Light-emitting device 1-7 | 40 |
| Light-emitting device 1-8 | 45 |

Each of the fabricated light-emitting devices was sealed using a glass substrate (a sealant was applied to surround the device, followed by UV treatment and one-hour heat treatment at 80° C. at the time of sealing) in a glove box containing a nitrogen atmosphere so that the light-emitting device is not exposed to the air, and then measurements were carried out. Note that the measurement was performed at room temperature.

Measurement results of the light-emitting device 1-1 to the light-emitting device 1-8 are shown below. All measurement results are shown as values at luminance around 1000 cd/m$^2$. In addition, the external quantum efficiency is uncorrected external quantum efficiency calculated from front luminance on the assumption of Lambertian distribution.

TABLE 3

| | Chromaticity x | Chromaticity y | Current efficiency (cd/A) | External quantum efficiency (%) | BI | EL_max (nm) |
| --- | --- | --- | --- | --- | --- | --- |
| Light-emitting device 1-1 | 0.139 | 0.050 | 0.813 | 1.46 | 16.1 | 459 |
| Light-emitting device 1-2 | 0.139 | 0.055 | 1.58 | 2.71 | 29.0 | 459 |
| Light-emitting device 1-3 | 0.138 | 0.059 | 2.84 | 4.70 | 48.4 | 459 |
| Light-emitting device 1-4 | 0.139 | 0.062 | 4.55 | 7.27 | 73.1 | 460 |
| Light-emitting device 1-5 | 0.137 | 0.068 | 6.28 | 9.59 | 93.0 | 460 |
| Light-emitting device 1-6 | 0.137 | 0.079 | 8.64 | 12.2 | 110 | 463 |
| Light-emitting device 1-7 | 0.136 | 0.093 | 10.3 | 13.3 | 111 | 465 |
| Light-emitting device 1-8 | 0.133 | 0.122 | 12.4 | 13.8 | 102 | 468 |

Figure 14:
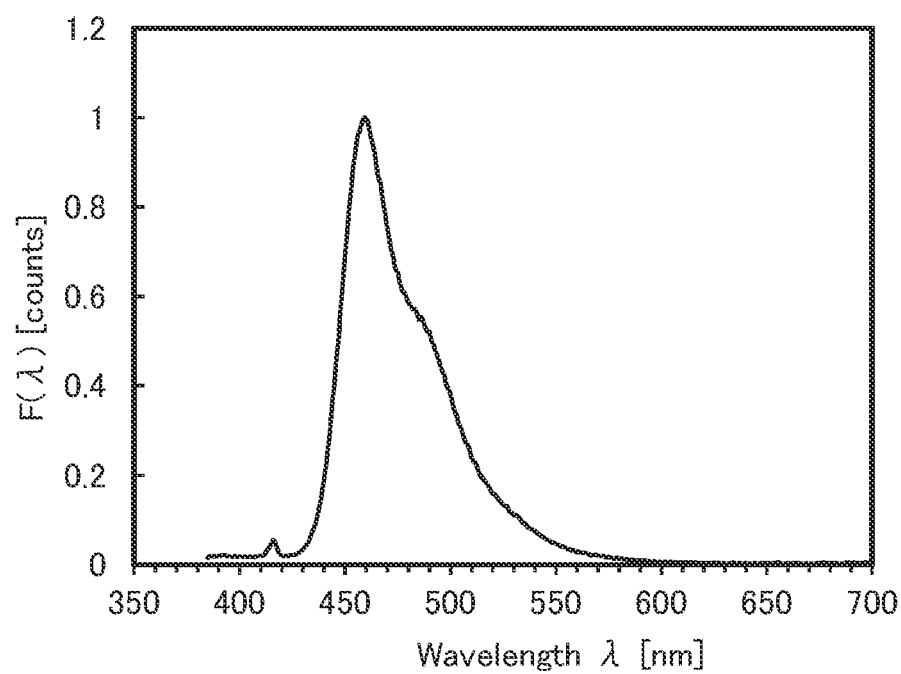
FIG. 14 shows an emission spectrum of N,N'-diphenyl-N,N'-bis[3-(9-phenyl-9H-fluoren-9-yl)phenyl]pyrene-1,6-diamine (abbreviation: 1,6mFLPAPrn) in a toluene solution.
Figure 15:
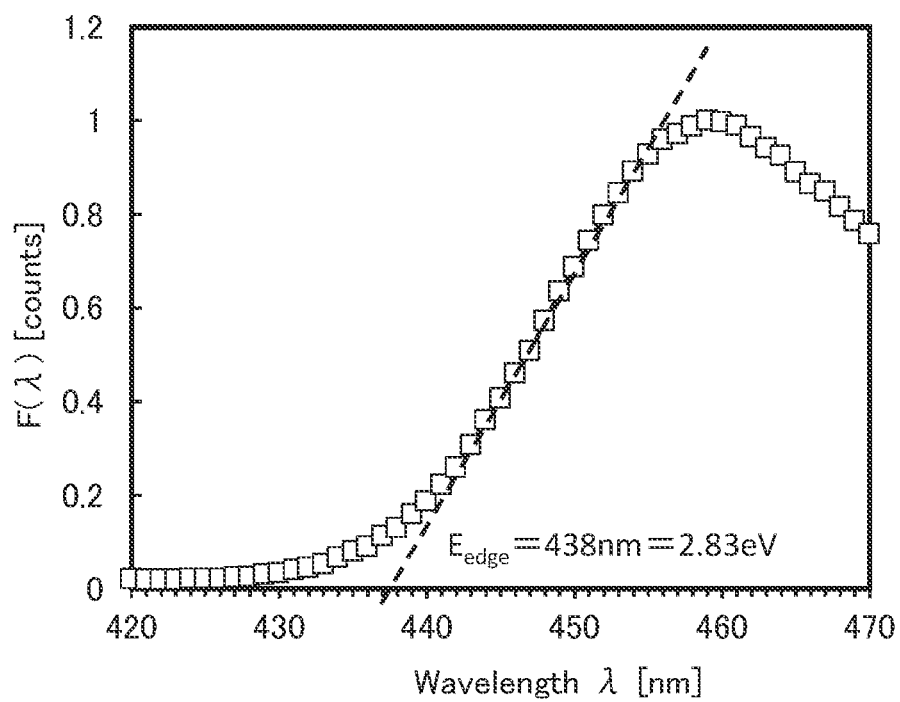
FIG. 15 is a diagram showing a calculation method of an emission edge on a short wavelength side of a PL spectrum of 1,6mFLPAPrn in a toluene solution.

FIG. 14 shows a PL spectrum of 1,6mFLPAPrn that is an emission center substance in a toluene solution. For measurement of the PL spectrum, a fluorescence spectrophotometer (Edinburgh Instruments FS920 manufactured by Hamamatsu Photonics K.K.) was used, and in calculation of the average photon energy $E_{ave}$, the formula (I) shown in Embodiment 1 was used. By this, the average photon energy ($E_{ave}$) of the PL spectrum of 1,6mFLPAPrn in a toluene solution was calculated to be 2.61 eV. Furthermore, the emission edge on the short wavelength side of the PL spectrum of 1,6mFLPAPrn in the toluene solution was calculated in a manner shown in FIG. 15 to be 438 nm, and its energy was 2.83 eV.

Figure 16:
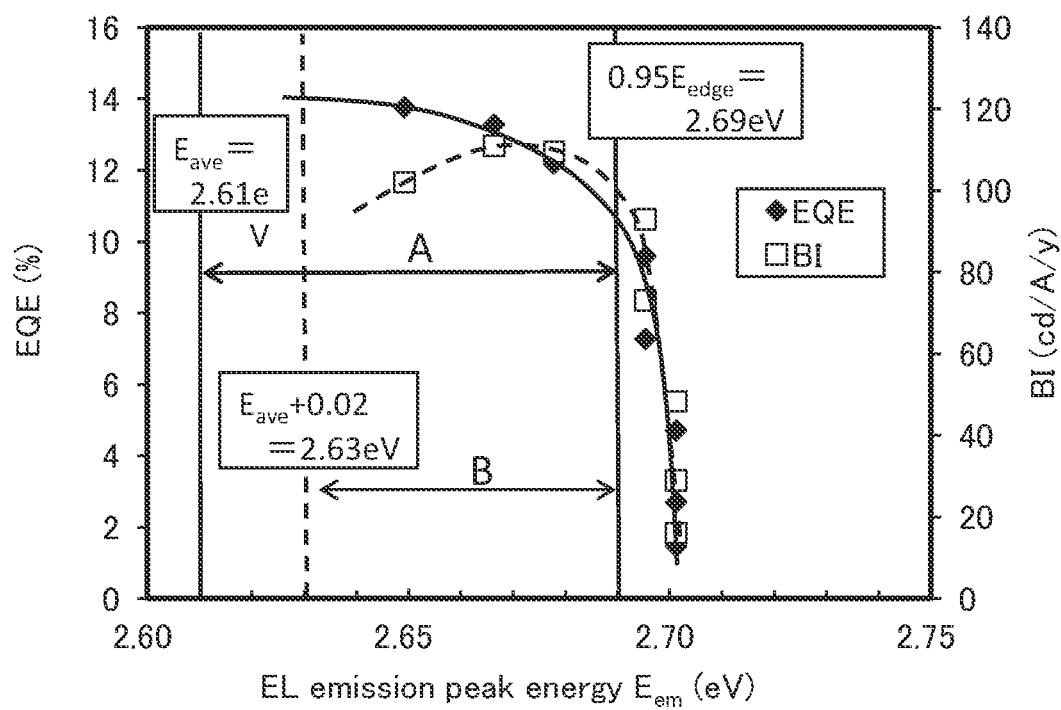
FIG. 16 is a graph showing a relation of external quantum efficiency (EQE) and a blue index (BI) with respect to energy at emission peak ($E_{em}$) in a light-emitting device 1-1 to a light-emitting device 1-8.

FIG. 16 is a graph showing a relation of external quantum efficiency (EQE) and a blue index (BI) with respect to the emission peak energy ($E_{em}$) of each light-emitting device. The horizontal axis represents $E_{em}$, and the vertical axes represent EQE and BI.

According to the diagram, both EQE and BI exhibit favorable values in the light-emitting device having a cavity length enabling a value of $E_{em}$ to fall within a range between $E_{ave}$ (2.61 eV in this example) and 2.69 eV.

Note that a value of 2.69 eV is the energy corresponding to 0.95 times $E_{edge}$ as 2.83 eV.

As described above, it was found that the blue light-emitting device with a microcavity structure can emit light with favorable efficiency when the light-emitting device has a cavity length enabling a wavelength corresponding to energy that is higher than or equal to $E_{ave}$ and less than or equal to 0.95 times $E_{edge}$. In other words, the cavity length is controlled to satisfy $E_{ave} \leq E_{em} \leq 0.95 E_{edge}$ (Range A in the drawing), whereby both EQE and BI can be maximized.

In particular, it was found that the light-emitting device whose $E_{em}$ is greater than or equal to $E_{ave}+0.02$ (eV) and less than or equal to $E_{edge} \times 0.95$ (eV) is preferable in consideration of BI; thus, the cavity length is preferably controlled to satisfy $E_{ave}+0.02 \leq E_{em} \leq 0.95 E_{edge}$ (Range B in the drawing).

Example 2

In this example, the behavior of external quantum efficiency and blue index (BI) in light-emitting devices with microcavity structures with varied optical path lengths will be described in detail. Structures of organic compounds used in a light-emitting device 2-1 to a light-emitting device 2-8 fabricated in this example are shown below.

[Chemical Formula 4]

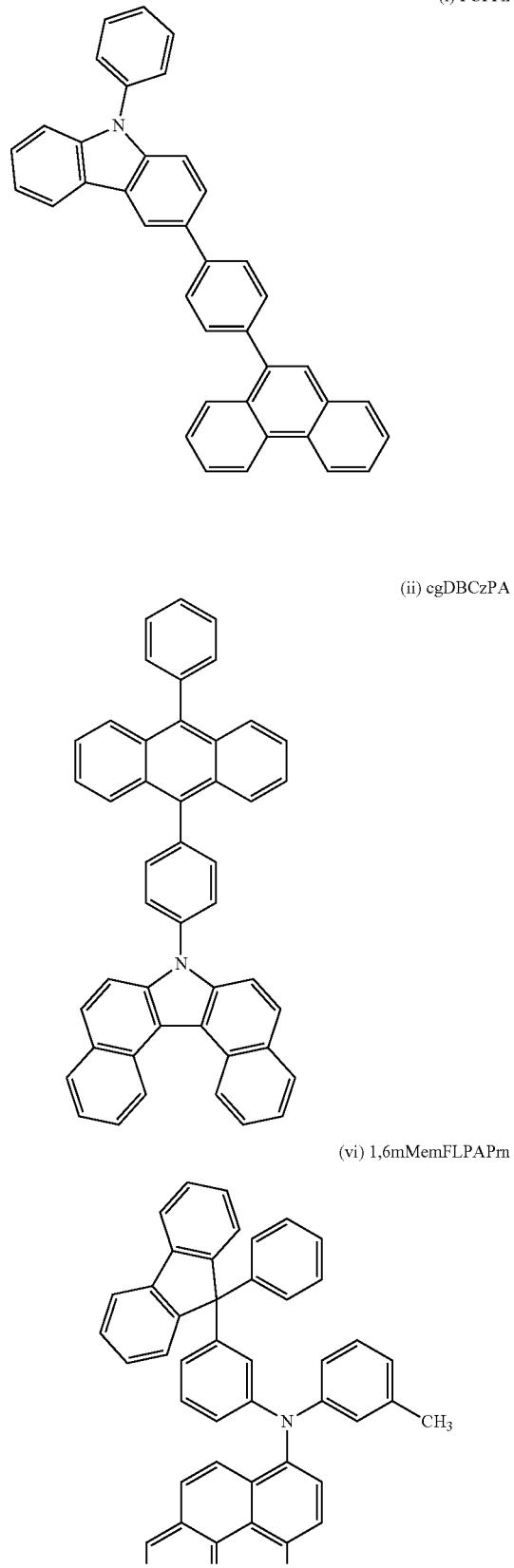

(i) PCPPn (ii) cgDBCzPA (vi) 1,6mMemFLPAPrn

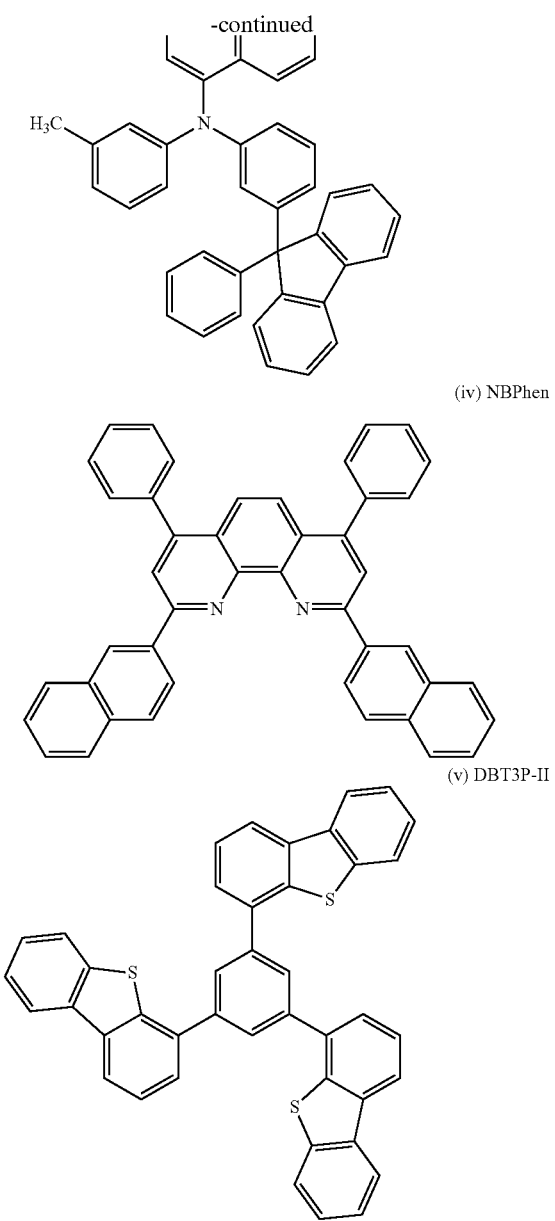

(iv) NBPhen (v) DBT3P-II

<Method for Fabricating Light-Emitting Device 2-1 to Light-Emitting Device 2-8>

First, over a glass substrate, an alloy film of silver (Ag), palladium (Pd), and copper (Cu) (an Ag—Pd—Cu (APC) film) was formed as a reflective electrode to a thickness of 100 nm by a sputtering method, and a film of indium tin oxide containing silicon oxide (ITSO) was formed as a transparent electrode to a thickness of 85 nm by a sputtering method, so that the first electrode 101 was formed. Note that the area of the electrode was 4 mm² (2 mm×2 mm).

Next, in pretreatment for forming the light-emitting device over the substrate, the surface of the substrate was washed with water and baked at 200° C. for one hour, and then UV ozone treatment was performed for 370 seconds.

After that, the substrate was transferred into a vacuum evaporation apparatus in which the pressure was reduced to about $10^{-4}$ Pa, vacuum baking at 170° C. for 30 minutes was performed in a heating chamber in the vacuum evaporation apparatus, and then the substrate was naturally cooled down for about 30 minutes.

Next, the substrate on which the first electrode 101 was formed was fixed to a substrate holder provided in the vacuum evaporation apparatus such that the side on which the first electrode 101 was formed faced downward, and 3-[4-(9-phenanthryl)-phenyl]-9-phenyl-9H-carbazole (abbreviation: PCPPn) expressed by the above structural formula (i) and molybdenum(VI) oxide were deposited by co-evaporation on the first electrode 101 to have a weight ratio of 1:0.5 (=PCPPn: molybdenum oxide) by an evaporation method, whereby the hole-injection layer 111 was formed.

Variation of the optical path length in the light-emitting devices was achieved by changing the thickness of the hole-injection layer 111. In the light-emitting device 2-1, the thickness of the hole-injection layer 111 was 10 nm; in the light-emitting device 2-2, that was 15 nm; in the light-emitting device 2-3, that was 20 nm; in the light-emitting device 2-4, that was 25 nm; in the light-emitting device 2-5, that was 30 nm; in the light-emitting device 2-6, that was 35 nm; in light-emitting device 2-7, that was 40 nm; and in the light-emitting device 2-8, that was 45 nm.

Next, on the hole-injection layer 111, PCPPn was deposited by evaporation to a thickness of 15 nm to form the hole-transport layer 112.

Subsequently, 7-[4-(10-phenyl-9-anthryl)phenyl]-7H-dibenzo[c,g]carbazole (abbreviation: cgDBCzPA) expressed by the above structural formula (ii) and N,N'-bis(3-methylphenyl)-N,N'-bis[3-(9-phenyl-9H-fluoren-9-yl)phenyl]-pyrene-1,6-diamine (abbreviation: 1,6mMemFLPAPrn) expressed by the above structural formula (vi) were deposited by co-evaporation to a thickness of 25 nm at a weight ratio of 1:0.03 (=cgDBCzPA: 1,6mMemFLPAPrn), so that the light-emitting layer 113 was formed.

After that, on the light-emitting layer 113, cgDBCzPA was deposited by evaporation to a thickness of 5 nm, and 2,9-bis(naphthalen-2-yl)-4,7-diphenyl-1,10-phenanthroline (abbreviation: NBPhen) expressed by the above structural formula (iv) was deposited by evaporation to a thickness of 15 nm, whereby the electron-transport layer 114 was formed.

After the formation of the electron-transport layer 114, lithium fluoride (LiF) was deposited by evaporation to a thickness of 1 nm to form the electron-injection layer 115, and silver (Ag) and magnesium (Mg) in a volume ratio of 1:0.1 were deposited by evaporation to a thickness of 15 nm to form the second electrode 102, whereby the light-emitting device 2-1 to the light-emitting device 2-8 were fabricated. Note that the second electrode 102 is a semi-transmissive and semi-reflective electrode having a function of reflecting light and a function of transmitting light, and the light-emitting devices of this example are top-emission devices from which light is extracted through the second electrode 102. In addition, 1,3,5-tri(dibenzothiophen-4-yl)-benzene (abbreviation: DBT3P-II) expressed by the above structural formula (v) was deposited by evaporation to a thickness of 70 nm on the second electrode 102, whereby the extraction efficiency was improved.

The device structures of the light-emitting device 2-1 to the light-emitting device 2-8 are listed in the following Table 4 and Table 5. Table 5 shows the thickness of the hole-injection layer in each light-emitting device.

TABLE 4

| | | |
|---|---|---|
| Organic cap layer | DBT3P-II | 70 nm |
| Semi-transmissive and semi-reflective electrode | Ag:Mg (1:0.1) | 15 nm |
| Electron-injection layer | LiF | 1 nm |
| Electron-transport layer | NBPhen | 15 nm |
| | cgDBCzPA | 5 nm |

TABLE 4-continued

| Light-emitting layer | cgDBCzPA:1,6mMemFLPAPrn (1:0.03) | 25 nm |
| Hole-transport layer | PCPPn | 15 nm |
| Hole-injection layer | PCPPn:MoOx (1:0.5) | x nm |
| Transparent electrode | ITSO | 85 nm |
| Reflective electrode | APC | 100 nm |

TABLE 5

|  | Thickness (nm) |
| --- | --- |
| Light-emitting device 2-1 | 10 |
| Light-emitting device 2-2 | 15 |
| Light-emitting device 2-3 | 20 |
| Light-emitting device 2-4 | 25 |
| Light-emitting device 2-5 | 30 |
| Light-emitting device 2-6 | 35 |
| Light-emitting device 2-7 | 40 |
| Light-emitting device 2-8 | 45 |

Each of the fabricated light-emitting devices was sealed using a glass substrate (a sealant was applied to surround the device, followed by UV treatment and one-hour heat treatment at 80° C. at the time of sealing) in a glove box containing a nitrogen atmosphere so that the light-emitting device is not exposed to the air, and then measurements were carried out. Note that the measurement was performed at room temperature.

Measurement results of the light-emitting device 2-1 to the light-emitting device 2-8 are shown below. All measurement results are represented as values at luminance around 1000 cd/m². In addition, the external quantum efficiency is uncorrected quantum efficiency calculated from front luminance on the assumption of Lambertian distribution.

TABLE 6

|  | Chromaticity x | Chromaticity y | Current efficiency (cd/A) | External quantum efficiency (%) | BI | EL_max (nm) |
| --- | --- | --- | --- | --- | --- | --- |
| Light-emitting device 2-1 | 0.143 | 0.062 | 0.522 | 0.84 | 8.49 | 461 |
| Light-emitting device 2-2 | 0.137 | 0.064 | 1.02 | 1.60 | 15.9 | 462 |
| Light-emitting device 2-3 | 0.138 | 0.068 | 1.96 | 2.99 | 28.9 | 461 |
| Light-emitting device 2-4 | 0.137 | 0.069 | 3.26 | 4.84 | 46.9 | 462 |
| Light-emitting device 2-5 | 0.138 | 0.074 | 4.86 | 7.04 | 65.7 | 462 |
| Light-emitting device 2-6 | 0.137 | 0.081 | 6.97 | 9.66 | 85.7 | 463 |
| Light-emitting device 2-7 | 0.135 | 0.098 | 9.66 | 12.2 | 99.0 | 466 |
| Light-emitting device 2-8 | 0.132 | 0.125 | 12.0 | 13.2 | 95.5 | 469 |

Figure 17:
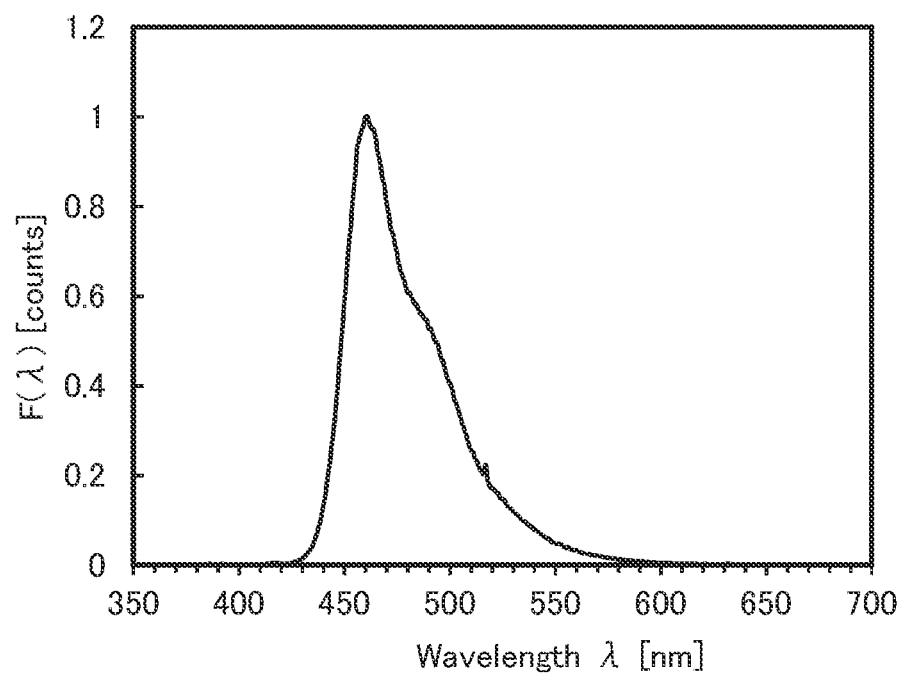
FIG. 17 is a diagram showing an emission spectrum of N,N'-bis(3-methylphenyl)-N,N'-bis[3-(9-phenyl-9H-fluoren-9-yl)phenyl]pyrene-1,6-diamine (abbreviation: 1,6mMemFLPAPrn) in a toluene solution.
Figure 18:
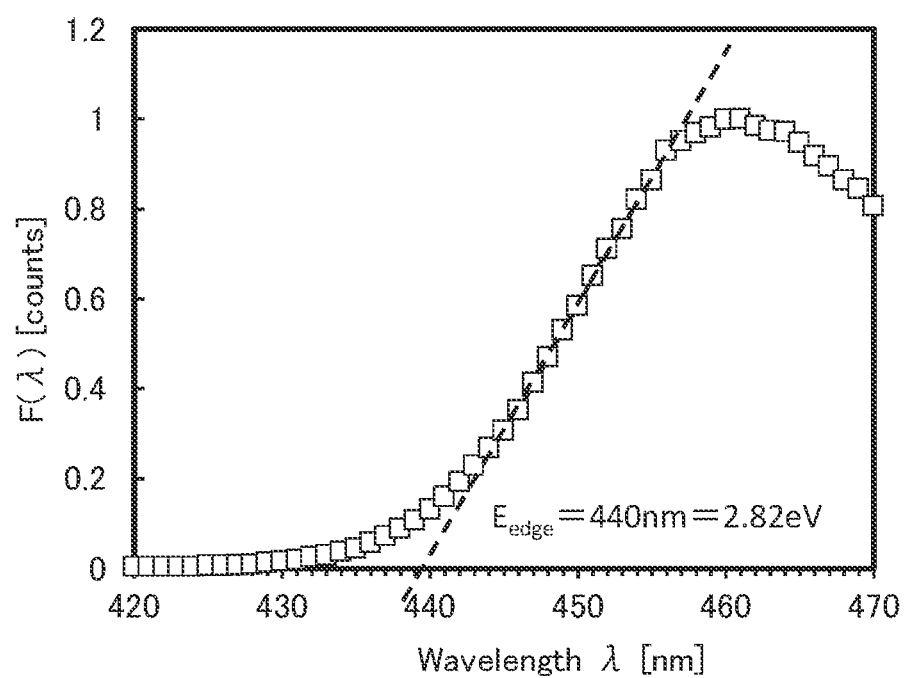
FIG. 18 is a diagram showing a calculation method of an emission edge on a short wavelength side of a PL spectrum of 1,6mMemFLPAPrn in a toluene solution.

FIG. 17 shows a PL spectrum of 1.6mMemFLPAPrn that is an emission center substance in a toluene solution. For measurement of the PL spectrum, a fluorescence spectrophotometer (Edinburgh Instruments FS920 manufactured by Hamamatsu Photonics K.K.) was used, and in calculation of the average photon energy $E_{ave}$, the formula (I) shown in Embodiment 1 was used. By this, the average photon energy ($E_{ave}$) of the PL spectrum of 1.6mMemFLPAPrn in a toluene solution was calculated to be 2.59 eV. Furthermore, the emission edge on the short wavelength side of the PL spectrum of 1.6mMemFLPAPrn in the toluene solution was calculated in a manner shown in FIG. 18 to be 440 nm, and its energy was 2.82 eV.

Figure 19:
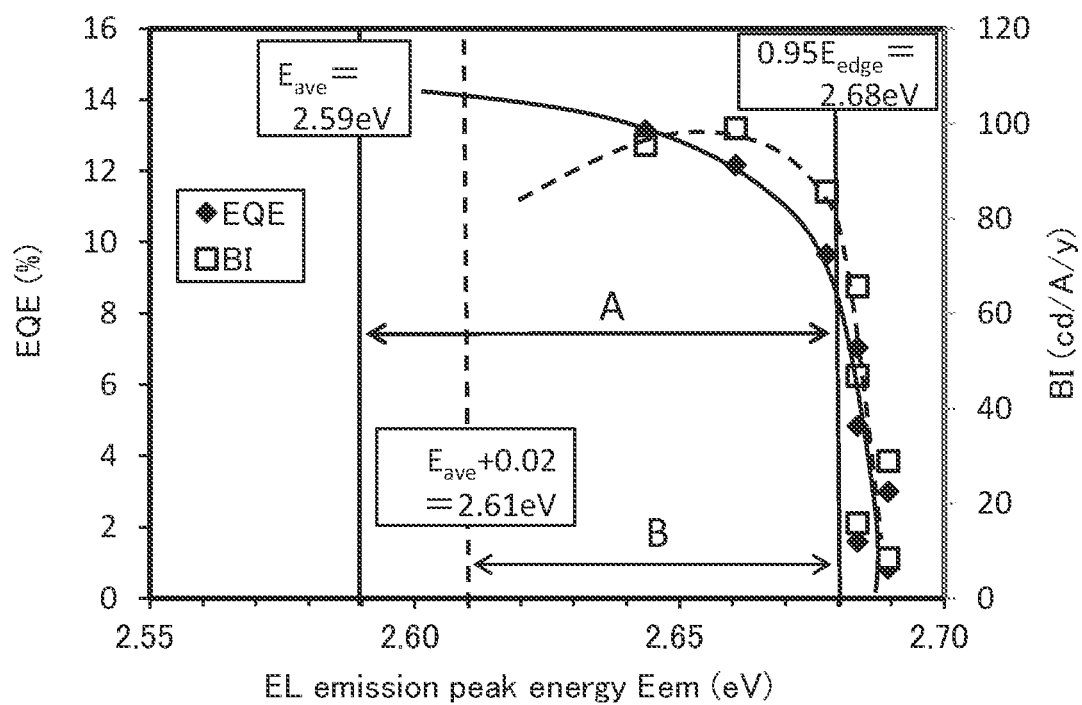
FIG. 19 is a graph showing a relation of external quantum efficiency (EQE) and a blue index (BI) with respect to energy at emission peak ($E_{em}$) in a light-emitting device 2-1 to a light-emitting device 2-8.

FIG. 19 is a graph showing a relation of external quantum efficiency (EQE) and blue index (BI) with respect to the emission peak energy ($E_{em}$) of each light-emitting device. The horizontal axis represents $E_{em}$, and the vertical axes represent EQE and BI.

According to the diagram, both EQE and BI exhibit favorable values in the light-emitting device having a cavity length enabling a value of $E_{em}$ to fall within a range between $E_{ave}$ (2.59 eV in this example) and 2.68 eV.

Note that a value of 2.68 eV is the energy corresponding to 0.95 times $E_{edge}$ as 2.82 eV.

As described above, it was found that the blue light-emitting device with a microcavity structure can emit light with favorable efficiency when the light-emitting device has a cavity length enabling a wavelength corresponding to energy that is higher than or equal to $E_{ave}$ and less than or equal to 0.95 times $E_{edge}$. In other words, the cavity length is controlled to satisfy $E_{ave} \leq E_{em} \leq 0.95 E_{edge}$ (Range A in the drawing), whereby both EQE and BI can be maximized.

In particular, it was found that the light-emitting device whose $E_{em}$ is greater than or equal to $E_{ave}$+0.02 (eV) and less than or equal to $E_{edge}$×0.95 (eV) is preferable in consideration of BI; thus, the cavity length is preferably controlled to satisfy $E_{ave}+0.02 \leq E_{em} \leq 0.95 E_{edge}$ (Range B in the drawing).

Example 3

In this example, the behavior of external quantum efficiency and blue index (BI) in light-emitting devices with microcavity structures with varied optical path lengths will be described in detail. Structures of organic compounds used in a light-emitting device 3-1 to a light-emitting device 3-8 fabricated in this example are shown below.

[Chemical Formula 5]

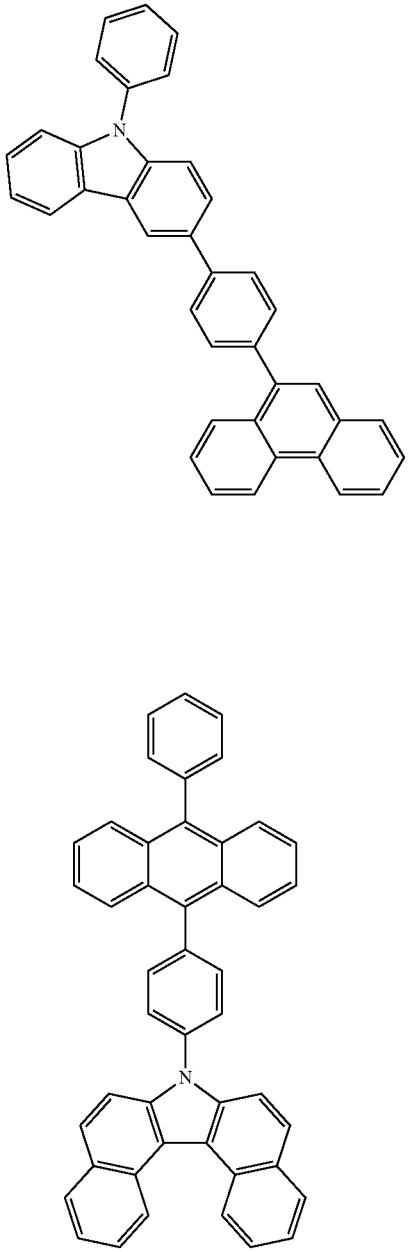

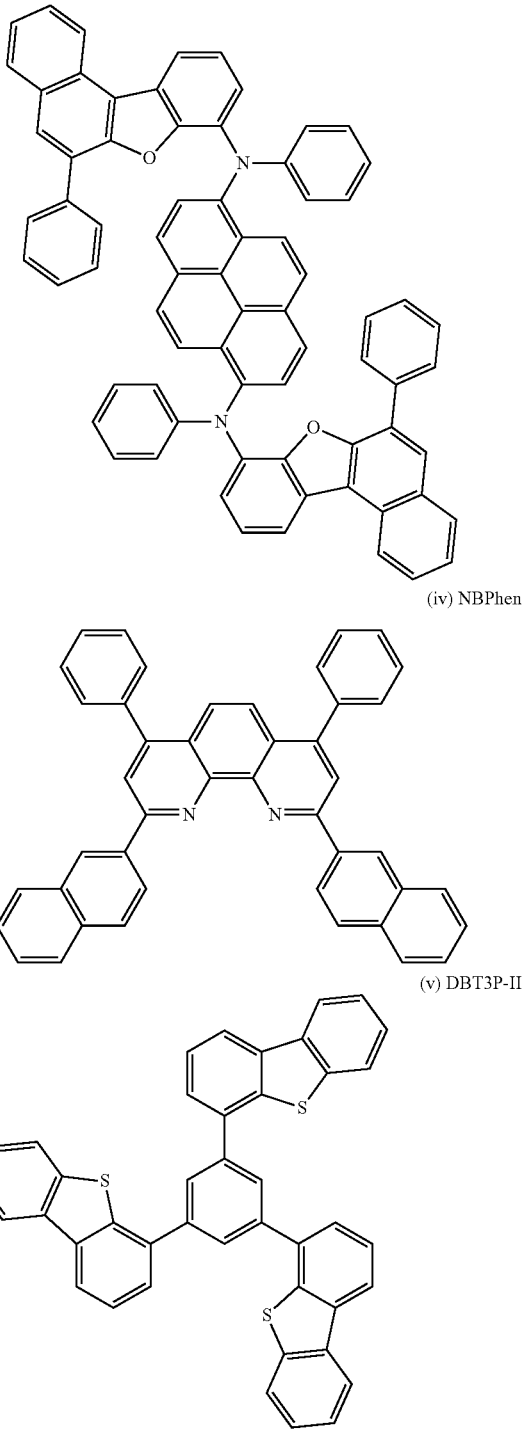

<Method for Fabricating Light-Emitting Device 3-1 to Light-Emitting Device 3-8>

First, over a glass substrate, an alloy film of silver (Ag), palladium (Pd), and copper (Cu) (an Ag—Pd—Cu (APC) film) was formed as a reflective electrode to a thickness of 100 nm by a sputtering method, and a film of indium tin oxide containing silicon oxide (ITSO) was formed as a transparent electrode to a thickness of 95 nm by a sputtering method, so that the first electrode 101 was formed. Note that the area of the electrode was 4 mm² (2 mm×2 mm).

Next, in pretreatment for forming the light-emitting device over the substrate, the surface of the substrate was washed with water and baked at 200° C. for one hour, and then UV ozone treatment was performed for 370 seconds.

After that, the substrate was transferred into a vacuum evaporation apparatus in which the pressure was reduced to about $10^{-4}$ Pa, vacuum baking at 170° C. for 30 minutes was performed in a heating chamber in the vacuum evaporation apparatus, and then the substrate was naturally cooled down for about 30 minutes.

Next, the substrate on which the first electrode 101 was formed was fixed to a substrate holder provided in the vacuum evaporation apparatus such that the side on which the first electrode 101 was formed faced downward, and 3-[4-(9-phenanthryl)-phenyl]-9-phenyl-9H-carbazole (abbreviation: PCPPn) expressed by the above structural formula (i) and molybdenum(VI) oxide were deposited by co-evaporation on the first electrode 101 to have a weight ratio of 1:0.5 (=PCPPn:molybdenum oxide) by an evaporation method, whereby the hole-injection layer 111 was formed.

Variation of the optical path length in the light-emitting devices was achieved by changing the thickness of the hole-injection layer 111. In the light-emitting device 3-1, the thickness of the hole-injection layer 111 was 10 nm; in the light-emitting device 3-2, that was 15 nm; in the light-emitting device 3-3, that was 20 nm; in the light-emitting device 3-4, that was 25 nm; in the light-emitting device 3-5, that was 30 nm; in the light-emitting device 3-6, that was 35 nm; in the light-emitting device 3-7, that was 40 nm; and in the light-emitting device 3-8, that was 45 nm.

Next, on the hole-injection layer 111, PCPPn was deposited by evaporation to a thickness of 15 nm to form the hole-transport layer 112.

Subsequently, 7-[4-(10-phenyl-9-anthryl)phenyl]-7H-dibenzo[c,g]carbazole (abbreviation: cgDBCzPA) expressed by the structural formula (ii) and N,N'-(pyrene-1,6-diyl)bis [(6,N-diphenylbenzo[b]naphtho[1,2-d]furan)-8-amine] (abbreviation: 1,6BnfAPrn-03) expressed by the structural formula (vii) were deposited to a thickness of 25 nm by co-evaporation at a weight ratio of 1:0.03 (=cgDBCzPA:1, 6BnfAPrn-03), whereby the light-emitting layer 113 was formed.

After that, on the light-emitting layer 113, cgDBCzPA was deposited by evaporation to a thickness of 5 nm, and 2,9-bis(naphthalen-2-yl)-4,7-diphenyl-1,10-phenanthroline (abbreviation: NBPhen) expressed by the above structural formula (iv) was deposited by evaporation to a thickness of 15 nm, whereby the electron-transport layer 114 was formed.

After the formation of the electron-transport layer 114, lithium fluoride (LiF) was deposited by evaporation to a thickness of 1 nm to form the electron-injection layer 115, and silver (Ag) and magnesium (Mg) in a volume ratio of 1:0.1 were deposited by evaporation to a thickness of 15 nm to form the second electrode 102, whereby the light-emitting device 3-1 to the light-emitting device 3-8 were fabricated. Note that the second electrode 102 is a semi-transmissive and semi-reflective electrode having a function of reflecting light and a function of transmitting light, and the light-emitting devices of this example are top-emission devices from which light is extracted through the second electrode 102. In addition, 1,3,5-tri(dibenzothiophen-4-yl)-benzene (abbreviation: DBT3P-II) expressed by the above structural formula (v) was deposited by evaporation to a thickness of 70 nm on the second electrode 102, whereby the extraction efficiency was improved.

The device structures of the light-emitting device 3-1 to the light-emitting device 3-8 are listed in the following Table 7 and Table 8. Table 8 shows the thickness of the hole-injection layer in each light-emitting device.

TABLE 7

| | | |
|---|---|---|
| Organic cap layer | DBT3P-II | 70 nm |
| Semi-transmissive and semi-reflective electrode | Ag:Mg (1:0.1) | 15 nm |
| Electron-injection layer | LiF | 1 nm |
| Electron-transport layer | NBPhen | 15 nm |
| | cgDBCzPA | 5 nm |
| Light-emitting layer | cgDBCzPA:1,6BnfAPrn-03 (1:0.03) | 25 nm |
| Hole-transport layer | PCPPn | 15 nm |
| Hole-injection layer | PCPPn:MoOx (1:0.5) | x nm |
| Transparent electrode | ITSO | 95 nm |
| Reflective electrode | APC | 100 nm |

TABLE 8

| | Thickness (nm) |
|---|---|
| Light-emitting device 3-1 | 10 |
| Light-emitting device 3-2 | 15 |
| Light-emitting device 3-3 | 20 |
| Light-emitting device 3-4 | 25 |
| Light-emitting device 3-5 | 30 |
| Light-emitting device 3-6 | 35 |
| Light-emitting device 3-7 | 40 |
| Light-emitting device 3-8 | 45 |

Each of the fabricated light-emitting devices was sealed using a glass substrate (a sealant was applied to surround the device, followed by UV treatment and one-hour heat treatment at 80° C. at the time of sealing) in a glove box containing a nitrogen atmosphere so that the light-emitting device is not exposed to the air, and then measurements were carried out. Note that the measurement was performed at room temperature.

Measurement results of the light-emitting device 3-1 to the light-emitting device 3-8 are shown below. All measurement results are represented as values at luminance around 1000 cd/m². In addition, the external quantum efficiency is uncorrected quantum efficiency calculated from front luminance on the assumption of Lambertian distribution.

TABLE 9

| | Chromaticity x | Chromaticity y | Current efficiency (cd/A) | External quantum efficiency (%) | BI | EL_max (nm) |
|---|---|---|---|---|---|---|
| Light-emitting device 3-1 | 0.143 | 0.030 | 0.344 | 0.800 | 11.6 | 452 |
| Light-emitting device 3-2 | 0.142 | 0.030 | 0.69 | 1.60 | 22.8 | 452 |
| Light-emitting device 3-3 | 0.142 | 0.032 | 1.15 | 2.63 | 36.2 | 453 |

TABLE 9-continued

|  | Chromaticity x | Chromaticity y | Current efficiency (cd/A) | External quantum efficiency (%) | BI | EL_max (nm) |
|---|---|---|---|---|---|---|
| Light-emitting device 3-4 | 0.142 | 0.033 | 2.01 | 4.51 | 60.5 | 453 |
| Light-emitting device 3-5 | 0.142 | 0.036 | 3.25 | 6.95 | 90.1 | 455 |
| Light-emitting device 3-6 | 0.141 | 0.046 | 4.83 | 9.30 | 105 | 457 |
| Light-emitting device 3-7 | 0.139 | 0.061 | 6.19 | 10.3 | 102 | 460 |
| Light-emitting device 3-8 | 0.136 | 0.087 | 7.71 | 10.6 | 89.1 | 465 |

Figure 20:
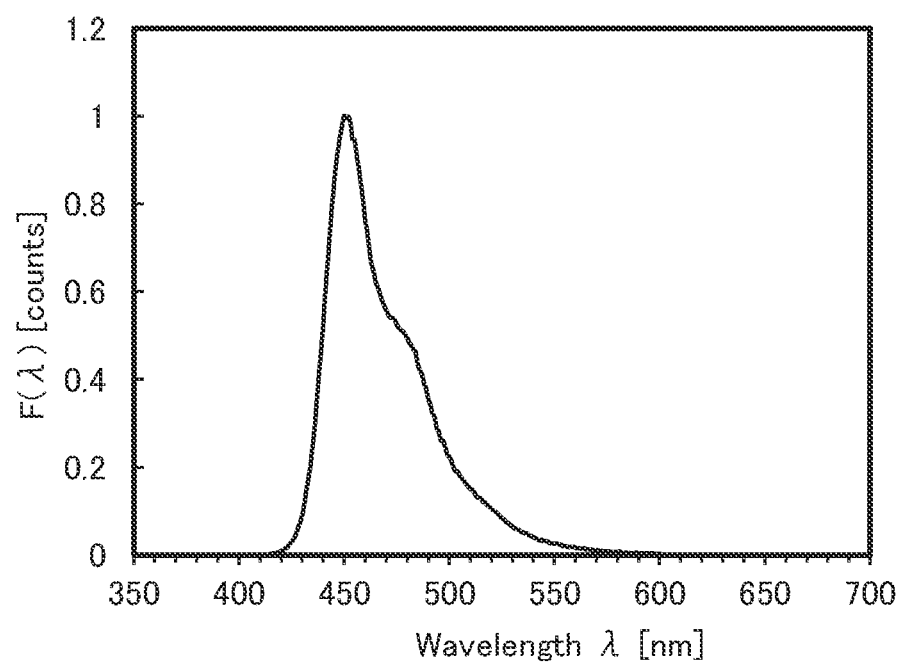
FIG. 20 is a diagram showing an emission spectrum of N,N'-(pyrene-1,6-diyl)bis[(6,N-diphenylbenzo[b]naphtho[1,2-d]furan)-8-amine] (abbreviation: 1,6BnfAPrn-03) in a toluene solution.
Figure 21:
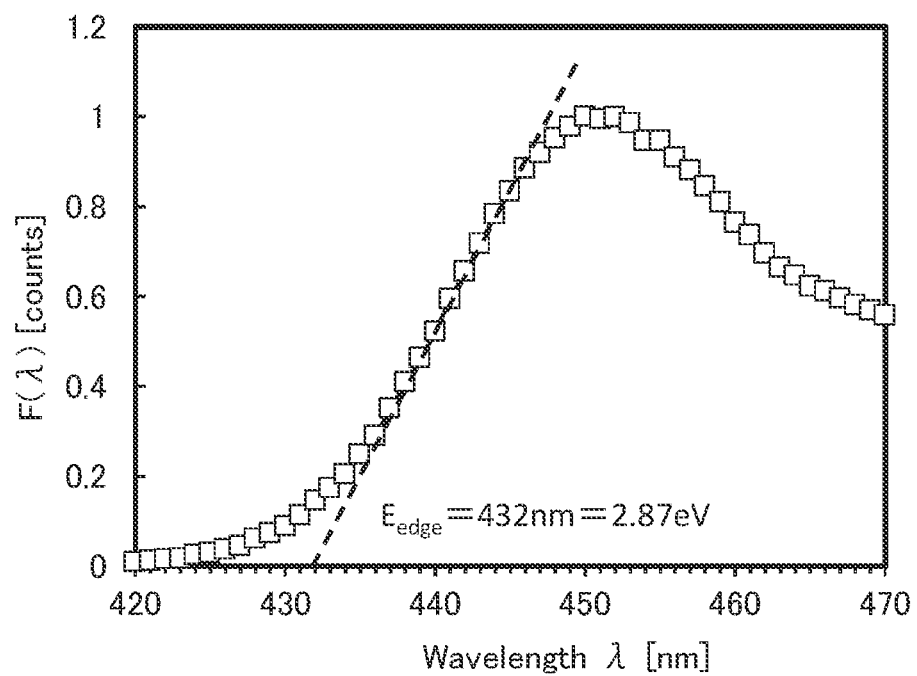
FIG. 21 is a diagram showing a calculation method of an emission edge on a short wavelength side of a PL spectrum of 1,6BnfAPrn-03 in a toluene solution.

FIG. 20 shows a PL spectrum of 1,6BnfAPrn-03 that is an emission center substance in a toluene solution. For measurement of the PL spectrum, a fluorescence spectrophotometer (Edinburgh Instruments FS920 manufactured by Hamamatsu Photonics K.K.) was used, and in calculation of the average photon energy $E_{ave}$, the formula (I) shown in Embodiment 1 was used. By this, the average photon energy ($E_{ave}$) of the PL spectrum of 1,6BnfAPrn-03 in a toluene solution was calculated to be 2.65 eV. Furthermore, the emission edge on the short wavelength side of the PL spectrum was calculated in a manner shown in FIG. 21 to be 432 nm, and its energy was 2.87 eV.

Figure 22:
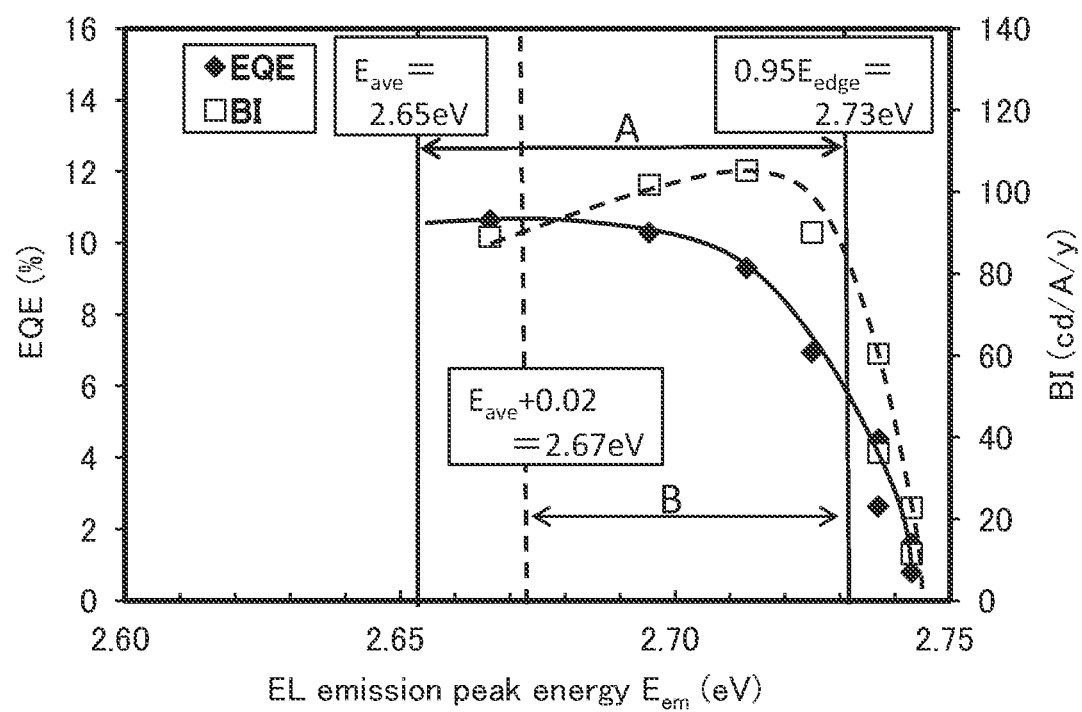
FIG. 22 is a graph showing a relation of external quantum efficiency (EQE) and a blue index (BI) with respect to energy at emission peak ($E_{em}$) in a light-emitting device 3-1 to a light-emitting device 3-8.

FIG. 22 is a graph showing a relation of external quantum efficiency (EQE) and blue index (BI) with respect to the emission peak energy ($E_{em}$) of each light-emitting device. The horizontal axis represents $E_{em}$, and the vertical axes represent EQE and BI.

According to the diagram, both EQE and BI exhibit favorable values in the light-emitting device having a cavity length enabling a value of $E_{em}$ to fall within a range between $E_{ave}$ (2.65 eV in this example) and 2.73 eV.

Note that a value of 2.73 eV is the energy corresponding to 0.95 times $E_{edge}$ as 2.87 eV.

As described above, it was found that the blue light-emitting device with a microcavity structure can emit light with favorable efficiency when the light-emitting device has a cavity length enabling a wavelength corresponding to energy that is higher than or equal to $E_{ave}$ and less than or equal to 0.95 times $E_{edge}$. In other words, the cavity length is controlled to satisfy $E_{ave} \leq E_{em} \leq 0.95 E_{edge}$ (Range A in the drawing), whereby both EQE and BI can be maximized.

In particular, it was found that the light-emitting device whose $E_{em}$ is greater than or equal to $E_{ave}+0.02$ (eV) (2.67 eV in this example) and less than or equal to $E_{edge} \times 0.95$ (eV) is preferable in consideration of BI; thus, the cavity length is preferably controlled to satisfy $E_{ave}+0.02 \leq E_{em} \leq 0.95 E_{edge}$ (Range B in the drawing).

Example 4

In this example, the behavior of external quantum efficiency and blue index (BI) in light-emitting devices with microcavity structures with varied optical path lengths will be described in detail. Structures of organic compounds used in a light-emitting device 4-1 to a light-emitting device 4-4 fabricated in this example are shown below.

[Chemical Formula 6]

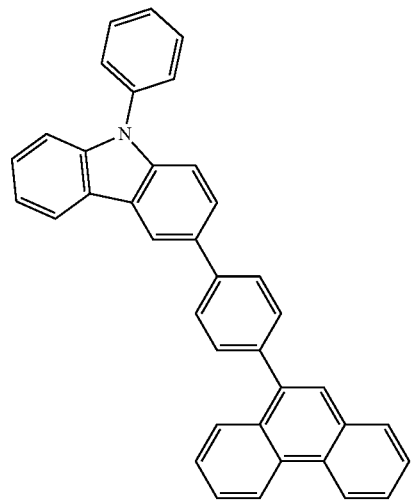

(i) PCPPn

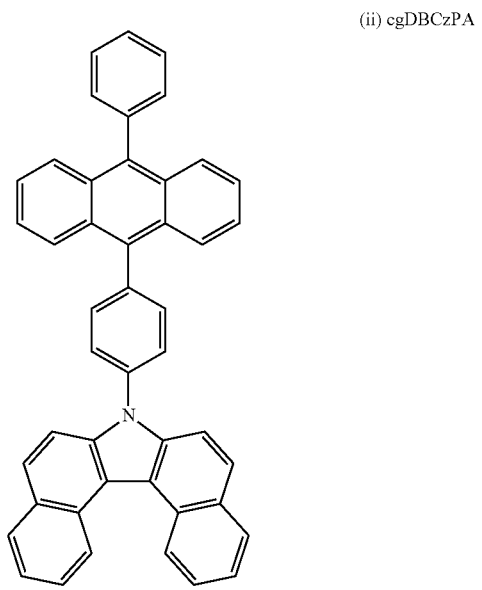

(ii) cgDBCzPA

-continued

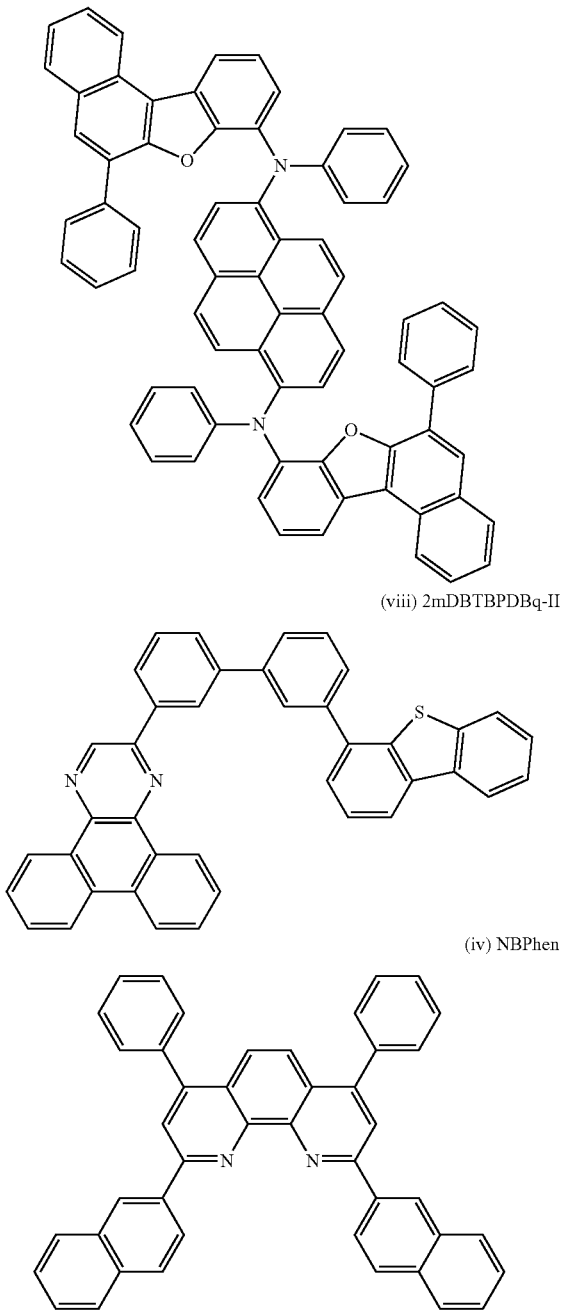

(vii) 1,6BnfAPrn-03

(viii) 2mDBTBPDBq-II (iv) NBPhen

<Method for Fabricating Light-Emitting Device 4-1 to Light-Emitting Device 4-4>

First, over a glass substrate, a film of indium tin oxide containing silicon oxide (ITSO) was formed as a transparent electrode to a thickness of 70 nm, an alloy film of silver (Ag), palladium (Pd), and copper (Cu) (an Ag—Pd—Cu (APC) film) was formed as a semi-transmissive and semi-reflective electrode to a thickness of 25 nm by a sputtering method, and then a film of ITSO was formed as a transparent electrode to a thickness of 10 nm by a sputtering method, so that the first electrode 101 was formed. Note that the area of the electrode was 4 mm² (2 mm×2 mm).

Next, in pretreatment for forming the light-emitting device over the substrate, the surface of the substrate was washed with water and baked at 200° C. for one hour, and then UV ozone treatment was performed for 370 seconds.

After that, the substrate was transferred into a vacuum evaporation apparatus in which the pressure was reduced to about $10^{-4}$ Pa, vacuum baking at 170° C. for 30 minutes was performed in a heating chamber in the vacuum evaporation apparatus, and then the substrate was naturally cooled down for about 30 minutes.

Next, the substrate on which the first electrode 101 was formed was fixed to a substrate holder provided in the vacuum evaporation apparatus such that the side on which the first electrode 101 was formed faced downward, and 3-[4-(9-phenanthryl)-phenyl]-9-phenyl-9H-carbazole (abbreviation: PCPPn) expressed by the above structural formula (i) and molybdenum(VI) oxide were deposited by co-evaporation on the first electrode 101 to have a weight ratio of 1:0.5 (=PCPPn:molybdenum oxide) by an evaporation method, whereby the hole-injection layer 111 was formed.

Variation of the optical path length in the light-emitting devices was achieved by changing the thickness of the hole-injection layer 111. In the light-emitting device 4-1, the thickness of the hole-injection layer 111 was 10 nm; in the light-emitting device 4-2, that was 12.5 nm; in the light-emitting device 4-3, that was 15 nm; and in the light-emitting device 4-4, that was 17.5 nm.

Next, on the hole-injection layer 111, PCPPn was deposited by evaporation to a thickness of 15 nm to form the hole-transport layer 112.

Subsequently, 7-[4-(10-phenyl-9-anthryl)phenyl]-7H-dibenzo[c,g]carbazole (abbreviation: cgDBCzPA) expressed by the structural formula (ii) and N,N'-(pyrene-1,6-diyl)bis [(6,N-diphenylbenzo[b]naphtho[1,2-d]furan)-8-amine] (abbreviation: 1,6BnfAPrn-03) expressed by the structural formula (vii) were deposited to a thickness of 20 nm by co-evaporation at a weight ratio of 1:0.03 (=cgDBCzPA:1, 6BnfAPrn-03), whereby the light-emitting layer 113 was formed.

After that, over the light-emitting layer 113, 2-[3'-(dibenzothiophen-4-yl)biphenyl-3-yl]dibenzo[f,h]quinoxaline (abbreviation: 2mDBTBPDBq-II) expressed by the structural formula (viii) was deposited by evaporation to a thickness of 10 nm, and 2,9-bis(naphthalen-2-yl)-4,7-diphenyl-1,10-phenanthroline (abbreviation: NBPhen) expressed by the structural formula (iv) was deposited by evaporation to a thickness of 10 nm, whereby the electron-transport layer 114 was formed.

After the formation of the electron-transport layer 114, lithium fluoride (LiF) was deposited by evaporation to a thickness of 1 nm to form the electron-injection layer 115, and then aluminum was deposited by evaporation to a thickness of 120 nm to form the second electrode 102, whereby the light-emitting device 4-1 to the light-emitting device 4-4 of this example were fabricated. Note that the second electrode 102 is an electrode that reflects light, and the light-emitting devices of this example are bottom-emission devices from which light is extracted through the first electrode 101.

The device structures of the light-emitting device 4-1 to the light-emitting device 4-4 are listed in Table 10 and Table 11. Table 11 shows the thickness of the hole-injection layer in each light-emitting device.

TABLE 10

| Organic cap layer | Al | 120 nm |
|---|---|---|
| Semi-transmissive and semi-reflective electrode | LiF | 1 nm |
| Electron-injection layer | NBPhen | 10 nm |
| Electron-transport layer | 2mDBTBPDBq-II | 10 nm |
| | cgDBCzPA:1,6BnfAPrn-03 (1:0.03) | 20 nm |
| Light-emitting layer | PCPPn | 15 nm |
| Hole-transport layer | PCPPn:MoOx (1:0.5) | x nm |
| Hole-injection layer | ITSO | 10 nm |
| Transparent electrode | APC | 25 nm |
| Reflective electrode | ITSO | 70 nm |

TABLE 11

| | Thickness (nm) |
|---|---|
| Light-emitting device 4-1 | 10 |
| Light-emitting device 4-2 | 12.5 |
| Light-emitting device 4-3 | 15 |
| Light-emitting device 4-4 | 17.5 |

Each of the fabricated light-emitting devices was sealed using a glass substrate (a sealant was applied to surround the device, followed by UV treatment and one-hour heat treatment at 80° C. at the time of sealing) in a glove box containing a nitrogen atmosphere so that the light-emitting device is not exposed to the air, and then measurements were carried out. Note that the measurement was performed at room temperature.

Measurement results of the light-emitting device 4-1 to the light-emitting device 4-4 are shown below. All measurement results are represented as values at luminance around 1000 cd/m². In addition, the external quantum efficiency is uncorrected quantum efficiency calculated from front luminance on the assumption of Lambertian distribution.

TABLE 12

| | Chromaticity x | Chromaticity y | Current efficiency (cd/A) | External quantum efficiency (%) | BI | EL_max (nm) |
|---|---|---|---|---|---|---|
| Light-emitting device 4-1 | 0.141 | 0.039 | 4.13 | 8.15 | 105 | 453 |
| Light-emitting device 4-2 | 0.140 | 0.044 | 5.55 | 10.6 | 127 | 455 |
| Light-emitting device 4-3 | 0.139 | 0.052 | 6.66 | 11.6 | 129 | 459 |
| Light-emitting device 4-4 | 0.138 | 0.074 | 8.41 | 12.5 | 114 | 462 |

Figure 23:
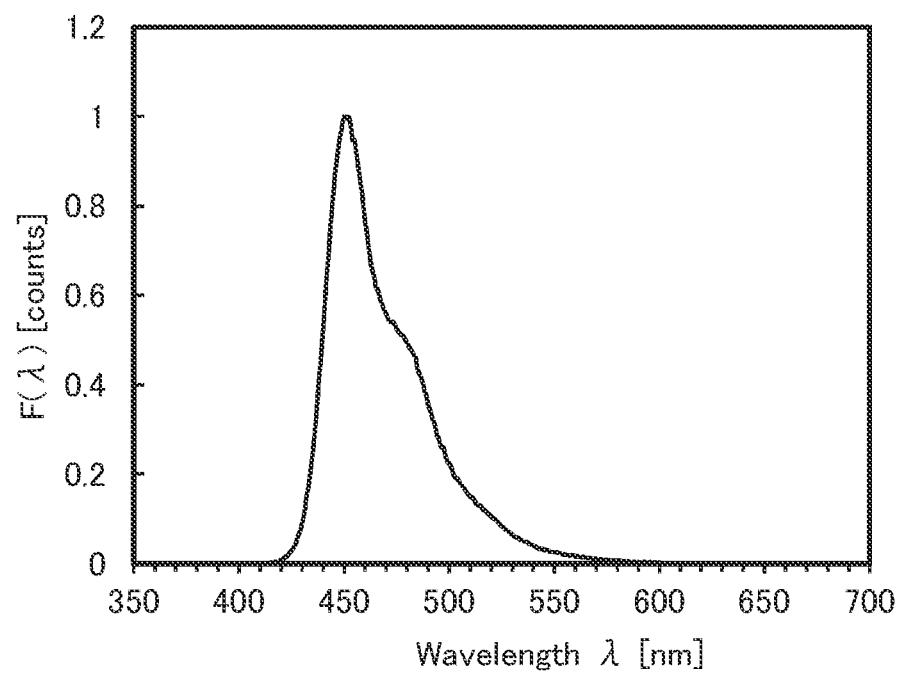
FIG. 23 is a diagram showing an emission spectrum of N,N'-(pyrene-1,6-diyl)bis[(6,N-diphenylbenzo[b]naphtho[1,2-d]furan)-8-amine] (abbreviation: 1,6BnfAPrn-03) in a toluene solution.
Figure 24:
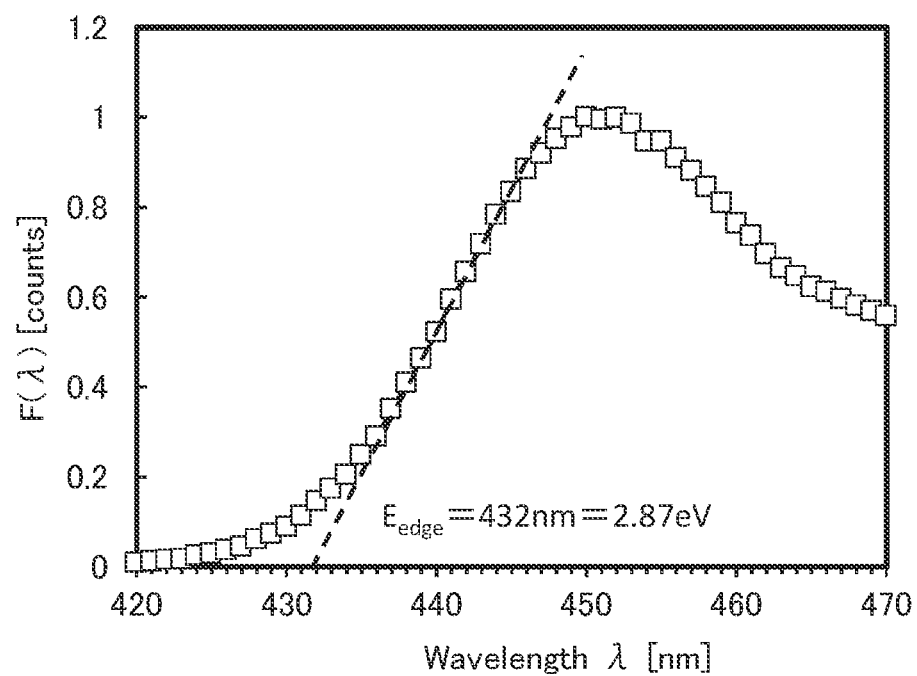
FIG. 24 is a diagram showing a calculation method of an emission edge on a short wavelength side of a PL spectrum of 1,6BnfAPrn-03 in a toluene solution.

FIG. 23 shows a PL spectrum of 1,6BnfAPrn-03 that is an emission center substance in a toluene solution. For measurement of the PL spectrum, a fluorescence spectrophotometer (Edinburgh Instruments FS920 manufactured by Hamamatsu Photonics K.K.) was used, and in calculation of the average photon energy $E_{ave}$, the formula (I) shown in Embodiment 1 was used. By this, the average photon energy ($E_{ave}$) of the PL spectrum of 1,6BnfAPrn-03 in the toluene solution was calculated to be 2.65 eV. Furthermore, the emission edge on the short wavelength side of the PL spectrum was calculated in a manner shown in FIG. 24 to be 432 nm, and its energy was 2.87 eV.

Figure 25:
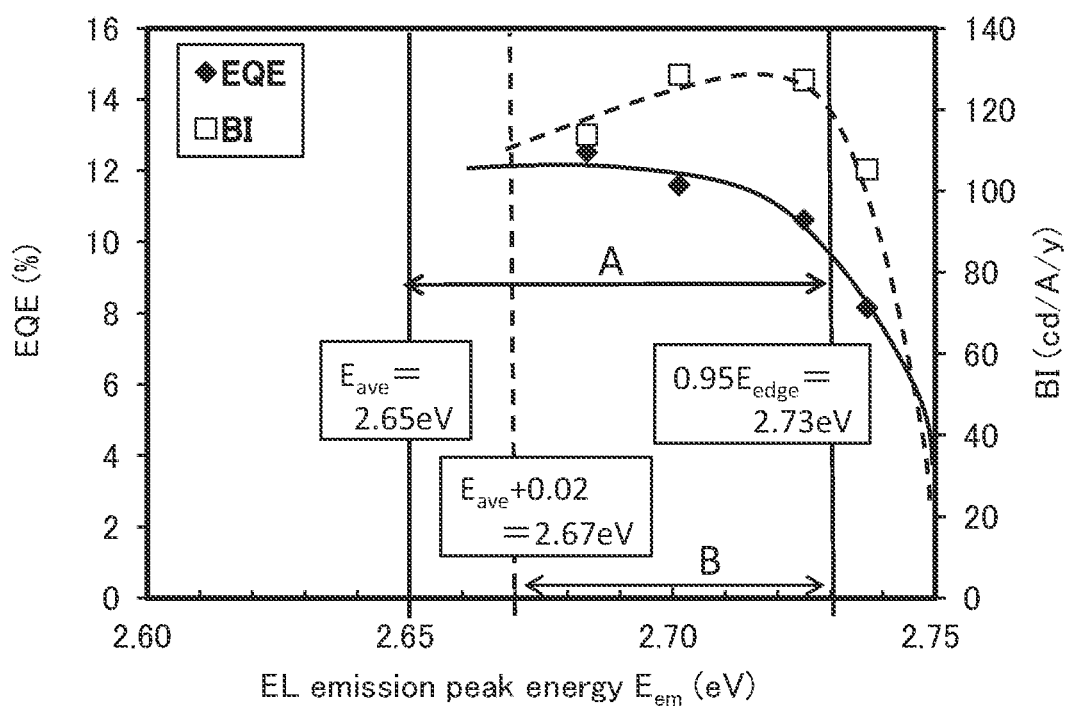
FIG. 25 is a graph showing a relation of external quantum efficiency (EQE) and a blue index (BI) with respect to energy at emission peak ($E_{em}$) in a light-emitting device 4-1 to a light-emitting device 4-4.

FIG. 25 is a graph showing a relation of external quantum efficiency (EQE) and blue index (BI) with respect to the emission peak energy ($E_{em}$) of each light-emitting device. The horizontal axis represents $E_{em}$, and the vertical axes represent EQE and BI.

According to the diagram, both EQE and BI exhibit favorable values in the light-emitting device having a cavity length enabling a value of $E_{em}$ to fall within a range between $E_{ave}$ (2.65 eV in this example) and 2.73 eV.

Note that a value of 2.73 eV is the energy corresponding to 0.95 times $E_{edge}$ as 2.87 eV.

As described above, it was found that the blue light-emitting device with a microcavity structure can emit light with favorable efficiency when the light-emitting device has a cavity length enabling a wavelength corresponding to energy that is higher than or equal to $E_{ave}$ and less than or equal to 0.95 times $E_{edge}$. In other words, the cavity length is controlled to satisfy $E_{ave} \leq E_{em} \leq 0.95 E_{edge}$ (Range A in the drawing), whereby both EQE and BI can be maximized.

In particular, it was found that the light-emitting device whose $E_{em}$ is greater than or equal to $E_{ave}$+0.02 (eV) (2.67 eV in this example) and less than or equal to $E_{edge} \times 0.95$ (eV) is preferable in consideration of BI; thus, the cavity length is preferably controlled to satisfy $E_{ave}+0.02 \leq E_{em} \leq 0.95 E_{edge}$ (Range B in the drawing).

Example 5

In this example, the behavior of external quantum efficiency and blue index (BI) in light-emitting devices with microcavity structures with varied optical path lengths will be described in detail. Structures of organic compounds used in a light-emitting device 5-1 to a light-emitting device 5-8 fabricated in this example are shown below.

[Chemical Formula 7]

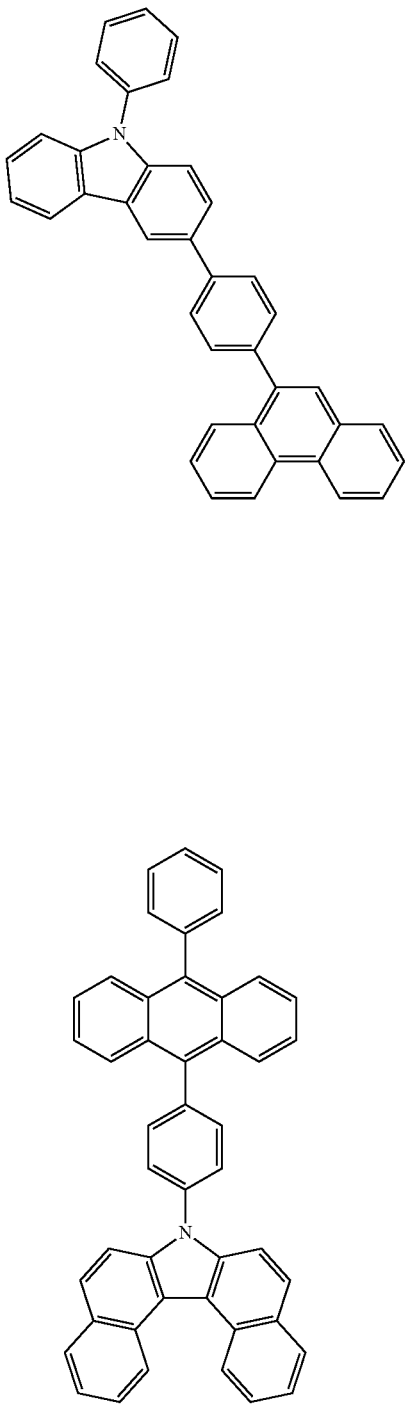

(i) PCPPn (ii) cgDBCzPA

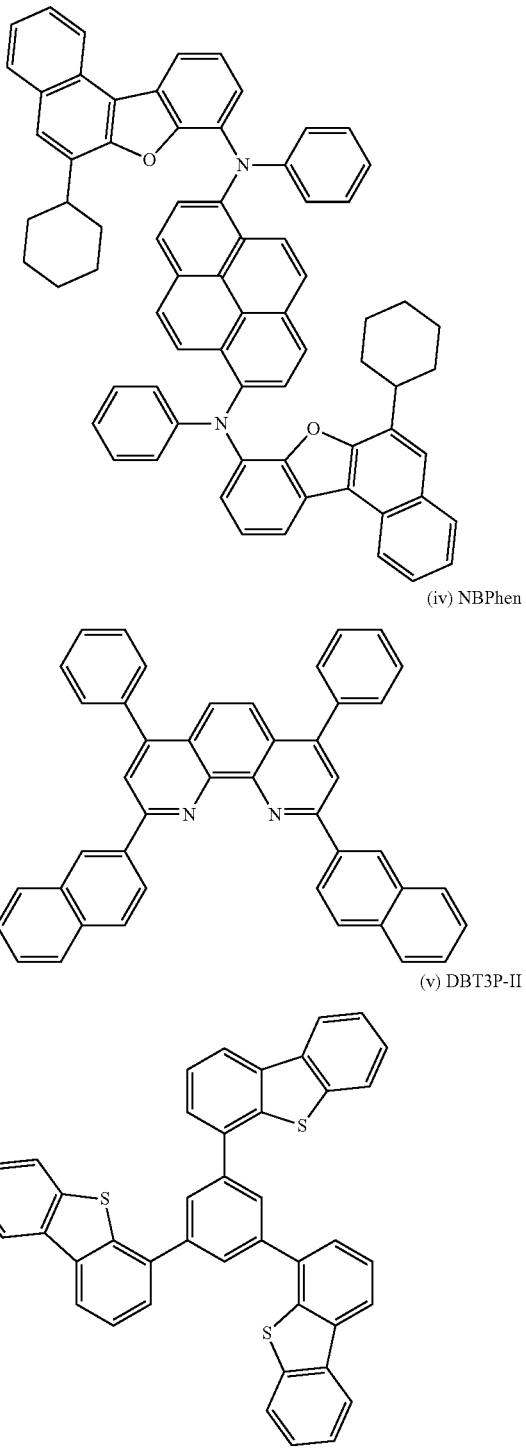

(ix) 1,6chBnfAPm (iv) NBPhen (v) DBT3P-II

<Method for Fabricating Light-Emitting Device 5-1 to Light-Emitting Device 5-8>

First, over a glass substrate, an alloy film of silver (Ag), palladium (Pd), and copper (Cu) (an Ag—Pd—Cu (APC) film) was formed as a reflective electrode to a thickness of 100 nm by a sputtering method, and a film of indium tin oxide containing silicon oxide (ITSO) was formed as a transparent electrode to a thickness of 85 nm by a sputtering method, so that the first electrode 101 was formed. Note that the area of the electrode was 4 mm² (2 mm×2 mm).

Next, in pretreatment for forming the light-emitting device over the substrate, the surface of the substrate was washed with water and baked at 200° C. for one hour, and then UV ozone treatment was performed for 370 seconds.

After that, the substrate was transferred into a vacuum evaporation apparatus in which the pressure was reduced to about $10^{-4}$ Pa, vacuum baking at 170° C. for 30 minutes was performed in a heating chamber in the vacuum evaporation apparatus, and then the substrate was naturally cooled down for about 30 minutes.

Next, the substrate on which the first electrode 101 was formed was fixed to a substrate holder provided in the vacuum evaporation apparatus such that the side on which the first electrode 101 was formed faced downward, and 3-[4-(9-phenanthryl)-phenyl]-9-phenyl-9H-carbazole (abbreviation: PCPPn) expressed by the above structural formula (i) and molybdenum(VI) oxide were deposited by co-evaporation on the first electrode 101 to have a weight ratio of 1:0.5 (=PCPPn:molybdenum oxide) by an evaporation method, whereby the hole-injection layer 111 was formed.

Variation of the optical path length in the light-emitting devices was achieved by changing the thickness of the hole-injection layer 111. In the light-emitting device 5-1, the thickness of the hole-injection layer 111 was 10 nm; in the light-emitting device 5-2, that was 15 nm; in the light-emitting device 5-3, that was 20 nm; in the light-emitting device 5-4, that was 25 nm; in the light-emitting device 5-5, that was 30 nm; in the light-emitting device 5-6, that was 35 nm; in the light-emitting device 5-7, that was 40 nm; and in the light-emitting device 5-8, that was 45 nm.

Next, on the hole-injection layer 111, PCPPn was deposited by evaporation to a thickness of 15 nm to form the hole-transport layer 112.

Subsequently, 7-[4-(10-phenyl-9-anthryl)phenyl]-7H-dibenzo[c,g]carbazole (abbreviation: cgDBCzPA) expressed by the structural formula (ii) and N,N'-(pyrene-1,6-diyl)bis (N-phenyl-6-cyclohexylbenzo[b]naphtho[1,2-d]furan-8-amine) (abbreviation: 1,6chBnfAPrn) expressed by the above structural formula (ix) were deposited to a thickness of 25 nm by co-evaporation at a weight ratio of 1:0.03 (=cgDBCzPA:1,6chBnfAPrn), whereby the light-emitting layer 113 was formed.

After that, on the light-emitting layer 113, cgDBCzPA was deposited by evaporation to a thickness of 5 nm, and 2,9-bis(naphthalen-2-yl)-4,7-diphenyl-1,10-phenanthroline (abbreviation: NBPhen) expressed by the above structural formula (iv) was deposited by evaporation to a thickness of 15 nm, whereby the electron-transport layer 114 was formed.

After the formation of the electron-transport layer 114, lithium fluoride (LiF) was deposited by evaporation to a thickness of 1 nm to form the electron-injection layer 115, and silver (Ag) and magnesium (Mg) in a volume ratio of 1:0.1 were deposited by evaporation to a thickness of 10 nm to form the second electrode 102, whereby the light-emitting device 5-1 to the light-emitting device 5-8 were fabricated. Note that the second electrode 102 is a semi-transmissive and semi-reflective electrode having a function of reflecting light and a function of transmitting light, and the light-emitting devices of this example are top-emission devices from which light is extracted through the second electrode 102. In addition, 1,3,5-tri(dibenzothiophen-4-yl)-benzene (abbreviation: DBT3P-II) expressed by the above structural formula (v) was deposited by evaporation to a thickness of 70 nm on the second electrode 102, whereby the extraction efficiency was improved.

The device structures of the light-emitting device 5-1 to the light-emitting device 5-8 are listed in Table 13 and Table 14. Table 14 shows the thickness of the hole-injection layer in each light-emitting device.

TABLE 13

| | | |
|---|---|---|
| Organic cap layer | DBT3P-II | 70 nm |
| Semi-transmissive and semi-reflective electrode | Ag:Mg (1:0.1) | 10 nm |
| Electron-injection layer | LiF | 1 nm |
| Electron-transport layer | NBPhen | 15 nm |
| | cgDBCzPA | 5 nm |
| Light-emitting layer | cgDBCzPA:1,6chBnfAPrn (1:0.03) | 25 nm |
| Hole-transport layer | PCPPn | 15 nm |
| Hole-injection layer | PCPPn:MoOx (1:0.5) | x nm |
| Transparent electrode | ITSO | 85 nm |
| Reflective electrode | APC | 100 nm |

TABLE 14

| | Thickness (nm) |
|---|---|
| Light-emitting device 5-1 | 10 |
| Light-emitting device 5-2 | 15 |
| Light-emitting device 5-3 | 20 |
| Light-emitting device 5-4 | 25 |
| Light-emitting device 5-5 | 30 |
| Light-emitting device 5-6 | 35 |
| Light-emitting device 5-7 | 40 |
| Light-emitting device 5-8 | 45 |

Each of the fabricated light-emitting devices was sealed using a glass substrate (a sealant was applied to surround the device, followed by UV treatment and one-hour heat treatment at 80° C. at the time of sealing) in a glove box containing a nitrogen atmosphere so that the light-emitting device is not exposed to the air, and then measurements were carried out. Note that the measurement was performed at room temperature.

Measurement results of the light-emitting device 5-1 to the light-emitting device 5-8 are shown below. All measurement results are represented as values at luminance around 1000 cd/m². In addition, the external quantum efficiency is uncorrected quantum efficiency calculated from front luminance on the assumption of Lambertian distribution.

TABLE 15

| | Chromaticity x | Chromaticity y | Current efficiency (cd/A) | External quantum efficiency (%) | BI | EL_max (nm) |
|---|---|---|---|---|---|---|
| Light-emitting device 5-1 | 0.142 | 0.032 | 0.735 | 1.70 | 23.3 | 453 |
| Light-emitting device 5-2 | 0.142 | 0.034 | 1.39 | 3.13 | 41.6 | 453 |

TABLE 15-continued

|  | Chromaticity x | Chromaticity y | Current efficiency (cd/A) | External quantum efficiency (%) | BI | EL_max (nm) |
|---|---|---|---|---|---|---|
| Light-emitting device 5-3 | 0.142 | 0.035 | 2.28 | 4.93 | 65.0 | 452 |
| Light-emitting device 5-4 | 0.141 | 0.040 | 3.50 | 7.15 | 88.5 | 453 |
| Light-emitting device 5-5 | 0.140 | 0.045 | 4.86 | 9.22 | 109 | 455 |
| Light-emitting device 5-6 | 0.138 | 0.058 | 6.72 | 11.2 | 117 | 458 |
| Light-emitting device 5-7 | 0.138 | 0.078 | 8.32 | 11.9 | 107 | 460 |
| Light-emitting device 5-8 | 0.135 | 0.103 | 9.52 | 11.6 | 92.1 | 463 |

Figure 26:
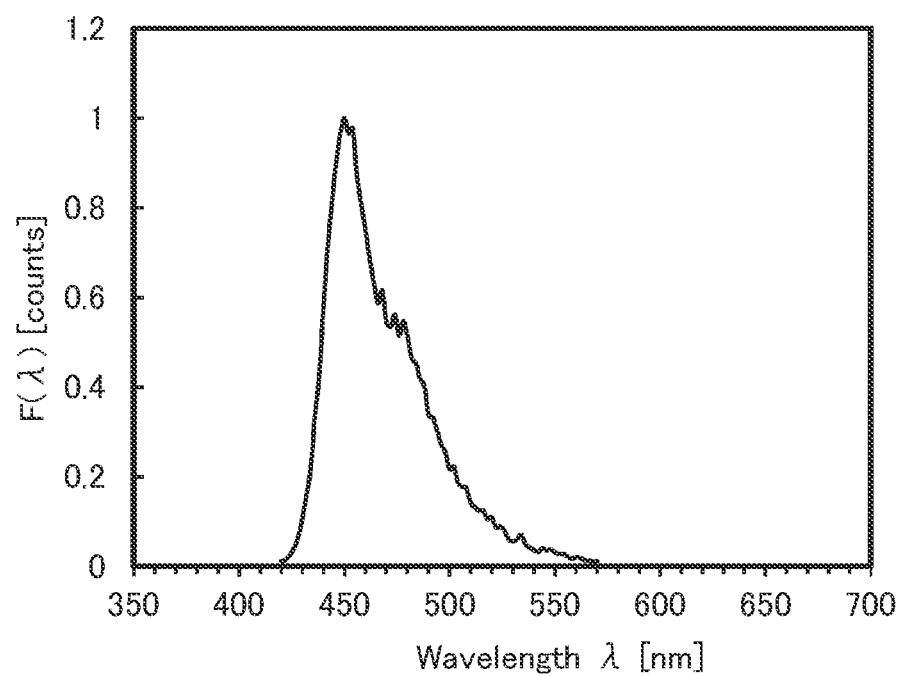
FIG. 26 is a diagram showing an emission spectrum of N,N'-(pyrene-1,6-diyl)bis(N-phenyl-6-cyclohexylbenzo[b]naphtho[1,2-d]furan-8-amine) (abbreviation: 1,6chBnfAPrn) in a toluene solution.
Figure 27:
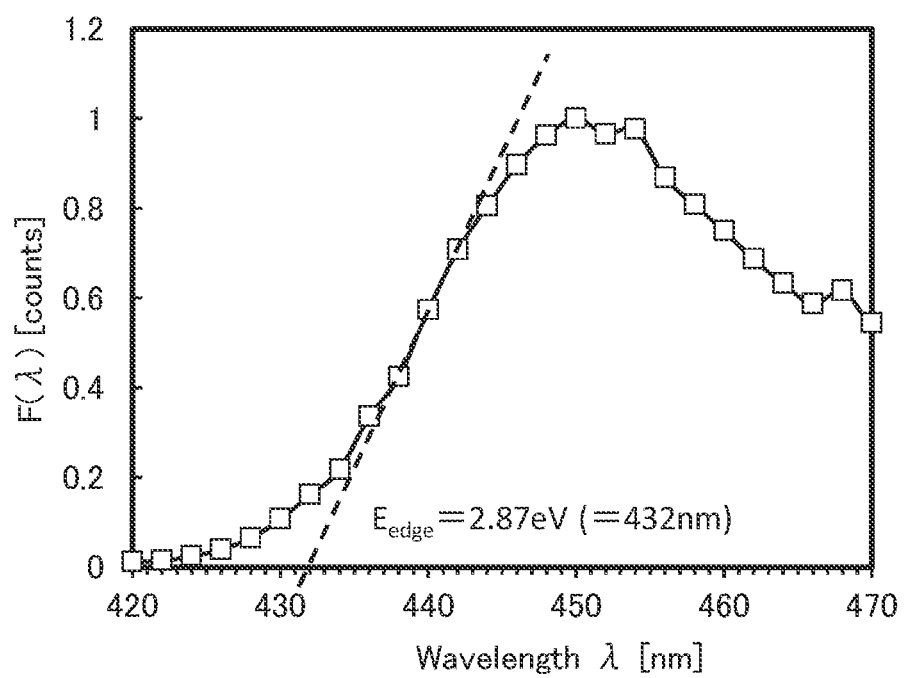
FIG. 27 is a diagram showing a calculation method of an emission edge on a short wavelength side of a PL spectrum of 1,6chBnfAPrn in a toluene solution.

FIG. 26 shows a PL spectrum of 1,6chBnfAPrn that is an emission center substance in a toluene solution. For measurement of the PL spectrum, a fluorescence spectrophotometer (Edinburgh Instruments FS920 manufactured by Hamamatsu Photonics K.K.) was used, and in calculation of the average photon energy $E_{ave}$, the formula (I) shown in Embodiment 1 was used. By this, the average photon energy ($E_{ave}$) of the PL spectrum of 1,6chBnfAPrn in the toluene solution was calculated to be 2.65 eV. Furthermore, the emission edge on the short wavelength side of the PL spectrum was calculated in a manner shown in FIG. 27 to be 432 nm, and its energy was 2.87 eV.

Figure 28:
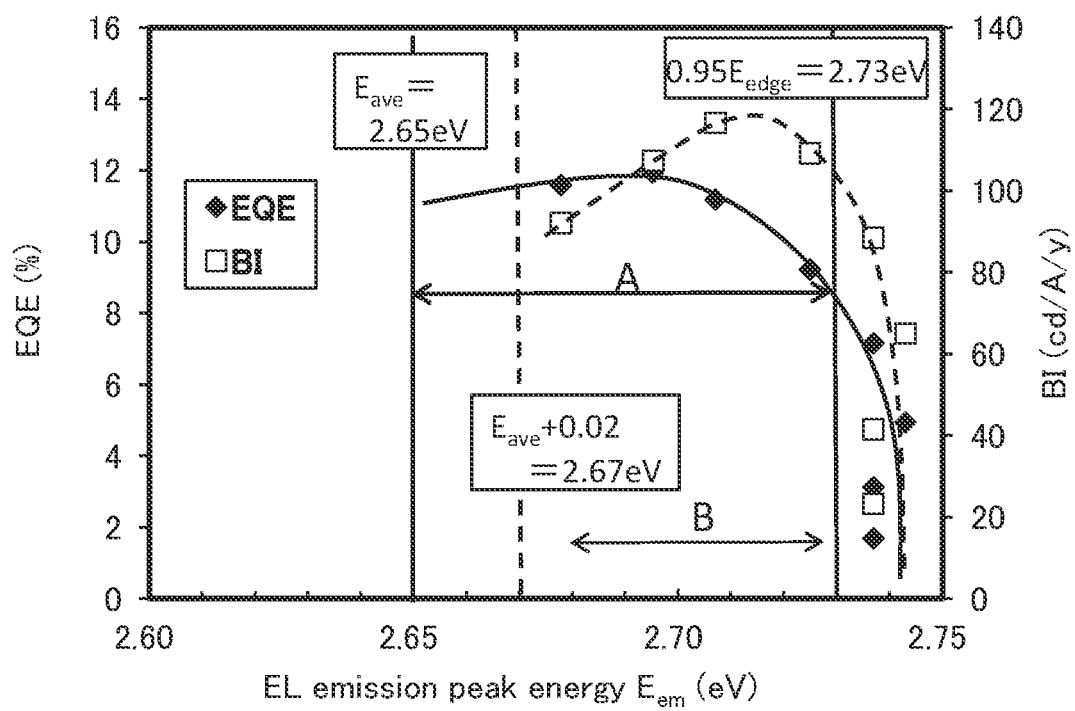
FIG. 28 is a graph showing a relation of external quantum efficiency (EQE) and a blue index (BI) with respect to energy at emission peak ($E_{em}$) in a light-emitting device 5-1 to a light-emitting device 5-8.

FIG. 28 is a graph showing a relation of external quantum efficiency (EQE) and blue index (BI) with respect to the emission peak energy ($E_{em}$) of each light-emitting device. The horizontal axis represents $E_{em}$, and the vertical axes represent EQE and BI.

According to the diagram, both EQE and BI exhibit favorable values in the light-emitting device having a cavity length enabling a value of $E_{em}$ to fall within a range between $E_{ave}$ (2.65 eV in this example) and 2.73 eV.

Note that a value of 2.73 eV is the energy corresponding to 0.95 times $E_{edge}$ as 2.87 eV.

As described above, it was found that the blue light-emitting device with a microcavity structure can emit light with favorable efficiency when the light-emitting device has a cavity length enabling a wavelength corresponding to energy that is higher than or equal to $E_{ave}$ and less than or equal to 0.95 times $E_{edge}$. In other words, the cavity length is controlled to satisfy $E_{ave} \leq E_{em} \leq 0.95 E_{edge}$ (Range A in the drawing), whereby both EQE and BI can be maximized.

In particular, it was found that the light-emitting device whose $E_{em}$ is greater than or equal to $E_{ave}+0.02$ (eV) (2.67 eV in this example) and less than or equal to $E_{edge} \times 0.95$ (eV) is preferable in consideration of BI; thus, the cavity length is preferably controlled to satisfy $E_{ave}+0.02 \leq E_{em} \leq 0.95 E_{edge}$ (Range B in the drawing).

Example 6

In this example, the behavior of external quantum efficiency and blue index (BI) in light-emitting devices with microcavity structures with varied optical path lengths will be described in detail. Structures of organic compounds used in a light-emitting device 6-1 to a light-emitting device 6-8 fabricated in this example are shown below.

[Chemical Formula 8]

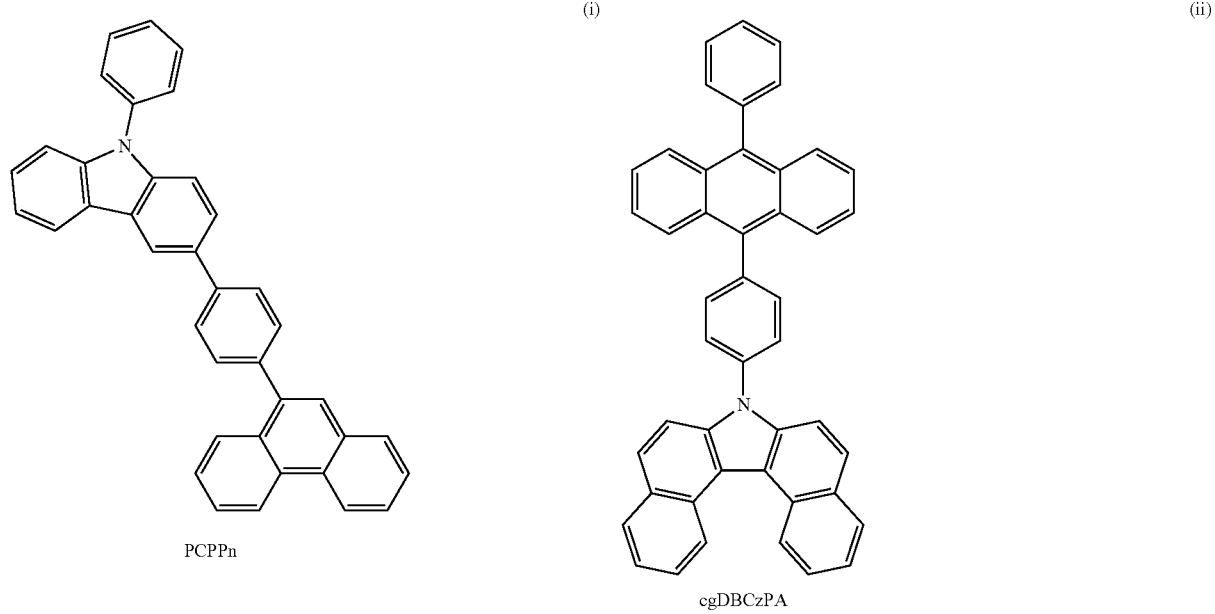

(i) PCPPn (ii) cgDBCzPA

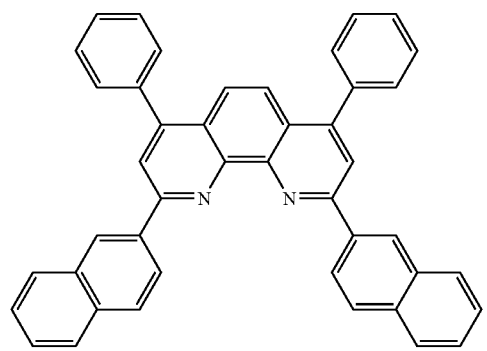

NBPhen

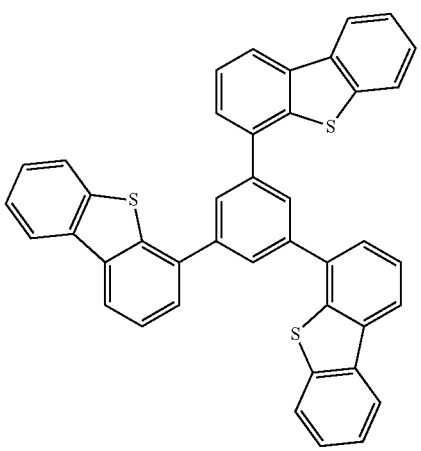

DBT3P-II

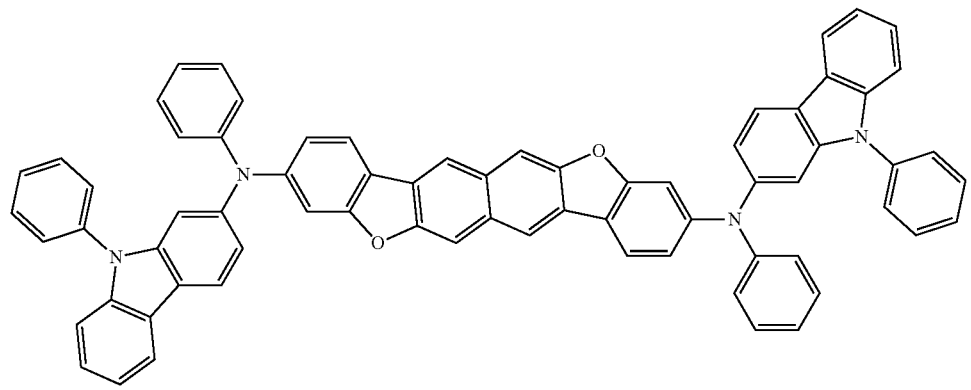

3,10PCA2Nbf(IV)-02

<Method for Fabricating Light-Emitting Device 6-1 to Light-Emitting Device 6-8>

First, over a glass substrate, an alloy film of silver (Ag), palladium (Pd), and copper (Cu) (an Ag—Pd—Cu (APC) film) was formed as a reflective electrode to a thickness of 100 nm by a sputtering method, and a film of indium tin oxide containing silicon oxide (ITSO) was formed as a transparent electrode to a thickness of 85 nm by a sputtering method, so that the first electrode 101 was formed. Note that the area of the electrode was 4 mm$^2$ (2 mm×2 mm).

Next, in pretreatment for forming the light-emitting device over the substrate, the surface of the substrate was washed with water and baked at 200° C. for one hour, and then UV ozone treatment was performed for 370 seconds.

After that, the substrate was transferred into a vacuum evaporation apparatus in which the pressure was reduced to about $10^{-4}$ Pa, vacuum baking at 170° C. for 30 minutes was performed in a heating chamber in the vacuum evaporation apparatus, and then the substrate was naturally cooled down for about 30 minutes.

Next, the substrate on which the first electrode 101 was formed was fixed to a substrate holder provided in the vacuum evaporation apparatus such that the side on which the first electrode 101 was formed faced downward, and 3-[4-(9-phenanthryl)-phenyl]-9-phenyl-9H-carbazole (abbreviation: PCPPn) expressed by the above structural formula (i) and molybdenum(VI) oxide were deposited by co-evaporation on the first electrode 101 to have a weight ratio of 1:0.5 (=PCPPn: molybdenum oxide) by an evaporation method, whereby the hole-injection layer 111 was formed.

Variation of the optical path length in the light-emitting devices was achieved by changing the thickness of the hole-injection layer 111. In the light-emitting device 6-1, the thickness of the hole-injection layer 111 was 10 nm; in the light-emitting device 6-2, that was 15 nm; in the light-emitting device 6-3, that was 20 nm: in the light-emitting device 6-4, that was 25 nm: in the light-emitting device 6-5, that was 30 nm; in the light-emitting device 6-6, that was 35 nm; in the light-emitting device 6-7, that was 40 nm; and in the light-emitting device 6-8, that was 45 nm.

Next, on the hole-injection layer 111, PCPPn was deposited by evaporation to a thickness of 15 nm to form the hole-transport layer 112.

Subsequently, 7-[4-(10-phenyl-9-anthryl)phenyl]-7H-dibenzo[c,g]carbazole (abbreviation: cgDBCzPA) expressed by the above structural formula (ii) and 3,10-bis[N-(9-phenyl-9H-carbazol-2-yl)-N-phenylamino]naphtho[2,3-b;6,7-b']bisbenzofuran (abbreviation: 3,10PCA2Nbf(IV)-02) expressed by the above structural formula (x) were deposited by co-evaporation to have a weight ratio of 1:0.01 (=cgDBCzPA: 3,10PCA2Nbf(IV)-02) to a thickness of 25 nm, whereby the light-emitting layer 113 was formed.

After that, on the light-emitting layer 113, cgDBCzPA was deposited by evaporation to a thickness of 5 nm, and 2,9-bis(naphthalen-2-yl)-4,7-diphenyl-1,10-phenanthroline (abbreviation: NBPhen) expressed by the above structural formula (iv) was deposited by evaporation to a thickness of 15 nm, whereby the electron-transport layer 114 was formed.

After the formation of the electron-transport layer 114, lithium fluoride (LiF) was deposited by evaporation to a thickness of 1 nm to form the electron-injection layer 115, and silver (Ag) and magnesium (Mg) in a volume ratio of 1:0.1 (=Ag:Mg) were deposited by evaporation to a thickness of 10 nm to form the second electrode 102, whereby the light-emitting device 6-1 to the light-emitting device 6-8 were fabricated. Note that the second electrode 102 is a semi-transmissive and semi-reflective electrode having a function of reflecting light and a function of transmitting light, and the light-emitting devices of this example are top-emission devices from which light is extracted through the second electrode 102. In addition, 1,3,5-tri(dibenzothiophen-4-yl)-benzene (abbreviation: DBT3P-II) expressed by the above structural formula (v) was deposited by evaporation to a thickness of 70 nm on the second electrode 102, whereby the extraction efficiency was improved.

The device structures of the light-emitting device 6-1 to the light-emitting device 6-8 are listed in Table 16 and Table 17. Table 17 shows the thickness of the hole-injection layer in each light-emitting device.

TABLE 16

| | | |
|---|---|---|
| Organic cap layer | DBT3P-II | 70 nm |
| Semi-transmissive and semi-reflective electrode | Ag:Mg (1:0.1) | 10 nm |
| Electron-injection layer | LiF | 1 nm |
| Electron-transport layer | NBPhen | 15 nm |
| | cgDBCzPA | 5 nm |

TABLE 16-continued

| | | |
|---|---|---|
| Light-emitting layer | cgDBCzPA:3,10PCA2Nbf(IV)-02 (1:0.01) | 25 nm |
| Hole-transport layer | PCPPn | 15 nm |
| Hole-injection layer | PCPPn:MoOx (1:0.5) | x nm |
| Transparent electrode | ITSO | 85 nm |
| Reflective electrode | APC | 100 nm |

TABLE 17

| | Thickness (nm) |
|---|---|
| Light-emitting device 6-1 | 10 |
| Light-emitting device 6-2 | 15 |
| Light-emitting device 6-3 | 20 |
| Light-emitting device 6-4 | 25 |
| Light-emitting device 6-5 | 30 |
| Light-emitting device 6-6 | 35 |
| Light-emitting device 6-7 | 40 |
| Light-emitting device 6-8 | 45 |

Each of the fabricated light-emitting devices was sealed using a glass substrate (a sealant was applied to surround the device, followed by UV treatment and one-hour heat treatment at 80° C. at the time of sealing) in a glove box containing a nitrogen atmosphere so that the light-emitting device is not exposed to the air, and then measurements were carried out. Note that the measurement was performed at room temperature.

Measurement results of the light-emitting device 6-1 to the light-emitting device 6-8 are shown below. All measurement results are represented as values at luminance around 1000 cd/m$^2$. In addition, the external quantum efficiency is uncorrected quantum efficiency calculated from front luminance on the assumption of Lambertian distribution.

TABLE 18

| | Chromaticity x | Chromaticity y | Current efficiency (cd/A) | External quantum efficiency (%) | BI | EL_max (nm) |
|---|---|---|---|---|---|---|
| Light-emitting device 6-1 | 0.145 | 0.036 | 0.433 | 0.897 | 11.9 | 454 |
| Light-emitting device 6-2 | 0.142 | 0.036 | 0.857 | 1.84 | 23.7 | 454 |
| Light-emitting device 6-3 | 0.141 | 0.039 | 1.63 | 3.42 | 42.0 | 454 |
| Light-emitting device 6-4 | 0.141 | 0.041 | 2.68 | 5.42 | 65.8 | 454 |
| Light-emitting device 6-5 | 0.140 | 0.044 | 4.07 | 7.93 | 92.8 | 455 |
| Light-emitting device 6-6 | 0.140 | 0.049 | 5.41 | 9.84 | 111 | 455 |
| Light-emitting device 6-7 | 0.139 | 0.056 | 7.16 | 11.9 | 127 | 458 |
| Light-emitting device 6-8 | 0.138 | 0.078 | 8.80 | 12.7 | 114 | 460 |

Figure 29:
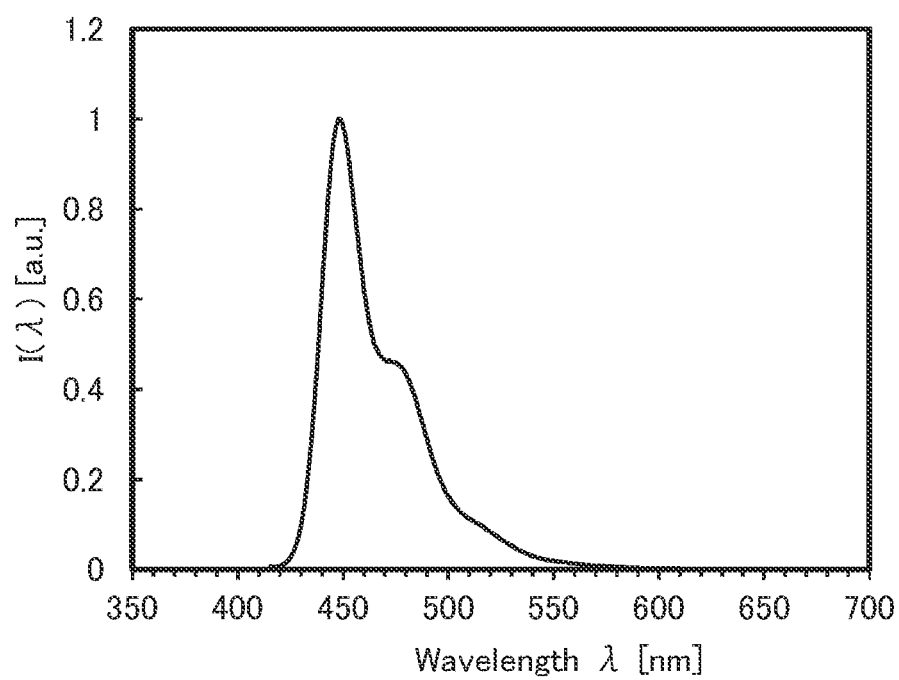
FIG. 29 is a diagram showing an emission spectrum of 3,10-bis[N-(9-phenyl-9H-carbazol-2-yl)-N-phenylamino]naphtho[2,3-b;6,7-b']bisbenzofuran (abbreviation: 3,10PCA2Nbf(IV)-02) in a toluene solution.
Figure 30:
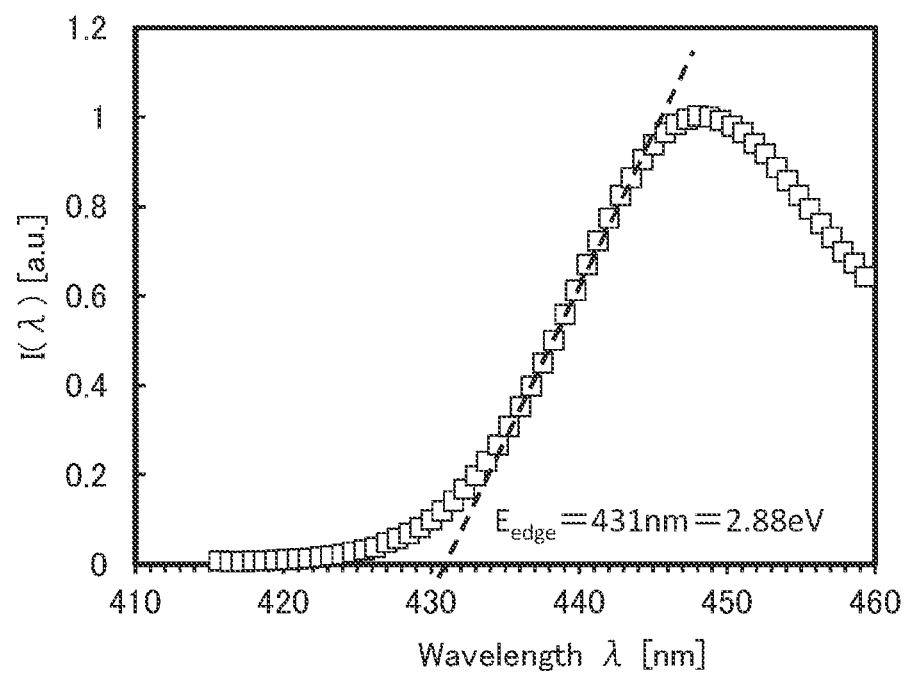
FIG. 30 is a diagram showing a calculation method of an emission edge on a short wavelength side of a PL spectrum of 3,10PCA2Nbf(IV)-02 in a toluene solution.

FIG. 29 shows a PL spectrum of 3,10PCA2Nbf(IV)-02 that is an emission center substance in a toluene solution. For measurement of the PL spectrum, an absolute PL quantum yield measurement system (Quantaurus-QY manufactured by Hamamatsu Photonics K.K.) was used, and in calculation of the average photon energy $E_{ave}$, the formula (VII) shown in Embodiment 1 was used because the vertical axis of the PL spectrum shown in FIG. 29 represents a normalized spectrum $I(\lambda)$ proportional to energy $\phi_p(\lambda)$. By this, the average photon energy ($E_{ave}$) of the PL spectrum of 3,10PCA2Nbf(IV)-02 in the toluene solution was calculated to be 2.66 eV. Furthermore, the emission edge on the short wavelength side of the PL spectrum was calculated in a manner shown in FIG. 30 to be 431 nm, and its energy was 2.88 eV.

Figure 31:
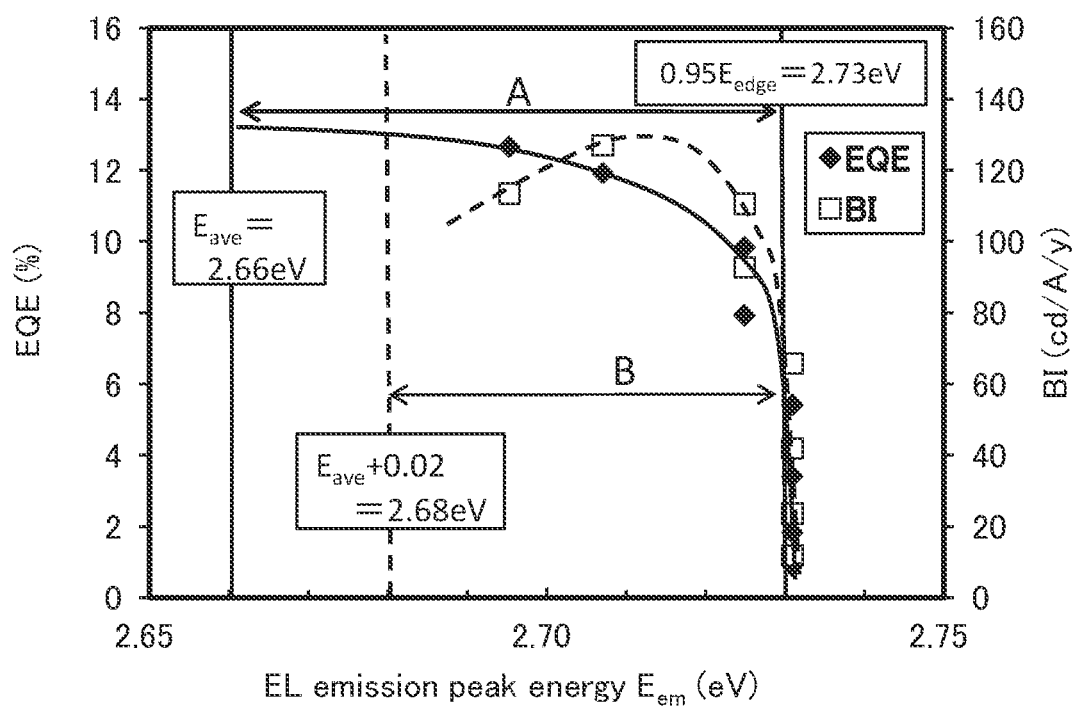
FIG. 31 is a graph showing a relation of external quantum efficiency (EQE) and a blue index (BI) with respect to energy at emission peak ($E_{em}$) in a light-emitting device 6-1 to a light-emitting device 6-8.

FIG. 31 is a graph showing a relation of external quantum efficiency (EQE) and blue index (BI) with respect to the emission peak energy ($E_{em}$) of each light-emitting device. The horizontal axis represents $E_{em}$, and the vertical axes represent EQE and BI.

According to the diagram, both EQE and BI exhibit favorable values in the light-emitting device having a cavity length enabling a value of $E_{em}$ to fall within a range between $E_{ave}$ (2.66 eV in this example) and 2.73 eV.

Note that a value of 2.73 eV is the energy corresponding to 0.95 times $E_{edge}$ as 2.88 eV.

As described above, it was found that the blue light-emitting device with a microcavity structure can emit light with favorable efficiency when the light-emitting device has a cavity length enabling a wavelength corresponding to energy that is higher than or equal to $E_{ave}$ and less than or equal to 0.95 times $E_{edge}$. In other words, the cavity length is controlled to satisfy $E_{ave} \leq E_{em} \leq 0.95 E_{edge}$ (Range A in the drawing), whereby both EQE and BI can be maximized.

In particular, it was found that the light-emitting device whose $E_{em}$ is greater than or equal to $E_{ave}+0.02$ (eV) (2.67 eV in this example) and less than or equal to $E_{edge} \times 0.95$ (eV) is preferable in consideration of BI; thus, the cavity length is preferably controlled to satisfy $E_{ave}+0.02 \leq E_{em} \leq 0.95 E_{edge}$ (Range B in the drawing).

Example 7

In this example, the behavior of external quantum efficiency and blue index (BI) in light-emitting devices with microcavity structures with varied optical path lengths will be described in detail. Structures of organic compounds used in a light-emitting device 7-1 to a light-emitting device 7-8 fabricated in this example are shown below.

[Chemical Formula 9]

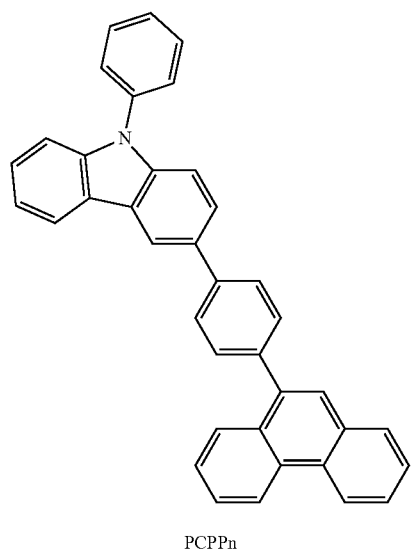

PCPPn (i)

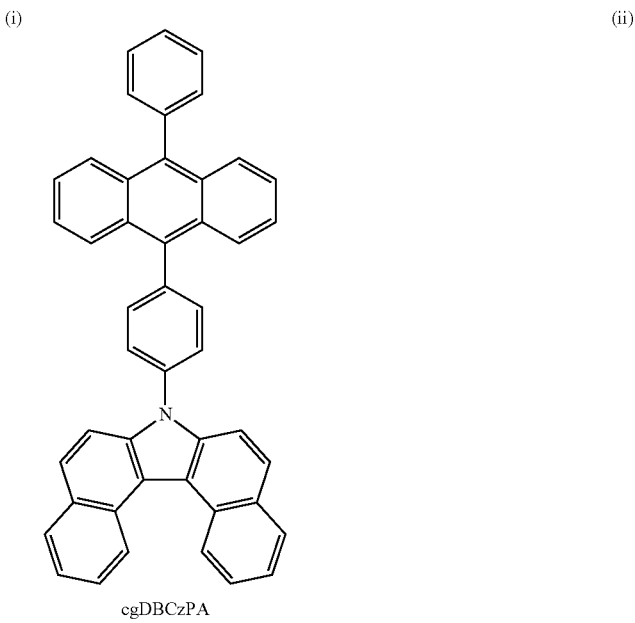

cgDBCzPA (ii)

-continued

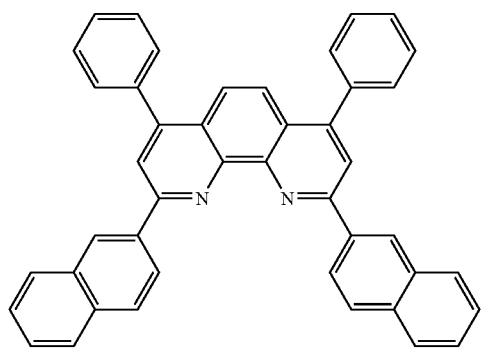

NBPhen (iv)

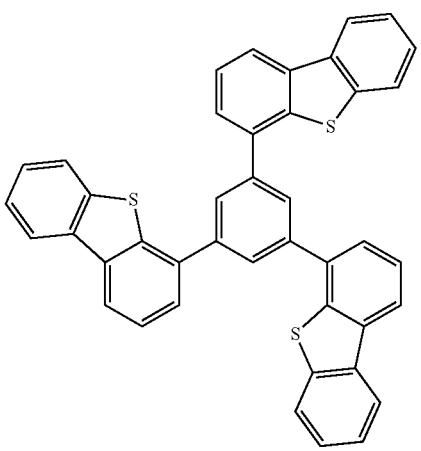

DBT3P-II (v)

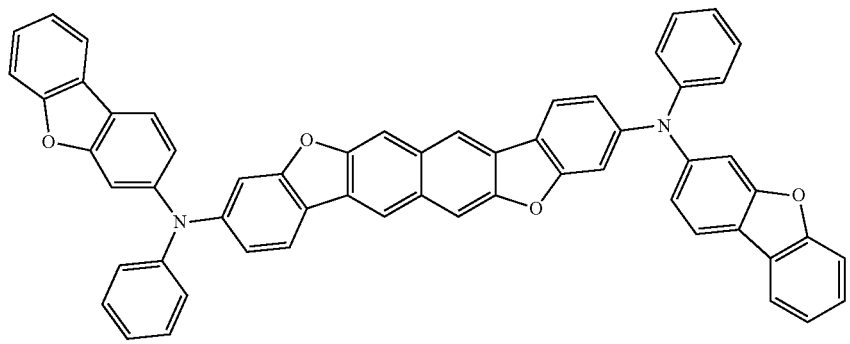

3,10FrA2Nbf(IV)-02 (xi)

<Method for Fabricating Light-Emitting Device 7-1 to Light-Emitting Device 7-8>

First, over a glass substrate, an alloy film of silver (Ag), palladium (Pd), and copper (Cu) (an Ag—Pd—Cu (APC) film) was formed as a reflective electrode to a thickness of 100 nm by a sputtering method, and a film of indium tin oxide containing silicon oxide (ITSO) was formed as a transparent electrode to a thickness of 85 nm by a sputtering method, so that the first electrode 101 was formed. Note that the area of the electrode was 4 mm$^2$ (2 mm×2 mm).

Next, in pretreatment for forming the light-emitting device over the substrate, the surface of the substrate was washed with water and baked at 200° C. for one hour, and then UV ozone treatment was performed for 370 seconds.

After that, the substrate was transferred into a vacuum evaporation apparatus in which the pressure was reduced to about 10$^{-4}$ Pa, vacuum baking at 170° C. for 30 minutes was performed in a heating chamber in the vacuum evaporation apparatus, and then the substrate was naturally cooled down for about 30 minutes.

Next, the substrate on which the first electrode 101 was formed was fixed to a substrate holder provided in the vacuum evaporation apparatus such that the side on which the first electrode 101 was formed faced downward, and 3-[4-(9-phenanthryl)-phenyl]-9-phenyl-9H-carbazole (abbreviation: PCPPn) expressed by the above structural formula (i) and molybdenum(VI) oxide were deposited by co-evaporation on the first electrode 101 to have a weight ratio of 1:0.5 (=PCPPn: molybdenum oxide) by an evaporation method, whereby the hole-injection layer 111 was formed.

Variation of the optical path length in the light-emitting devices was achieved by changing the thickness of the hole-injection layer 111. In the light-emitting device 7-1, the thickness of the hole-injection layer 111 was 10 nm; in the light-emitting device 7-2, that was 15 nm; in the light-emitting device 7-3, that was 20 nm; in the light-emitting device 7-4, that was 25 nm: in the light-emitting device 7-5, that was 30 nm; in the light-emitting device 7-6, that was 35 nm; in the light-emitting device 7-7, that was 40 nm; and in the light-emitting device 7-8, that was 45 nm.

Next, on the hole-injection layer 111, PCPPn was deposited by evaporation to a thickness of 15 nm to form the hole-transport layer 112.

Subsequently, 7-[4-(10-phenyl-9-anthryl)phenyl]-7H-dibenzo[c,g]carbazole (abbreviation: cgDBCzPA) expressed by the above structural formula (ii) and 3,10-bis[N-(dibenzofuran-3-yl)-N-phenylamino]naphtho[2,3-b;6,7-b']bisbenzofuran (abbreviation: 3,10FrA2Nbf(IV)-02) expressed by the above structural formula (xi) were deposited by co-evaporation to have a weight ratio of 1:0.01 (=cgDBCzPA: 3,10FrA2Nbf(IV)-02) to a thickness of 25 nm, whereby the light-emitting layer 113 was formed.

After that, on the light-emitting layer 113, cgDBCzPA was deposited by evaporation to a thickness of 5 nm, and 2,9-bis(naphthalen-2-yl)-4,7-diphenyl-1,10-phenanthroline (abbreviation: NBPhen) expressed by the above structural formula (iv) was deposited by evaporation to a thickness of 15 nm, whereby the electron-transport layer 114 was formed.

After the formation of the electron-transport layer 114, lithium fluoride (LiF) was deposited by evaporation to a thickness of 1 nm to form the electron-injection layer 115, and silver (Ag) and magnesium (Mg) in a volume ratio of 1:0.1 (=Ag:Mg) were deposited by evaporation to a thickness of 10 nm to form the second electrode 102, whereby the light-emitting device 7-1 to the light-emitting device 7-8 were fabricated. Note that the second electrode 102 is a semi-transmissive and semi-reflective electrode having a function of reflecting light and a function of transmitting light, and the light-emitting device of this example are top-emission devices from which light is extracted through the second electrode 102. In addition, 1,3,5-tri(dibenzothiophen-4-yl)-benzene (abbreviation: DBT3P-II) expressed by the above structural formula (v) was deposited by evaporation to a thickness of 70 nm on the second electrode 102, whereby the extraction efficiency was improved.

The device structures of the light-emitting device 7-1 to the light-emitting device 7-8 are listed in Table 19 and Table 20. Table 20 shows the thickness of the hole-injection layer in each light-emitting device.

TABLE 19

| | | |
|---|---|---|
| Organig cap layer | DBT3P-II | 70 nm |
| Semi-transmissive and semi-reflective electrode | Ag:Mg (1:0.1) | 10 nm |
| Electron-injection layer | LiF | 1 nm |
| Electron-transport layer | NBPhen | 15 nm |
| | cgDBCzPA | 5 nm |
| Light-emitting layer | cgDBCzPA:3,10FrA2Nbf(IV)-02 (1:0.01) | 25 nm |
| Hole-transport layer | PCPPn | 15 nm |
| Hole-injection layer | PCPPn:MoOx (1:0.5) | x nm |
| Transparent electrode | ITSO | 85 nm |
| Reflective electrode | APC | 100 nm |

TABLE 20

| | Thickness (nm) |
|---|---|
| Light-emitting device 7-1 | 10 |
| Light-emitting device 7-2 | 15 |
| Light-emitting device 7-3 | 20 |
| Light-emitting device 7-4 | 25 |
| Light-emitting device 7-5 | 30 |
| Light-emitting device 7-6 | 35 |
| Light-emitting device 7-7 | 40 |
| Light-emitting device 7-8 | 45 |

Each of the fabricated light-emitting devices was sealed using a glass substrate (a sealant was applied to surround the device, followed by UV treatment and one-hour heat treatment at 80° C. at the time of sealing) in a glove box containing a nitrogen atmosphere so that the light-emitting device is not exposed to the air, and then measurements were carried out. Note that the measurement was performed at room temperature.

Measurement results of the light-emitting device 7-1 to the light-emitting device 7-8 are shown below. All measurement results are represented as values at luminance around 1000 cd/m$^2$. In addition, the external quantum efficiency is uncorrected quantum efficiency calculated from front luminance on the assumption of Lambertian distribution.

TABLE 21

| | Chromaticity x | Chromaticity y | Current efficiency (cd/A) | External quantum efficiency (%) | BI | EL_max (nm) |
|---|---|---|---|---|---|---|
| Light-emitting device 7-1 | 0.145 | 0.024 | 0.382 | 1.06 | 16.2 | 448 |
| Light-emitting device 7-2 | 0.143 | 0.025 | 0.72 | 1.95 | 29.2 | 448 |
| Light-emitting device 7-3 | 0.143 | 0.026 | 1.38 | 3.64 | 54.3 | 449 |
| Light-emitting device 7-4 | 0.143 | 0.027 | 2.18 | 5.50 | 80.4 | 449 |
| Light-emitting device 7-5 | 0.142 | 0.031 | 3.37 | 8.01 | 109 | 450 |
| Light-emitting device 7-6 | 0.141 | 0.036 | 4.47 | 9.68 | 123 | 451 |
| Light-emitting device 7-7 | 0.140 | 0.047 | 5.73 | 10.8 | 122 | 453 |
| Light-emitting device 7-8 | 0.139 | 0.064 | 7.09 | 11.4 | 111 | 455 |

Figure 32:
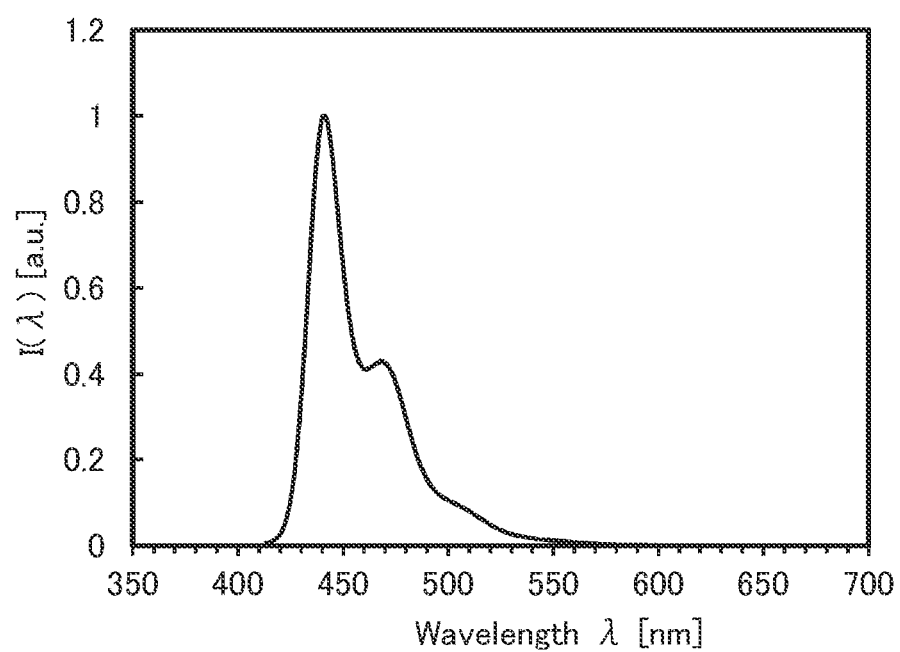
FIG. 32 is a diagram showing an emission spectrum of 3,10-bis[N-(dibenzofuran-3-yl)-N-phenylamino]naphtho[2,3-b;6,7-b']bisbenzofuran (abbreviation: 3,10FrA2Nbf(IV)-02) in a toluene solution.
Figure 33:
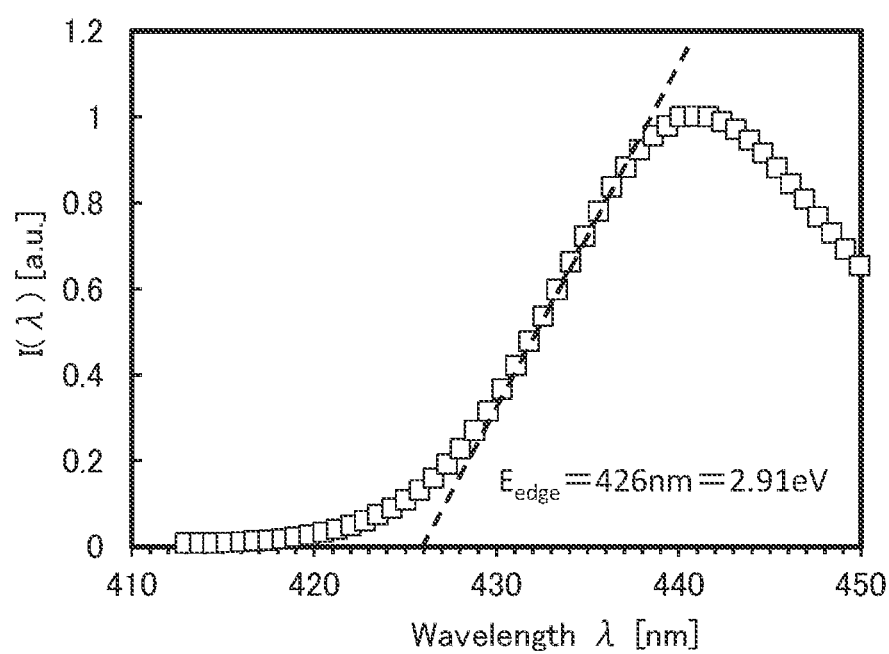
FIG. 33 is a diagram showing a calculation method of an emission edge on a short wavelength side of a PL spectrum of 3,10FrA2Nbf(IV)-02 in a toluene solution.

FIG. 32 shows a PL spectrum of 3,10PCA2Nbf(IV)-02 that is an emission center substance in a toluene solution. For measurement of the PL spectrum, an absolute PL quantum yield measurement system (Quantaurus-QY manufactured by Hamamatsu Photonics K.K.) was used, and in calculation of the average photon energy $E_{ave}$, the formula (VII) shown in Embodiment 1 was used because the vertical axis of the PL spectrum shown in FIG. 32 represents a normalized spectrum I($\lambda$) proportional to energy $\phi_p(\lambda)$. By this, the average photon energy ($E_{ave}$) of the PL spectrum of 3,10PCA2Nbf(IV)-02 in the toluene solution was calculated to be 2.71 eV. Furthermore, the emission edge on the short wavelength side of the PL spectrum was calculated in a manner shown in FIG. 33 to be 426 nm, and its energy was 2.91 eV.

Figure 34:
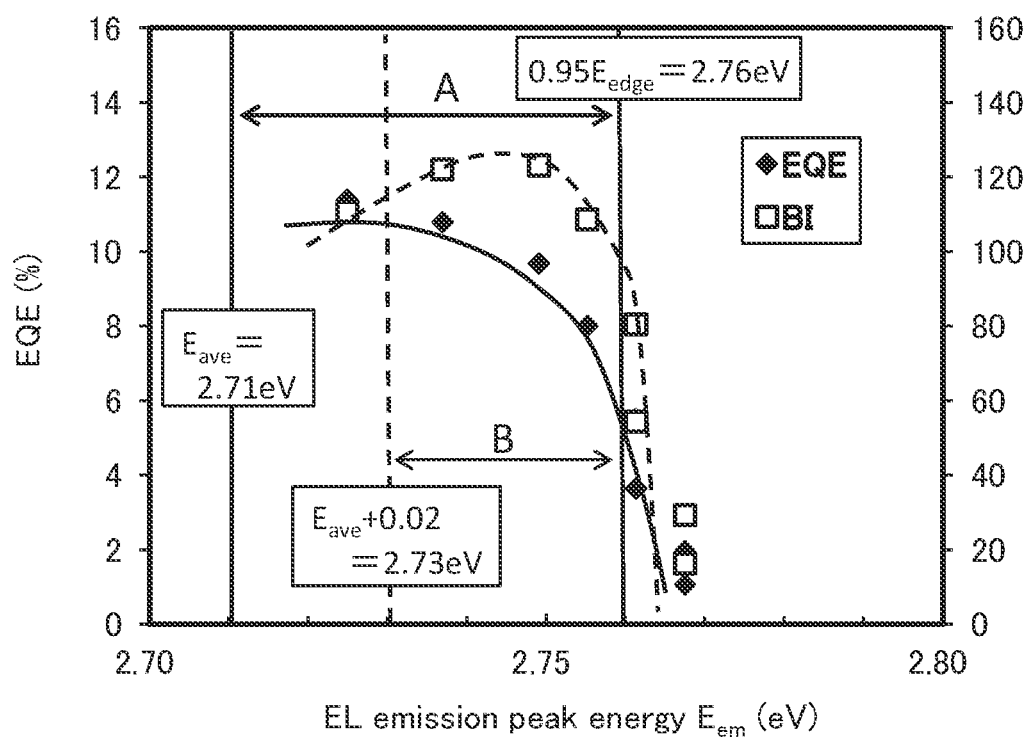
FIG. 34 is a graph showing a relation of external quantum efficiency (EQE) and a blue index (BI) with respect to energy at emission peak ($E_{em}$) in a light-emitting device 7-1 to a light-emitting device 7-8.

FIG. 34 is a graph showing a relation of external quantum efficiency (EQE) and blue index (BI) with respect to the emission peak energy ($E_{em}$) of each light-emitting device. The horizontal axis represents $E_{em}$, and the vertical axes represent EQE and BI.

According to the diagram, both EQE and BI exhibit favorable values in the light-emitting device having a cavity length enabling a value of $E_{em}$ to fall within a range between $E_{ave}$ (2.71 eV in this example) and 2.76 eV.

Note that a value of 2.76 eV is the energy corresponding to 0.95 times $E_{edge}$ as 2.91 eV.

As described above, it was found that the blue light-emitting device with a microcavity structure can emit light with favorable efficiency when the light-emitting device has a cavity length enabling a wavelength corresponding to energy that is higher than or equal to $E_{ave}$ and less than or equal to 0.95 times $E_{edge}$. In other words, the cavity length is controlled to satisfy $E_{ave} \leq E_{em} \leq 0.95 E_{edge}$ (Range A in the drawing), whereby both EQE and BI can be maximized.

In particular, it was found that the light-emitting device whose $E_{em}$ is greater than or equal to $E_{ave}+0.02$ (eV) (2.73 eV in this example) and less than or equal to $E_{edge} \times 0.95$ (eV) is preferable in consideration of BI; thus, the cavity length is preferably controlled to satisfy $E_{ave}+0.02 \leq E_{em} \leq 0.95 E_{edge}$ (Range B in the drawing).

REFERENCE NUMERALS

101: first electrode, 101-1: reflective electrode, 101-2: transparent electrode, 102: second electrode, 103: EL layer, 104: organic cap layer, 111: hole-injection layer, 112: hole-transport layer, 113: light-emitting layer, 114: electron-transport layer, 115: electron-injection layer, 116: charge-generation layer, 117: P-type layer, 118: electron-relay layer, 119: electron-injection buffer layer, 400: substrate, 401: first electrode, 403: EL layer, 404: second electrode, 405: sealant, 406: sealant, 407: sealing substrate, 412: pad, 420: IC chip, 601: driver circuit portion (source line driver circuit), 602: pixel portion, 603: driver circuit portion (gate line driver circuit), 604: sealing substrate, 605: sealant, 607: space, 608: wiring, 609: FPC (flexible printed circuit), 610: element substrate, 611: switching FET, 612: current control FET, 613: first electrode, 614: insulator, 616: EL layer, 617: second electrode, 618: light-emitting device, 2001: housing, 2002: light source, 2100: robot, 2110: arithmetic device, 2101: illuminance sensor, 2102: microphone, 2103: upper camera, 2104: speaker, 2105: display, 2106: lower camera, 2107: obstacle sensor, 2108: moving mechanism, 3001: lighting device, 5000: housing, 5001: display portion, 5002: second display portion, 5003: speaker, 5004: LED lamp, 5005: operation key, 5006: connection terminal, 5007: sensor, 5008: microphone, 5012: support, 5013: earphone, 5100: cleaning robot, 5101: display, 5102: camera, 5103: brush, 5104: operation button, 5150: information terminal, 5151: housing, 5152: display region, 5153: bend portion, 5120: dust, 5200: display region, 5201: display region, 5202: display region, 5203: display region, 7101: housing, 7103: display portion, 7105: stand, 7107: display portion, 7109: operation key, 7110: remote controller, 7201: main body, 7202: housing, 7203: display portion, 7204: keyboard, 7205: external connection port, 7206: pointing device, 7210: second display portion, 7401: housing, 7402: display portion, 7403: operation button, 7404: external connection port, 7405: speaker, 7406: microphone, 7400: mobile phone, 9310: portable information terminal, 9311: display panel, 9312: display region, 9313: hinge, 9315: housing

The invention claimed is:
1. A light-emitting device comprising:
a first electrode;
a second electrode; and
an EL layer between the first electrode and the second electrode, the EL layer comprising a light-emitting layer,
wherein the light-emitting layer comprises an emission center substance,
wherein the first electrode and the second electrode overlap each other,
wherein one of the first electrode and the second electrode is a reflective electrode and the other is a semi-transmissive and semi-reflective electrode,
wherein $E_{ave}$ is an average of photon energy of an emission spectrum of the emission center substance,
wherein $E_{edge}$ is an energy at an emission edge on a short wavelength side of the emission spectrum,
wherein $E_{em}$ is a photon energy corresponding to a light having a wavelength λ,
wherein the wavelength λ is longer than a peak wavelength of the emission spectrum,
wherein an optical path length between the reflective electrode and the light-emitting layer is configured to $(2n-1)\lambda/4$ where n is a natural number, and
wherein the following formula (1) is satisfied:

$$E_{ave} \leq E_{em} \leq 0.95 E_{edge} \qquad (1).$$

2. The light-emitting device according to claim 1, wherein the emission spectrum is an emission spectrum obtained from a solution comprising the emission center substance.

3. The light-emitting device according to claim 2, wherein a solvent of the solution has a dielectric constant greater than or equal to 1 and less than or equal to at room temperature.

4. The light-emitting device according to claim 2, wherein a solvent of the solution is toluene or chloroform.

5. The light-emitting device according to claim 1, wherein the emission center substance is capable of emitting blue light.

6. The light-emitting device according to claim 1, wherein $E_{em}$ is greater than or equal to 2.6 eV and less than or equal to 2.9 eV.

7. The light-emitting device according to claim 1, wherein a difference between $E_{em}$ and $E_{ave}$ is 0.02 eV or more.

8. The light-emitting device according to claim 1, wherein a blue index of the light-emitting device is 89.1 or more.

9. The light-emitting device according to claim 1,
wherein the emission spectrum is obtained by counting photons emitted from the emission center substance,
wherein $E_{ave}$ is estimated by the following formula (IV):

$$E_{ave} = \frac{\phi_p}{N_p} = ch \cdot \frac{\int F(\lambda)/\lambda d\lambda}{\int F(\lambda) d\lambda}, \qquad (IV)$$

wherein λ is wavelength,
wherein c is light speed,
wherein h is the Planck constant, and
wherein $\int F(\lambda)d\lambda$ corresponds to an integral value of the emission spectrum.

10. The light-emitting device according to claim 1,
wherein the emission spectrum is obtained by measuring energy itself emitted from the emission center substance or by normalized spectrum that is proportional to the energy,
wherein $E_{ave}$ is estimated by the following formula (VI):

$$E_{ave} = \frac{\phi_p}{N_p} = ch \cdot \frac{\int \phi_p(\lambda) d\lambda}{\int \phi_p(\lambda)\lambda d\lambda}, \qquad (VI)$$

wherein λ is wavelength,
wherein c is light speed,
wherein h is the Planck constant, and
wherein $\phi_p(\lambda)$ corresponds to the energy or a proportional value to the energy.

11. The light-emitting device according to claim 1, further comprising an organic compound layer on a first surface of the semi-transmissive and semi-reflective electrode,
wherein the organic compound layer comprises an organic compound with molecular weight greater than or equal to 300 and less than or equal to 1200,
wherein a second surface of the semi-transmissive and semi-reflective electrode and the reflective electrode face each other, and wherein the second surface is an opposite surface to the first surface.

12. A light-emitting apparatus comprising:
the light-emitting device according to claim 1, and
one of a transistor and a substrate.

13. An electronic device comprising:
the light-emitting apparatus according to claim 12, and
one of a sensor, an operation button, a speaker and a microphone.

14. A lighting device comprising:
the light-emitting apparatus according to claim 12, and
a housing.

15. A light-emitting device comprising:
a first electrode;
a second electrode; and
an EL layer between the first electrode and the second electrode,
wherein the first electrode and the second electrode overlap each other,
wherein one of the first electrode and the second electrode is a reflective electrode and the other is a semi-transmissive and semi-reflective electrode,
wherein the EL layer comprises a light-emitting layer,
wherein the light-emitting layer comprises an emission center substance,
wherein an average value of photon energy of light emitted by the emission center substance in a solution state is denoted by $E_{ave}$ [eV],
wherein emission edge energy on a short wavelength side of an emission spectrum of the emission center substance in the solution state is denoted by $E_{edge}$ [eV],
wherein photon energy corresponding to a light having a wavelength $\lambda$ is denoted by $E_{em}$ [eV],
wherein the wavelength $\lambda$ is longer than a peak wavelength of the emission spectrum of the emission center substance in the solution state,
wherein an optical path length between the reflective electrode and the light-emitting layer is configured to $(2n-1)\lambda/4$ where n is a natural number, and
wherein $E_{em}$ [eV] is expressed by the following formula (1):

$$E_{ave} \leq E_{em} \leq 0.95 E_{edge} \tag{1}$$

16. The light-emitting device according to claim 15, wherein the following formula (2) is satisfied:

$$E_{ave} + 0.02 \leq E_{em} \leq 0.95 E_{edge} \tag{2}$$

17. The light-emitting device according to claim 15, wherein a solvent forming the solution state has a dielectric constant greater than or equal to 1 and less than or equal to 10 at room temperature.

18. The light-emitting device according to claim 17, wherein the solvent is toluene or chloroform.

19. The light-emitting device according to claim 15, wherein the emission center substance is capable of emitting blue light.

20. The light-emitting device according to claim 15, wherein $E_{em}$ is greater than or equal to 2.6 eV and less than or equal to 2.9 eV.

21. An electronic device comprising the light-emitting device according to claim 15.

* * * * *